(12) United States Patent
Shionoiri et al.

(10) Patent No.: US 10,090,022 B2
(45) Date of Patent: Oct. 2, 2018

(54) SEMICONDUCTOR DEVICE AND METHOD FOR OPERATING THE SEMICONDUCTOR DEVICE

(71) Applicant: Semiconductor Energy Laboratory Co., Ltd., Atsugi-shi, Kanagawa-ken (JP)

(72) Inventors: Yutaka Shionoiri, Isehara (JP); Tomoaki Atsumi, Hadano (JP); Kiyoshi Kato, Atsugi (JP); Takanori Matsuzaki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/626,595

(22) Filed: Jun. 19, 2017

(65) Prior Publication Data

US 2018/0005668 A1    Jan. 4, 2018

(30) Foreign Application Priority Data

Jun. 30, 2016  (JP) ................. 2016-130650

(51) Int. Cl.
  *G11C 7/02*      (2006.01)
  *G11C 5/06*      (2006.01)
  *H01L 27/11556*  (2017.01)
  *H01L 27/11582*  (2017.01)
  *H01L 29/24*     (2006.01)

(52) U.S. Cl.
  CPC .......... *G11C 5/06* (2013.01); *H01L 27/11556* (2013.01); *H01L 27/11582* (2013.01); *H01L 29/24* (2013.01)

(58) Field of Classification Search
  CPC ................. G11C 5/06; H01L 27/11556; H01L 27/11582; H01L 29/24
  USPC .......................................... 365/205, 207, 63
  See application file for complete search history.

(56) References Cited

U.S. PATENT DOCUMENTS

| | | | |
|---|---|---|---|
| 6,069,518 | A  | 5/2000  | Nakai et al. |
| 6,229,379 | B1 | 5/2001  | Okamoto |
| 8,547,771 | B2 | 10/2013 | Koyama |
| 8,995,174 | B2 | 3/2015  | Koyama |
| 9,385,592 | B2 | 7/2016  | Watanabe et al. |

(Continued)

FOREIGN PATENT DOCUMENTS

| | | |
|---|---|---|
| JP | 07-231647 A   | 8/1995  |
| JP | 11-150230 A   | 6/1999  |
| JP | 2012-257187 A | 12/2012 |

*Primary Examiner* — Huan Hoang
(74) *Attorney, Agent, or Firm* — Robinson Intellectual Property Law Office; Eric J. Robinson

(57) ABSTRACT

To provide a semiconductor device with a high output voltage. A gate of a first transistor is electrically connected to a first terminal through a first capacitor. A gate of a second transistor is electrically connected to a second terminal through a second capacitor. One of a source and a drain of a third transistor is electrically connected to the gate of the first transistor through a third capacitor. One of a source and a drain of a fourth transistor is electrically connected to the gate of the second transistor through a fourth capacitor. The other of the source and the drain of the third transistor and the other of the source and the drain of the fourth transistor are electrically connected to a high potential power source. A third terminal is electrically connected to one of a source and a drain of the second transistor.

14 Claims, 32 Drawing Sheets

(56) References Cited

U.S. PATENT DOCUMENTS

| | | |
|---|---|---|
| 2008/0252369 A1* | 10/2008 | Kasai .................. G09G 3/3688 330/9 |
| 2015/0280691 A1 | 10/2015 | Koyama |
| 2015/0381036 A1 | 12/2015 | Watanabe et al. |
| 2016/0094236 A1 | 3/2016 | Shionoiri et al. |
| 2016/0149567 A1 | 5/2016 | Matsuzaki et al. |
| 2017/0186473 A1 | 6/2017 | Ikeda et al. |
| 2017/0186749 A1 | 6/2017 | Ohshima et al. |
| 2017/0230041 A1 | 8/2017 | Kato et al. |
| 2017/0302271 A1 | 10/2017 | Kato et al. |

\* cited by examiner

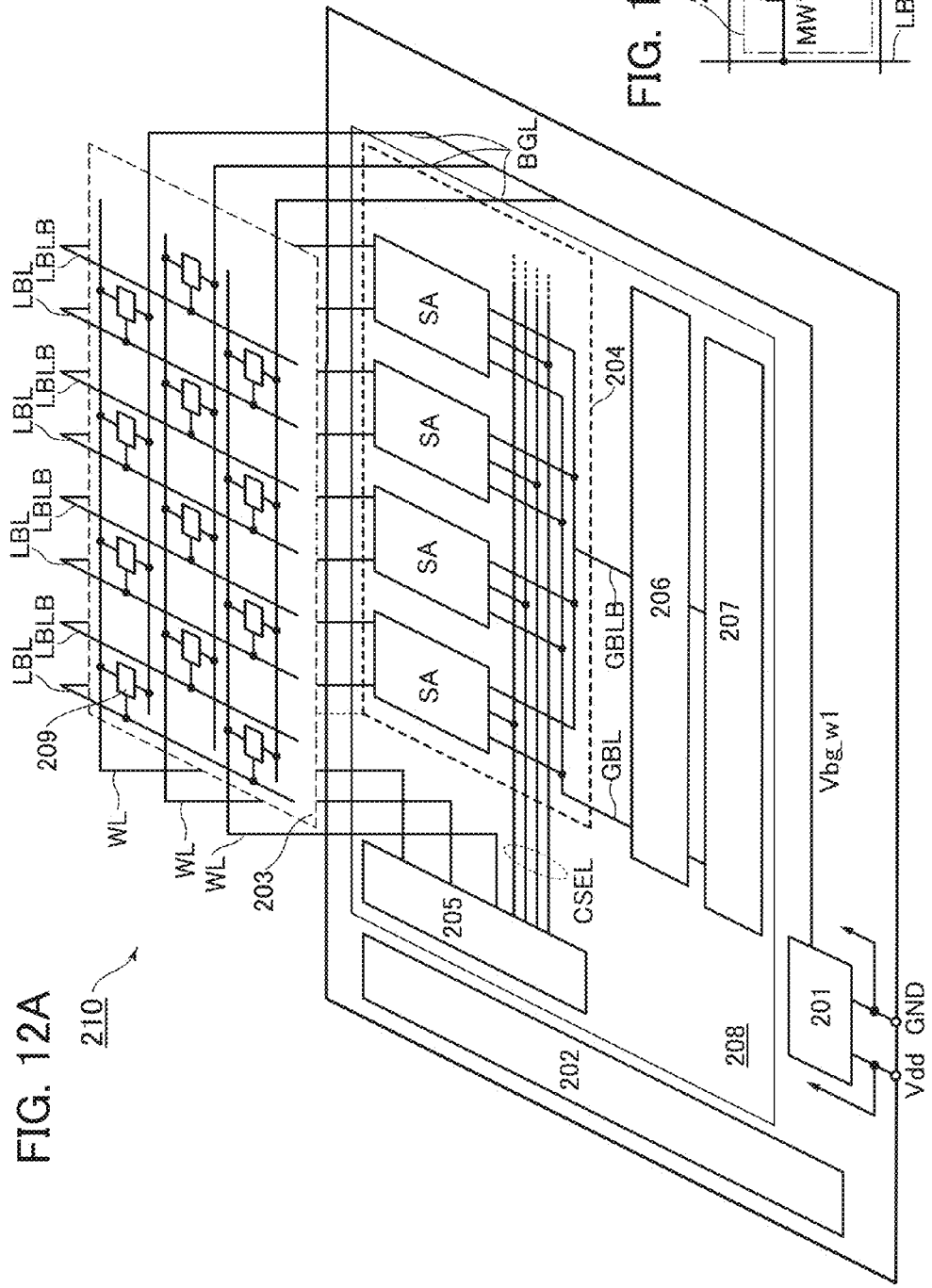

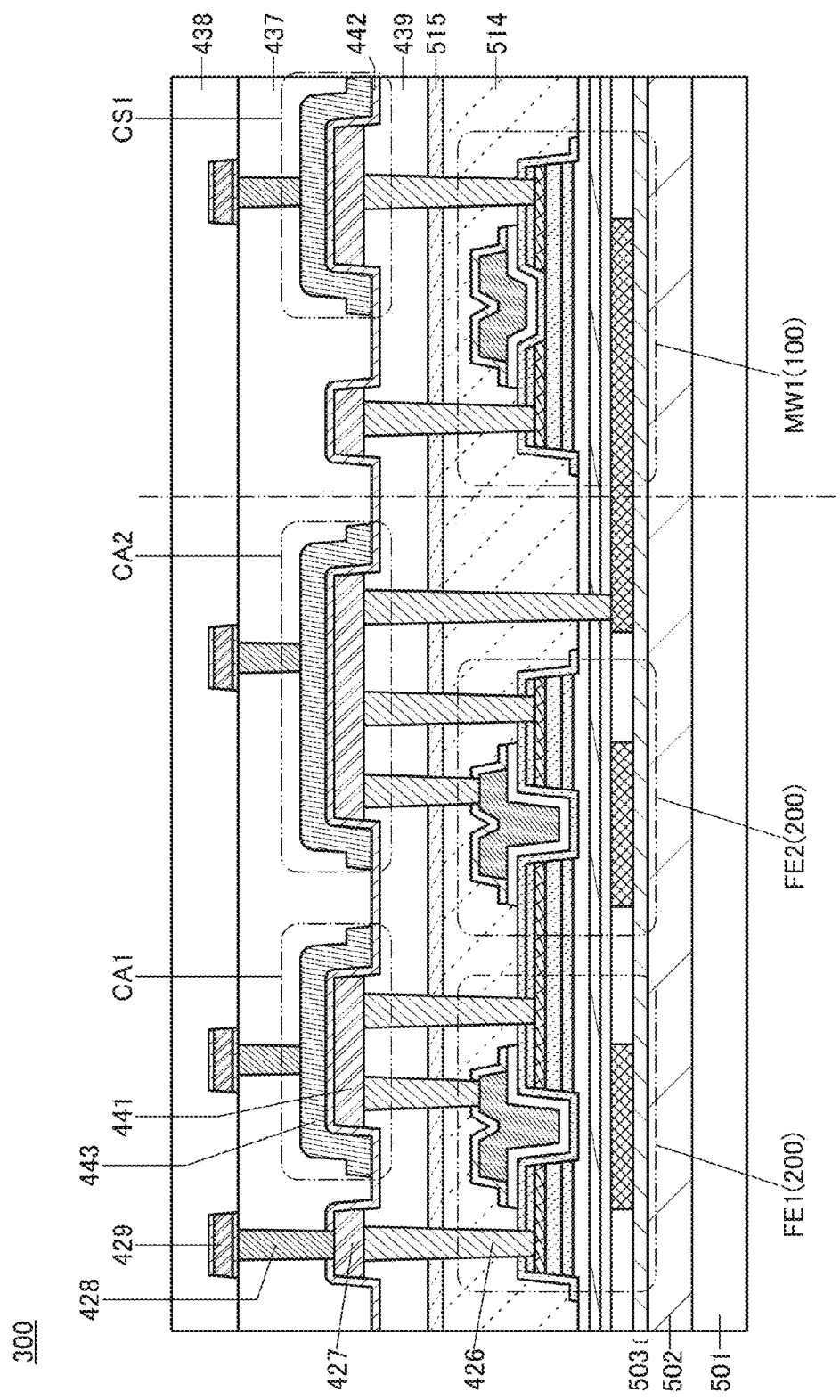

SEMICONDUCTOR DEVICE AND METHOD FOR OPERATING THE SEMICONDUCTOR DEVICE

BACKGROUND OF THE INVENTION

1. Field of the Invention

One embodiment of the present invention disclosed in the specification, drawings, and scope of claims of this application (hereinafter referred to as this specification and the like) relates to a semiconductor device, an operation method thereof, a usage method thereof, a manufacturing method thereof, and the like. Note that one embodiment of the present invention is not limited to these technical fields.

2. Description of the Related Art

A negative potential can be generated by a charge pump circuit. Patent Documents 1 and 2 disclose a technique for generating negative potentials with high accuracy. In Patent Documents 1 and 2, a negative voltage output from a charge pump circuit is converted into a positive voltage, the difference between the positive voltage and a positive reference voltage is detected by a comparator circuit, and the operation of the charge pump circuit is controlled on the basis of the detection results.

It is known that a transistor including an oxide semiconductor has an extremely small leakage current in an off state. For example, a low-power-consumption CPU and the like utilizing the characteristics that a leakage current of the transistor including an oxide semiconductor is extremely low is disclosed (see Patent Document 3).

REFERENCE

[Patent Document]
[Patent Document 1] Japanese Published Patent Application No. H7-231647
[Patent Document 2] Japanese Published Patent Application No. H11-150230
[Patent Document 3] Japanese Published Patent Application No. 2012-257187

SUMMARY OF THE INVENTION

An object of one embodiment of the present invention is to provide a novel semiconductor device. Another object of one embodiment of the present invention is to provide a novel memory device. Another object of one embodiment of the present invention is to provide a novel electronic component.

Another object of one embodiment of the present invention is to provide a method for operating a novel semiconductor device. Another object of one embodiment of the present invention is to provide a usage method of a novel semiconductor device.

Another object of one embodiment of the present invention is to hold a potential stably. Another object of one embodiment of the present invention is to generate a negative potential with high accuracy. Another object of one embodiment of the present invention is to compare two negative potentials directly. Another object of one embodiment of the present invention is to provide a semiconductor device with a high output voltage. Another object of one embodiment of the present invention is to provide a highly reliable semiconductor device. Another object of one embodiment of the present invention is to downsize a semiconductor device. Another object of one embodiment of the present invention is to reduce power consumption of a semiconductor device. Another object of one embodiment of the present invention is to provide a semiconductor device that operates with a single power source.

Note that one embodiment of the present invention does not necessarily achieve all the objects described above. The description of a plurality of objects does not preclude their coexistence. Other objects will be apparent from the description of this specification and the like, and such objects could be objects of one embodiment of the present invention.

One embodiment of the present invention is a method for operating a semiconductor device. The semiconductor device comprises a first terminal to a third terminal, a first transistor to a seventh transistor, and a first capacitor to a fourth capacitor. A gate of the first transistor is electrically connected to the first terminal through the first capacitor. A gate of the second transistor is electrically connected to the second terminal through the second capacitor. One of a source and a drain of the third transistor is electrically connected to the gate of the first transistor through the third capacitor. One of a source and a drain of the fourth transistor is electrically connected to the gate of the second transistor through the fourth capacitor. The other of the source and the drain of the third transistor and the other of the source and the drain of the fourth transistor are electrically connected to a high potential power source. One of a source and a drain of the first transistor and one of a source and a drain of the second transistor are electrically connected to one of a source and a drain of the fifth transistor. The other of the source and the drain of the fifth transistor is electrically connected to a low potential power source. One of a source and a drain of the sixth transistor and one of a source and a drain of the seventh transistor are electrically connected to the high potential power source. The other of the source and the drain of the first transistor is electrically connected to the other of the source and the drain of the sixth transistor. The other of the source and the drain of the second transistor is electrically connected to the other of the source and the drain of the seventh transistor. The third terminal is electrically connected to the other of the source and the drain of the second transistor. The method for operating a semiconductor device comprising a first step of respectively applying a first potential and a second potential to the gate of the first transistor and the gate of the second transistor, and a second step of respectively applying a third potential, a fourth potential, a fifth potential, and a sixth potential to the first terminal, the gate of the first transistor, the second terminal, and the gate of the second transistor and where a potential corresponding to a difference between the fourth potential and the sixth potential is outputted from the third terminal. Each of the fourth potential and the sixth potential is a positive potential. Each of the third potential and the fifth potential is a negative potential. The first potential is higher than the fourth potential. The second potential is higher than the sixth potential. The third transistor and the fourth transistor each include an oxide semiconductor in a channel formation region.

In the above structure, it is preferable that the semiconductor device further comprise an eighth transistor and a ninth transistor. One of a source and a drain of the eighth transistor is electrically connected to the gate of the first transistor. The other of the source and the drain of the eighth transistor is electrically connected to the one of the source and the drain of the first transistor. One of a source and a drain of the ninth transistor is electrically connected to the gate of the second transistor. The other of the source and the drain of the ninth transistor is electrically connected to the one of the source and the drain of the second transistor.

In the above structure, it is preferable that the semiconductor device further comprise an eighth transistor and a ninth transistor. One of a source and a drain of the eighth transistor is electrically connected to the gate of the first transistor. The other of the source and the drain of the eighth transistor is electrically connected to the other of the source and the drain of the first transistor. One of a source and a drain of the ninth transistor is electrically connected to the gate of the second transistor. The other of the source and the drain of the ninth transistor is electrically connected to the other of the source and the drain of the second transistor.

Another embodiment of the present invention is a semiconductor device comprising a first terminal to a third terminal, a first transistor to a ninth transistor, and a first capacitor to a fifth capacitor. A gate of the first transistor is electrically connected to the first terminal through the first capacitor. A gate of the second transistor is electrically connected to the second terminal through the second capacitor. One of a source and a drain of the third transistor is electrically connected to the gate of the first transistor through the third capacitor. One of a source and a drain of the fourth transistor is electrically connected to the gate of the second transistor through the fourth capacitor. The other of the source and the drain of the third transistor and the other of the source and the drain of the fourth transistor are electrically connected to a high potential power source. One of a source and a drain of the first transistor and one of a source and a drain of the second transistor are electrically connected to one of a source and a drain of the fifth transistor. The other of the source and the drain of the fifth transistor is electrically connected to a low potential power source. One of a source and a drain of the sixth transistor and one of a source and a drain of the seventh transistor are electrically connected to the high potential power source. The other of the source and the drain of the first transistor is electrically connected to the other of the source and the drain of the sixth transistor. The other of the source and the drain of the second transistor is electrically connected to the other of the source and the drain of the seventh transistor. The third terminal is electrically connected to the other of the source and the drain of the second transistor. The eighth transistor includes a front gate and a back gate. A gate of the ninth transistor is electrically connected to one of a source and a drain of the ninth transistor, the first terminal, one electrode of the fifth capacitor, and the back gate of the eighth transistor. The third transistor to the ninth transistor each include an oxide semiconductor in a channel formation region. A channel formation region of each of the eighth transistor and the ninth transistor includes indium, an element M, and zinc. The element M is one or more of gallium, aluminum, silicon, yttrium, boron, titanium, iron, nickel, germanium, zirconium, molybdenum, lanthanum, cerium, neodymium, hafnium, tantalum, tungsten, magnesium, vanadium, and beryllium. The channel formation region of the eighth transistor has an atomic ratio of indium:the element M:zinc=$X_7$:$Y_7$:$Z_7$. The channel formation region of the ninth transistor has an atomic ratio of indium:the element M:zinc=$X_8$:$Y_8$:$Z_8$. A portion where $X_7/Y_7$ is larger than $X_8/Y_8$ is included.

In the above structure, it is preferable that the semiconductor device further comprise a tenth transistor and an eleventh transistor. One of a source and a drain of the tenth transistor is electrically connected to the gate of the first transistor. The other of the source and the drain of the tenth transistor is electrically connected to the one of the source and the drain of the first transistor. One of a source and a drain of the eleventh transistor is electrically connected to the gate of the second transistor. The other of the source and the drain of the eleventh transistor is electrically connected to the one of the source and the drain of the second transistor.

In the above structure, it is preferable that the semiconductor device further comprise the tenth transistor and the eleventh transistor. One of a source and a drain of the tenth transistor is electrically connected to the gate of the first transistor. The other of the source and the drain of the tenth transistor is electrically connected to the other of the source and the drain of the first transistor. One of a source and a drain of the eleventh transistor is electrically connected to the gate of the second transistor. The other of the source and the drain of the eleventh transistor is electrically connected to the other of the source and the drain of the second transistor.

In the above structure, it is preferable that the semiconductor device further comprise a memory device including the fifth transistor.

According to one embodiment of the present invention, a novel semiconductor device can be provided. According to one embodiment of the present invention, a novel memory device can be provided. According to one embodiment of the present invention, a novel electronic component can be provided.

According to one embodiment of the present invention, a method for operating a novel semiconductor device can be provided. According to one embodiment of the present invention, a usage method of a novel semiconductor device can be provided.

According to one embodiment of the present invention, a potential can be held stably. According to one embodiment of the present invention, a negative potential can be generated with high accuracy. According to one embodiment of the present invention, two negative potentials can be compared directly. According to one embodiment of the present invention, a semiconductor device with a high output voltage can be provided. According to one embodiment of the present invention, a highly reliable semiconductor device can be provided. According to one embodiment of the present invention, a semiconductor device can be downsized. According to one embodiment of the present invention, power consumption of a semiconductor device can be reduced. According to one embodiment of the present invention, a semiconductor device that operates with a single power source can be provided.

One embodiment of the present invention does not necessarily have all the effects listed above. Note that the descriptions of a plurality of effects do not preclude the existence of other effects. In one embodiment of the present invention, an object other than the above objects, an effect other than the above effects, and a novel feature will be apparent from the description of the specification and the drawings of this embodiment.

BRIEF DESCRIPTION OF THE DRAWINGS

FIG. 12A is a block diagram illustrating a configuration example of a memory device and FIG. 12B is a circuit diagram illustrating a configuration example of a memory cell.

FIG. 25 is a cross-sectional view of a semiconductor device.

DETAILED DESCRIPTION OF THE INVENTION

Figure 1:
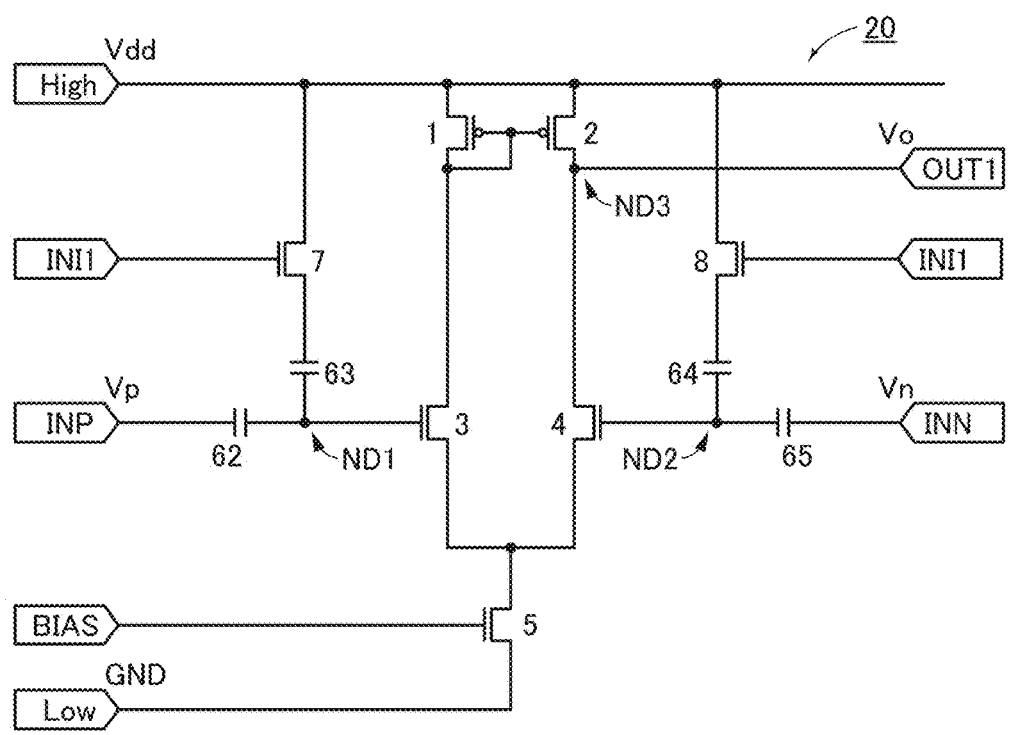
FIG. 1 is a circuit diagram illustrating a configuration example of a comparator.

An embodiment of the present invention will hereinafter be described. Note that any of the embodiments described in this specification can be combined as appropriate. In addition, in the case where a plurality of structure examples (including operation examples and manufacturing method examples) are given in one embodiment, any of the structure examples can be combined as appropriate. Furthermore, the present invention can be implemented in various different modes, and it is easily understood by those skilled in the art that modes and details of the present invention can be changed in various ways without departing from the spirit and scope of the present invention. Thus, the present invention should not be interpreted as being limited to the following description of the embodiments.

In the drawings, the size, the layer thickness, the region, or the like is exaggerated for clarity in some cases. Therefore, the size, the layer thickness, the region, or the like is not limited to the illustrated scale. Drawings are schematic views of ideal examples, and the embodiments of the present invention are not limited to the shape or the value illustrated in the drawings. For example, the following can be included: variation in signal, voltage, or current due to noise or difference in timing.

In this specification, terms for describing arrangement, such as "over," "above," "under," and "below," are used for convenience in describing a positional relationship between components with reference to drawings in some cases. Furthermore, the positional relationship between components is changed as appropriate depending on a direction in which each component is described. Thus, there is no limitation on terms used in this specification, and description can be made appropriately depending on the situation.

The positional relations of circuit blocks illustrated in a block diagram are specified for description; therefore, the positions of circuit blocks of one embodiment of the present invention are not limited thereto. Even when a diagram illustrates that different functions are achieved by different circuit blocks in a block diagram, one circuit block may be actually configured to achieve different functions. Functions of circuit blocks in a diagram are specified for description, and even when a diagram shows one circuit block performing given processing, a plurality of circuit blocks may be actually provided to perform the processing.

In this specification and the like, a transistor in which an oxide semiconductor is used for a semiconductor layer where a channel is formed is also referred to as an "OS transistor." In this specification and the like, a transistor in which silicon is used for a semiconductor layer where a channel is formed is also referred to as a "Si transistor." In this specification and the like, a transistor in which silicon having crystallinity is used for a semiconductor layer where a channel is formed is also referred to as a "crystalline Si transistor." The crystalline Si transistor tends to obtain relatively high mobility as compared to the OS transistor. On the other hand, the crystalline Si transistor has difficulty in obtaining an extremely low off-state current unlike the OS transistor. Thus, it is important that the semiconductor material used for the semiconductor layer be selected depending on the purpose and the usage. For example, depending on the purpose and the usage, the OS transistor and the crystalline Si transistor may be used in combination.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit and a chip including an integrated circuit are semiconductor devices. Moreover, a storage device, a display device, a light-emitting device, a lighting device, an electronic device, and the like themselves might be semiconductor devices, or might each include a semiconductor device.

In this specification and the like, a ground potential is regarded as 0 V, and a potential higher than the ground potential is regarded as a positive potential and a potential lower than the ground potential is regarded as a negative potential.

In this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Each of X and Y denotes an object (e.g., a device, an element, a circuit, a wiring, an electrode, a terminal, a conductive film, or a layer). In this specification and the like, a case where X and Y are connected through a capacitor which is provided therebetween, that is, X is electrically connected to one electrode of the capacitor and Y is electrically connected to the other electrode of the capacitor is represented as "X and Y are electrically connected through a capacitor" in some cases.

Note that a transistor includes three terminals: a gate, a source, and a drain. A gate is a node that controls the conduction state of a transistor. Depending on the channel type of the transistor or levels of potentials applied to the terminals, one of two input/output nodes functions as a source and the other functions as a drain. Therefore, the terms "source" and "drain" can be switched in this specification and the like. In this specification and the like, the two terminals other than the gate may be referred to as a first terminal and a second terminal.

A node can be referred to as a terminal, a wiring, an electrode, a conductive layer, a conductor, an impurity region, or the like depending on a circuit structure, a device structure, and the like. Furthermore, a terminal, a wiring, or the like can be referred to as a node.

Voltage refers to a potential difference between a given potential and a reference potential (e.g., a ground potential or a source potential) in many cases. Voltage can thus be referred to as a potential.

In this specification and the like, the terms "film" and "layer" can be interchanged with each other depending on the case or circumstances. For example, in some cases, the term "conductive layer" can be changed into the term "conductive film," and the term "insulating film" can be changed into the term "insulating layer."

In this specification and the like, ordinal numbers such as "first," "second," and "third" are used to avoid confusion among components, and thus do not limit the number of components or do not limit the order.

Embodiment 1

In this embodiment, a semiconductor device of one embodiment of the present invention is described.

When a negative potential is used as an input signal of a circuit, a negative potential power source is necessary in some cases. A comparator (also referred to as a comparison circuit) for a negative potential will be described as an example.

Figure 9:
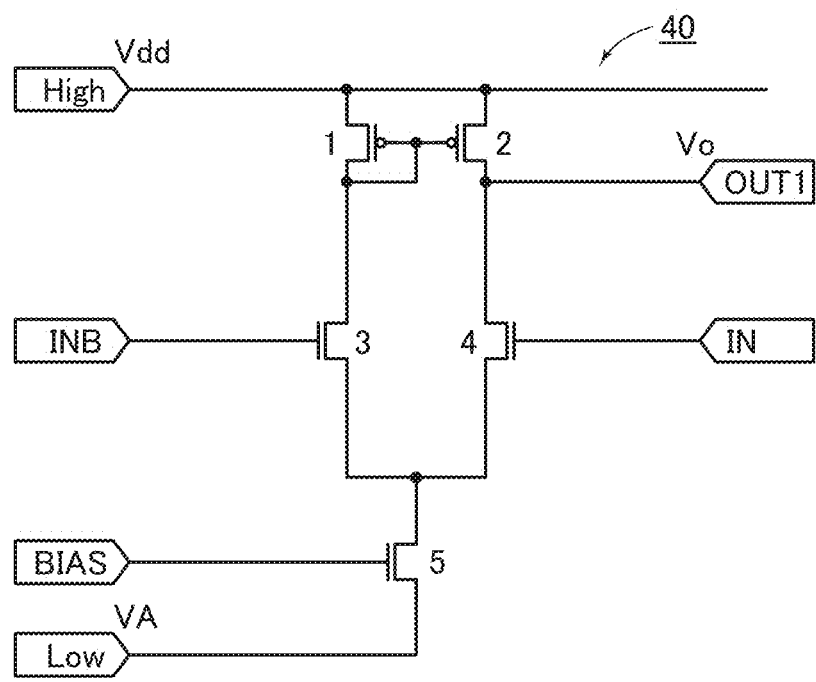
FIG. 9 is a circuit diagram illustrating a configuration example of a comparator.

For example, when a comparator 40 illustrated in FIG. 9 expresses a function of comparing potentials applied to terminals IN and INB, transistors 3 and 4 need to be turned on and current needs to flow therein and also in a transistor 5. A case where negative potentials are applied to the terminals IN and INB is described. In order to make current flow in the transistors 3 and 4, a potential lower than that applied to the terminal IN and INB, in other words, a negative potential needs to be applied to a terminal Low. A potential VA needs to be accurately supplied using a power source or the like so that the comparator 40 performs high-accuracy comparison. In other words, a negative potential power source is necessary.

The comparator of one embodiment of the present invention can perform high-accuracy comparison of potentials using a ground potential (GND) as the potential VA. The power source using a ground potential is more stable than the negative potential power source; thus, the accuracy of the comparator can be improved. Moreover, power consumption can be reduced in some cases.

There are a voltage comparison circuit and a current comparison circuit that can be used as the comparator. When a high-voltage noise is applied to a circuit, for example, the current comparison circuit is preferred because the influence of the high voltage noise is smaller than in the voltage comparison circuit.

<Comparator Example 1>

The comparator of one embodiment of the present invention has a function of outputting comparison results between two input potentials. At least either one of the two potentials inputted to the comparator of one embodiment of the present invention is a negative potential. The comparator of one embodiment of the present invention compares negative potentials by converting them into positive potentials without using a power source for negative potentials. Negative potentials can be converted into positive potentials through a capacitor, for example.

FIG. 1 shows an example of the comparator which is one embodiment of the present invention. A comparator 20 shown in FIG. 1 includes a terminal INP and a terminal INN each of which serves as an input terminal, a terminal OUT1, a terminal High, a terminal Low, a terminal BIAS, a terminal INI1 which serves as an input terminal, nodes ND1 to ND3, transistors 1 to 5, transistors 7 and 8, and capacitors 62 to 65. The terminal OUT1 serves as an output terminal.

A potential corresponding to comparison result between a potential applied to the node ND1 and a potential applied to the node ND2 is outputted from the node ND3.

The node ND1 is electrically connected to the terminal INP through the capacitor 62. The node ND2 is electrically connected to the terminal INN through the capacitor 65. The node ND3 is electrically connected to the terminal OUT1.

Negative potentials applied to the terminal INP and the terminal INN are converted into positive potentials through the capacitors. The converted positive potentials are applied to the node ND1 and the node ND2. Thus, no negative potential power source is needed.

The transistor 3 and the transistor 4 are a differential pair. A signal corresponding to comparison results between potentials applied to gates of the transistor 3 and the transistor 4 is outputted. The transistors 1 and the transistor 2 form a current mirror circuit. The transistor 3 and the transistor 4 are connected in series to the transistor 1 and the transistor 2, respectively. Each source of the transistor 3 and the transistor 4 is preferably electrically connected to a constant current source. In the example shown in FIG. 1, the transistor 5 serves as the constant current source. A drain of the transistor 5 is electrically connected to the sources of the transistor 3 and the transistor 4. A gate of the transistor 5 is electrically connected to the terminal BIAS. A source of the transistor 5 is electrically connected to GND.

A potential is outputted from a drain of the transistor 4 in accordance with the potentials applied to each gate of the transistor 3 and the transistor 4.

The potential of the node ND1 and the potential of the node ND2 are applied to the gate of the transistor 3 and the gate of the transistor 4, respectively. The drain of the transistor 4 is electrically connected to the node ND3. The node ND3 is electrically connected to the terminal OUT1.

The node ND1 is electrically connected to the terminal INP through the capacitor 62. The node ND2 is electrically connected to the terminal INN through the capacitor 65.

In FIG. 1, the transistor 1 and the transistor 2 are p-channel transistors, and the transistor 3 and the transistor 4 are n-channel transistors. The gate of the transistor 1, the gate of the transistor 2, and the drain of the transistor 1 are electrically connected to each other. The sources of the transistor 1 and the transistor 2 receive Vdd. The drain of the transistor 1 and the drain of the transistor 2 are electrically connected to the drain of the transistor 3 and the drain of the transistor 4, respectively.

The node ND1 is electrically connected to the transistor 7. In FIG. 1, the node ND1 is electrically connected to a source of the transistor 7 through the capacitor 63.

A gate of the transistor 7 is electrically connected to the terminal INI1. The terminal INI1 receives Vdd, for example. The node ND1 is electrically connected to a source of the transistor 7 through the capacitor 63.

A gate of the transistor 8 is electrically connected to the terminal INI1. The node ND2 is electrically connected to a source of the transistor 8 through the capacitor 64.

<Operation Example of Comparator>

Next, an operation example of the comparator which is one embodiment of the present invention is described using FIG. 1, FIG. 2, and FIGS. 3A to 3C.

The operation example of the comparator 20 shown in FIG. 1 is described.

Figure 2:
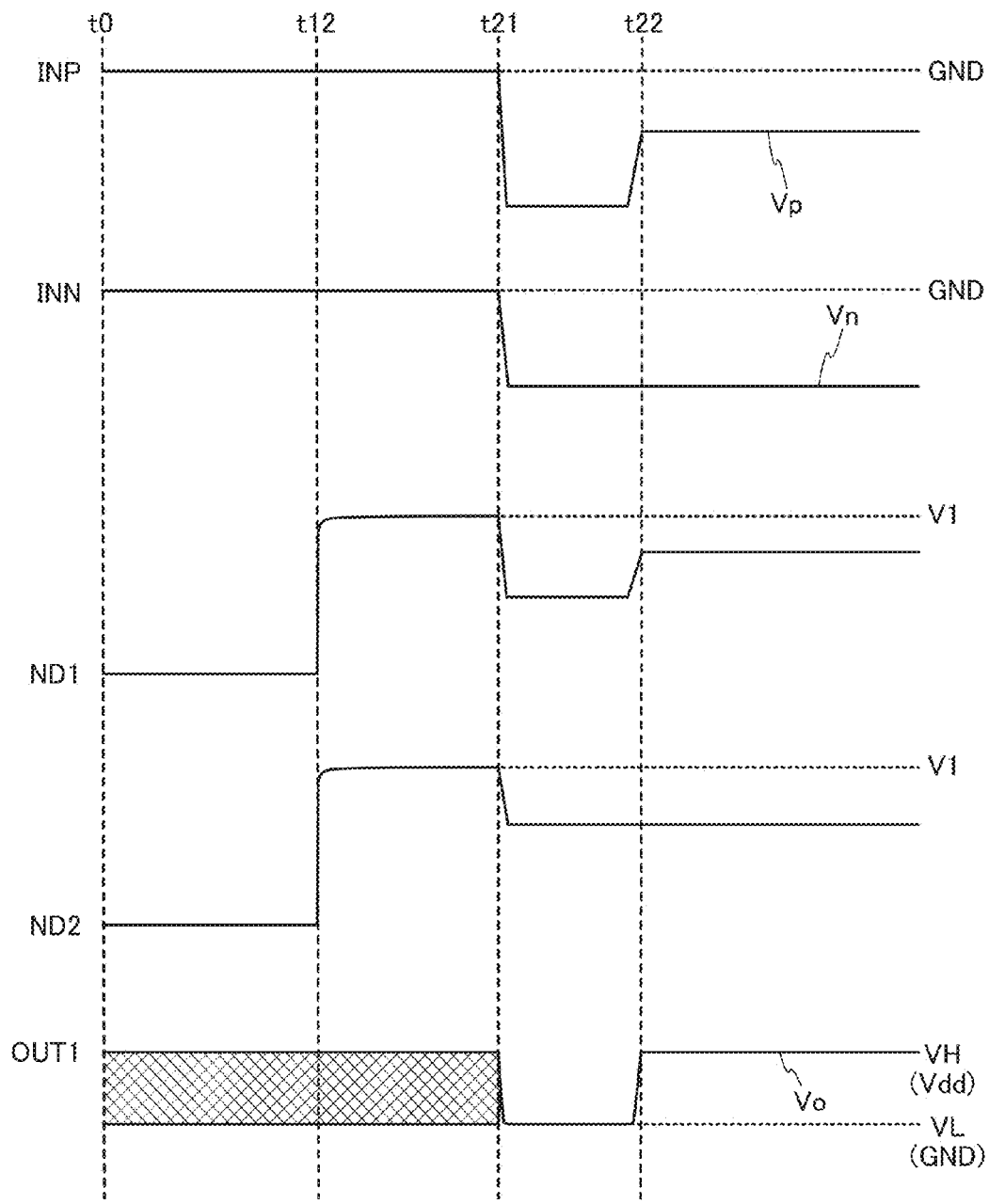
FIG. 2 is a timing chart illustrating the operation of a comparator.
Figure 3A:
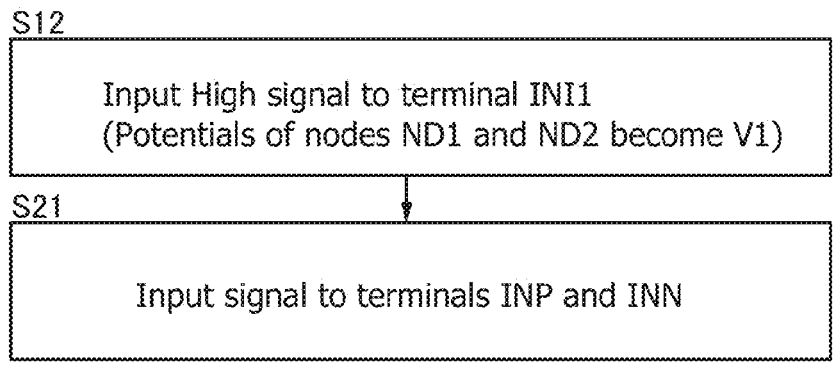
FIGS. 3A to 3C are flow charts illustrating the operation of a comparator.

FIG. 2 is a timing chart showing the operation of the comparator 20 shown in FIG. 1. FIG. 3A is a flow chart showing the operation of the comparator shown in FIG. 1. At a time t12 shown in FIG. 2, the potentials of the node ND1 and the node ND2 are raised to V1 which is a positive potential (a step S12). At this time, the potentials of the terminal INP and the terminal INN are V0 (e.g., 0 V) as a reference potential. Note that the details of the step S12 will be described later.

The higher one between threshold values of the transistor 3 and the transistor 4 which are shown in FIG. 1 is referred to as Vt. The comparator 20 can operate with respect to the input of a negative potential higher than (V0−V1+Vt).

Next, at a time t21 shown in FIG. 2, signals that are negative potentials here are inputted to the terminal INP and the terminal INN (a step S21). The potential of the terminal INP and the potential of the terminal INN are Vp and Vn, respectively. In the timing chart shown in FIG. 2, the potentials Vn and Vp start to decrease from GND at the time t21. In the example of FIG. 2, GND is 0 V. Between the time t21 and the time t22, Vn is higher than Vp and becomes lower than Vp after the time t22. The course of the potential of the node ND1 and the course of the potential of the node ND2 correspond to Vp and Vn, respectively.

When the potential applied to the terminal INP is decreased, the potential of the node ND1 is decreased accordingly. The potential of the node ND1 does not change to a negative potential when the negative potential is applied to the terminal INP, because the positive potential is applied to the node ND1 in advance.

The amount of change in potential of the node ND1 depends on the capacitance of a capacitance component connected to the node ND1, with respect to the amount of change in Vp. That is, it depends on a capacitive coupling between the capacitor 62, the capacitor 63, a gate capacitance of the transistor 3, and other capacitance components (including the gates of the transistors) connected to the node ND1.

The same applies to the node ND2. When the potential of an input signal applied to the terminal INN is decreased, the potential of the node ND2 is also decreased. For example, in FIG. 1, the amount of the change depends on the capacitance of the capacitor 64, the capacitance of the capacitor 65, and the gate capacitance of the transistor 4.

In accordance with the potentials applied to the gates of the transistors 3 and 4, a signal at High (also referred to as high potential power source; the potential is VH) or Low (also referred to as low potential power source; the potential is VL) is outputted from the drain of the transistor 4 to the terminal OUT1. The voltage of the terminal OUT1 is referred to as Vo. In the timing chart shown in FIG. 2, the potential of the Vo is gradually decreased from the time t21 and reaches Low, which is GND here. The Vn becomes lower than the Vp at the time t22, whereby the Vo reaches High, which is about Vdd here.

Hereinafter, the step S12 is described more specifically.

The details of the operation in the step S12 are described.

At a time t0, the Low signal (e.g., GND) is applied to the terminal INI1, and Vdd is applied to the drain of the transistor 7.

In the step S12, at the time t12, the High signal such as Vdd is applied to the terminal INI1 and Vdd is applied to the gate and drain of the transistor 7.

Since Vdd is applied to the gate of the transistor 7, the transistor 7 is turned on and current flows through the transistor 7. The source potential of the transistor 7 is increased to reach a potential decreased from Vdd by the threshold value of the transistor 7 (hereinafter referred to as Vdd−Vt7).

When the source potential of the transistor 7 becomes higher than Vdd−Vt7, the gate-source voltage of the transistor 7 becomes lower than Vt7, so that almost no current flows through the transistor 7. When the transistor 7 is an OS-FET and the gate-source voltage is lower than the threshold value, extremely small current flows. This is because there is almost no substrate leakage current, pn-junction leakage current, and the like in the OS-FET as compared to a Si-FET. Thus, the leakage of electric charge from the node ND1 can be sufficiently reduced, and the potential can be stable.

The potential of the node ND1 is started to be increased with the increase in source potential of the transistor 7. For example, in FIG. 1, the capacitor 62, the capacitor 63, and the gate capacitance of the transistor 3 are main capacitance components. When the transistor 7 is off, the amount of potential change ΔV of the node ND1 can be represented as Formula 1 where the capacitance of the capacitor 62 and the capacitor 63 are denoted by $C_2$ and $C_3$, respectively, the gate capacitance of the transistor 3 is denoted by $C_{t3}$, and the amount of change in Vp is denoted by ΔVp.

[Formula 1]

$$\Delta V = \frac{C_2}{C_2 + C_3 + C_{t3}} \Delta V_p \quad (1)$$

Here, when V1 is selected according to V1+ΔV>0, the node ND1 can have a positive potential.

Note that the potential of the node ND2 can be increased by a similar operation when the transistor 7 and the capacitor 63 are replaced with the transistor 8 and the capacitor 64, respectively.

Figure 5:
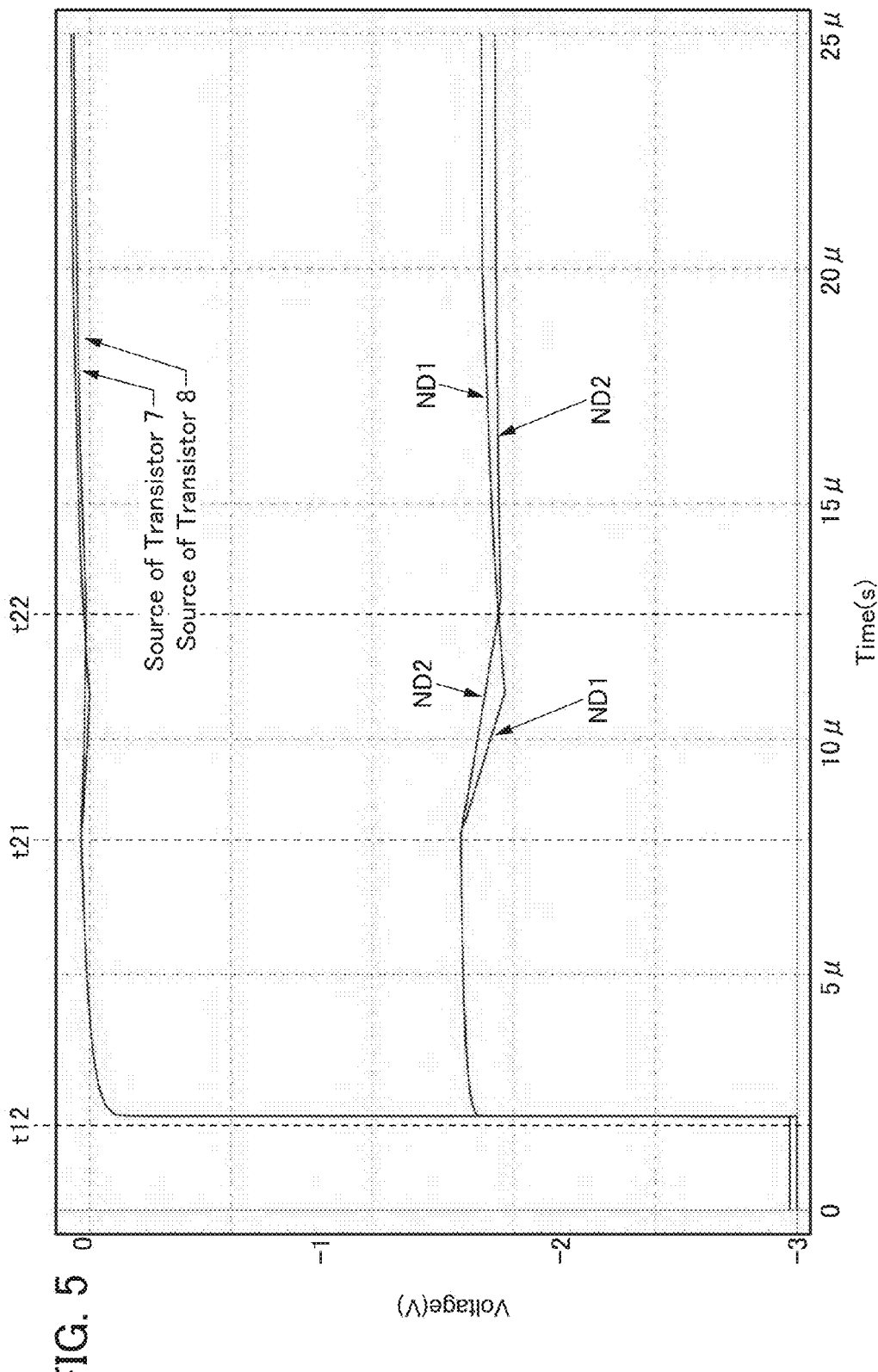
FIG. 5 is a timing chart illustrating the operation of a comparator.

In FIG. 5, the potentials of the node ND1 and the node ND2 are increased by about 1.2 V from −3 V at the time t12.

When the OS-FET is used as each of the transistor 7 and the transistor 8, leakage current of the capacitor 63 and the capacitor 64 can be extremely small. In other words, the gate potentials of the transistor 3 and the transistor 4 (i.e., the potentials of the node ND1 and the node ND2) are stable. The accuracy of the comparator is increased.

<Comparator Example 2>

Figure 7:
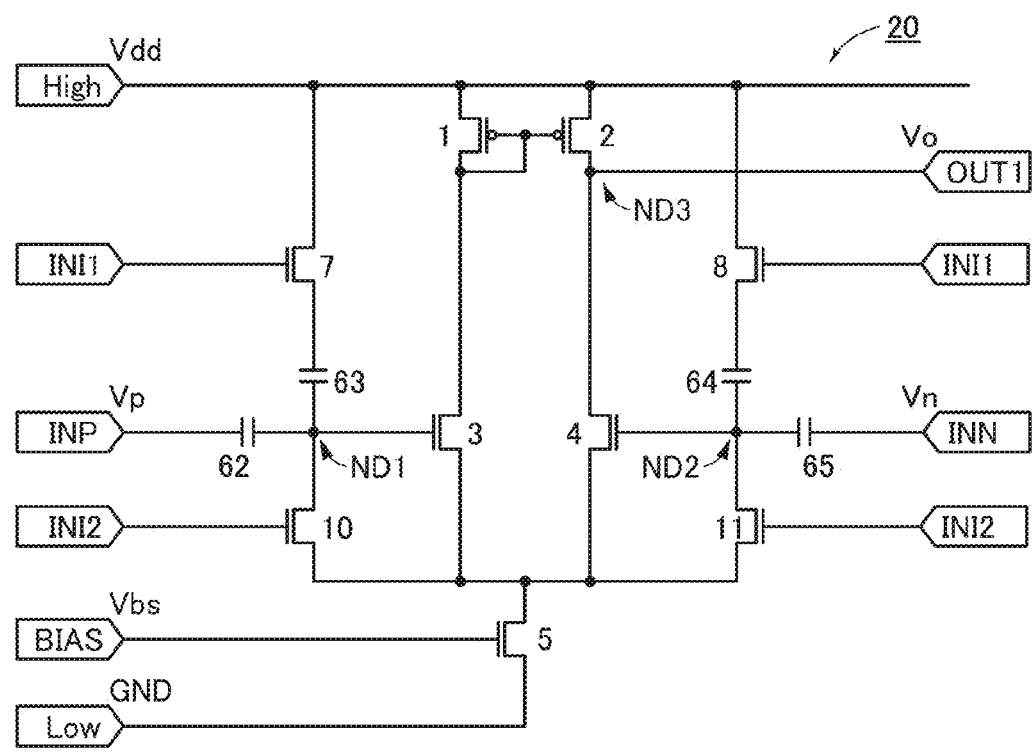
FIG. 7 is a circuit diagram illustrating a configuration example of a comparator.

The comparator 20 shown in FIG. 7 further includes a transistor 10, a transistor 11, and a terminal INI2 in addition to the components of the comparator 20 shown in FIG. 1. The node ND1, the node ND2, the drain of the transistor 5, and the terminal INI2 are electrically connected to a drain of the transistor 10, a drain of the transistor 11, each source of the transistors 10 and 11, and each gate of the transistors 10 and 11, respectively.

Figure 3B:
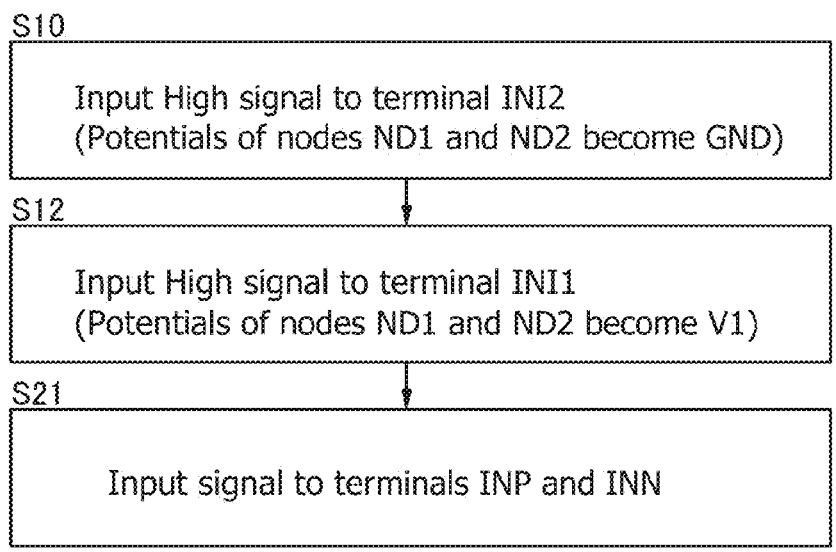

FIG. 3B is a flow chart showing the operation of the comparator 20 shown in FIG. 7. In the comparator 20 shown in FIG. 7, a step S10 is performed before the step S12. In the step S10, at a time t10, the High signal is applied to the terminal INI2, whereby the transistors 10 and 11 are turned on. Furthermore, the High signal is applied to the terminal BIAS, whereby the transistor 5 is turned on. The transistors 10, 11, and 5 are turned on, whereby GND is applied to the node ND1 and the node ND2. The operation for applying a reference potential to the node ND1 and the node ND2 can be referred to as reset.

When the potentials of the nodes ND1 and ND2 are not reset, these potentials are undetermined, in other words, are in a floating state. In the step S21, the floating potential is added to the input potential, so that the accuracy of potentials applied to the nodes ND1 and ND2 might be reduced.

In the configuration of the comparator 20 shown in FIG. 7, the reset of the potentials of the nodes ND1 and ND2 can be performed in the step S10 before the step S12 is performed. The accuracy of the potentials applied to the nodes ND1 and ND2 can be increased.

<Example 3 of Comparator>

Figure 8:
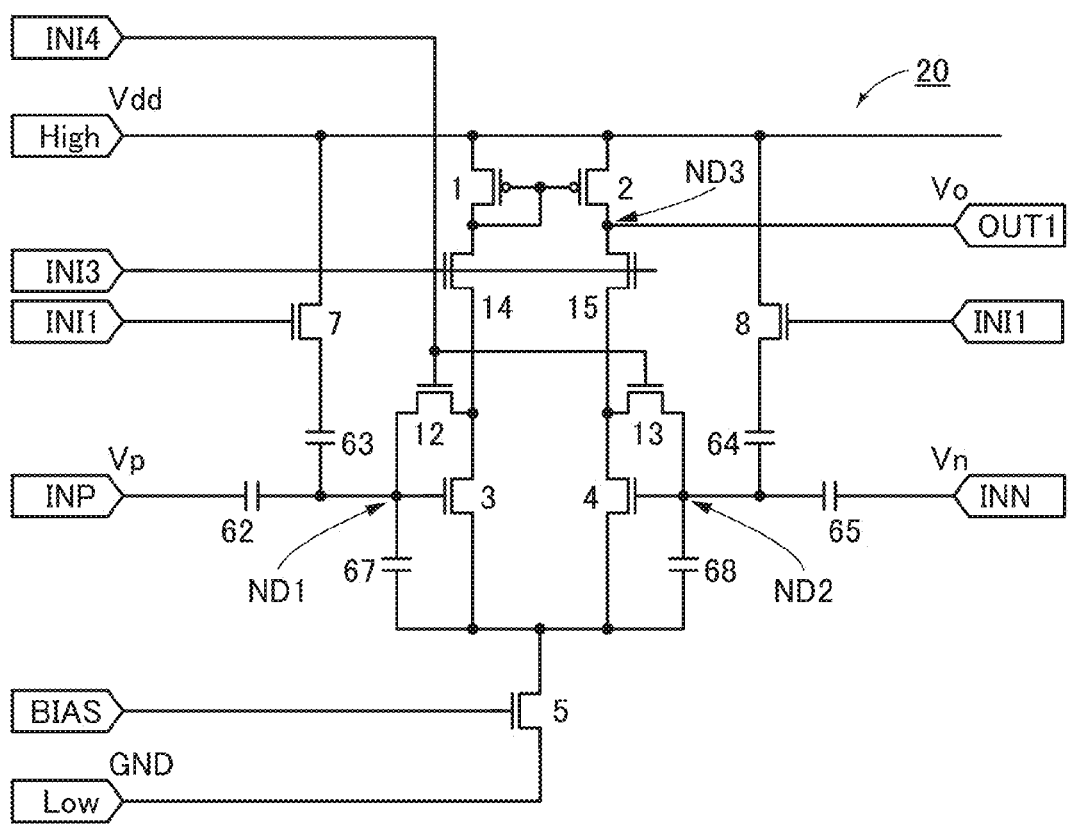
FIG. 8 is a circuit diagram illustrating a configuration example of a comparator.

The comparator 20 shown in FIG. 8 is different from the comparator 20 shown in FIG. 1 in including a transistor 14 between the transistor 1 and the transistor 3, including a transistor 15 between the transistor 2 and the transistor 4, including a terminal INI3 and a terminal INI4, including a transistor 12 and a capacitor 67 which are electrically connected to the node ND1, and including a transistor 13 and a capacitor 68 which are electrically connected to the node ND2.

The transistor 3 and the transistor 14 are connected in series to the transistor 14 and the transistor 1, respectively. The transistor 4 and the transistor 15 are connected in series to the transistor 15 and the transistor 2, respectively. Each source of the transistor 3 and the transistor 4 is preferably electrically connected to a constant current source. In the examples shown in FIG. 1, FIG. 7, and FIG. 8, the transistor 5 serves as the constant current source. The drain of the transistor 5 is electrically connected to the sources of the transistor 3 and the transistor 4. The gate of the transistor 5 is electrically connected to the terminal BIAS. The source of the transistor 5 is electrically connected to GND. Each gate of the transistor 14 and the transistor 15 is electrically connected to the terminal INI3. Each gate of the transistor 12 and the transistor 13 is electrically connected to the terminal INI4.

The transistors 12 and 13 are preferably OS-FETs. The transistors 12 and 13 are transistors for compensating the threshold values of the transistors 3 and 4. The transistors 12 and 13 store the threshold voltages of the transistors 3 and 4 in the nodes ND1 and ND2, respectively. Owing to the transistors 12 and 13 which are OS-FETs, leakage of electric charges corresponding to the potentials stored in the nodes ND1 and ND2 is avoided, so that the accuracy of the comparator can be increased.

In FIG. 8, the drain of the transistor 1 and the drain of the transistor 2 are electrically connected to the drain of the transistor 14 and the drain of the transistor 15, respectively. The source of the transistor 14 and the source of the transistor 15 are electrically connected to the drain of the transistor 3 and the drain of the transistor 4, respectively.

Figure 3C:
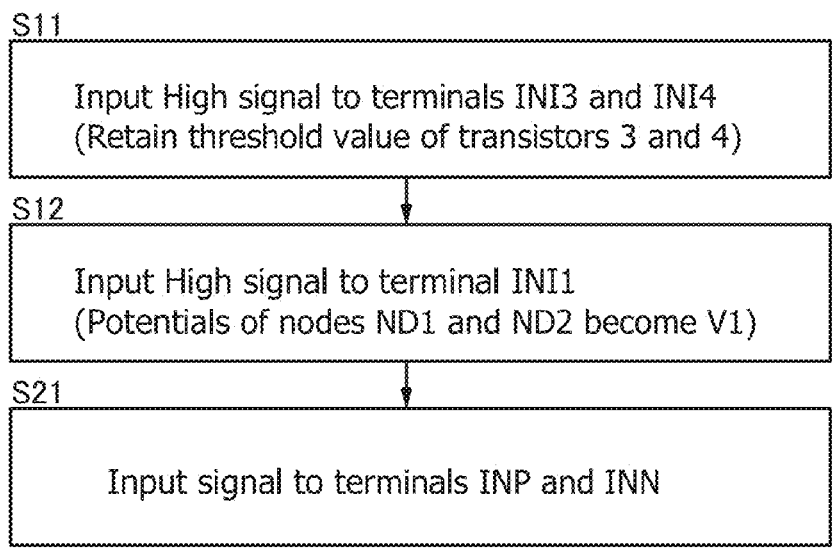

FIG. 1 can be referred to for the transistors 5, 7, and 8 and the capacitors 62, 63, 64, and 65, FIG. 3C is a flow chart showing the operation of the comparator 20 shown in FIG. 8. In the comparator 20 shown in FIG. 8, a step S11 is performed before the step S12. In the step S11, at the time t12, the High signal is applied to the terminal INI3, whereby the transistors 14 and 15 are turned on. In addition, the High signal is applied to the terminal INI4, whereby the transistors 12 and 13 are turned on. Moreover, the High signal is applied to the terminal BIAS, whereby the transistor 5 is turned on. The transistor 3 is turned off when the gate-source voltage exceeds the threshold value. In other words, the source-drain voltage of the transistor 3 also becomes the threshold voltage. The same applies to the transistor 4, and the threshold voltage can be applied between the gate and source of the transistor 4 in a similar manner. Electric charge corresponding to the threshold voltage is accumulated in the gate of the transistor 3 (retention or compensation of the threshold value). Similarly, electric charge corresponding to the threshold voltage is accumulated in the gate of the transistor 4 (retention or compensation of the threshold value).

Next, the Low signal is applied to the terminal INI3, whereby the transistors 14 and 15 are turned off. In addition, the Low signal is applied to the terminal INI4, whereby the transistors 12 and 13 are turned off. Moreover, the High signal is applied to the terminal BIAS, whereby the transistor 5 is turned off.

Since the threshold voltage is applied to the transistors 3 and 4 in the prior step S11, the accuracy of the comparator which is one embodiment of the present invention can be increased.

For example, when the transistors 3 and 4 have different threshold values, current values with respect to the gate-source voltage are also different. For example, when the threshold value is large, a larger gate-source voltage is needed to supply current of the same value. The comparator which is one embodiment of the present invention has the function of outputting a signal from the terminal OUT1 in accordance with comparison results between gate-source voltages of the transistors 3 and 4. However, in the case where the transistors 3 and 4 have different threshold values, the accuracy of the comparison results might be decreased.

When predetermined potentials are not applied to the nodes ND1 and ND2, the potentials are undetermined, in other words, are in a floating state. In the step S21, the floating potential is added to the input potential, so that the accuracy of potentials applied to the nodes ND1 and ND2 might be reduced.

Threshold values are independently applied between the gate and source of each of the transistors 3 and 4, so that the influence of variation in threshold values of the transistors 3 and 4 can be reduced. Thus, the accuracy of the comparator which is one embodiment of the present invention can be increased.

<Simulation Example>

Figure 4:
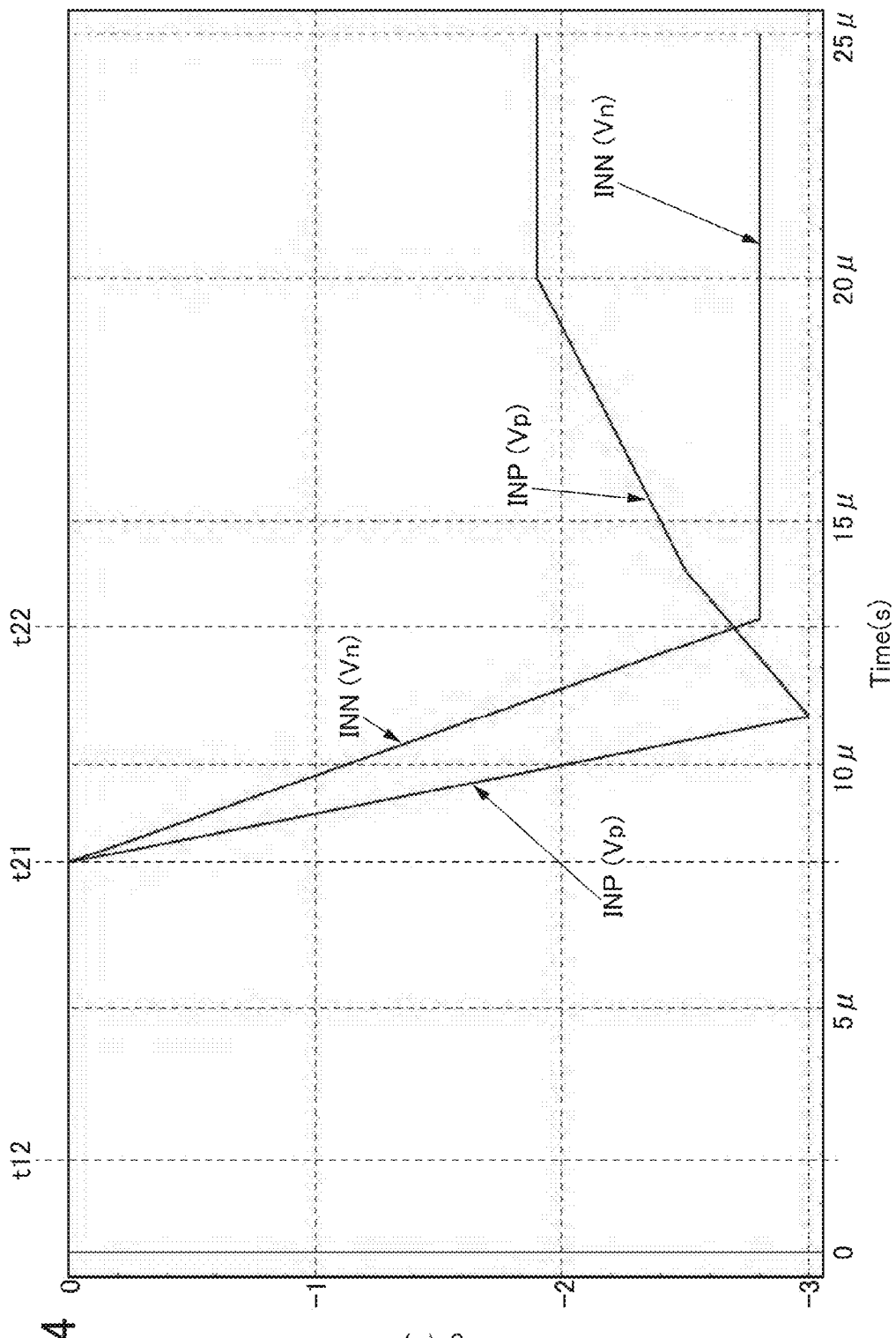
FIG. 4 is a timing chart illustrating the operation of a comparator.
Figure 6:
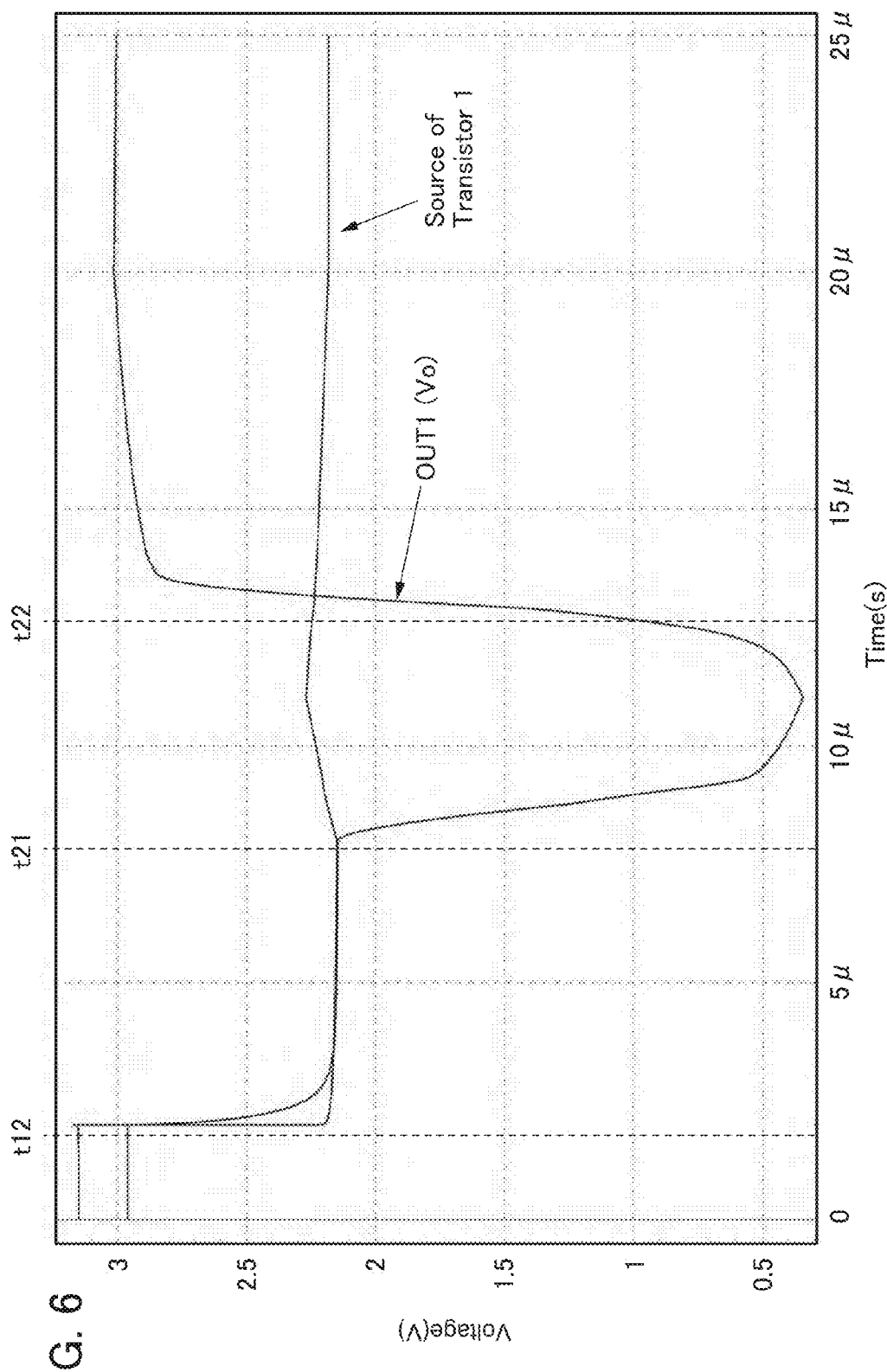
FIG. 6 is a timing chart illustrating the operation of a comparator.

The timing charts shown in FIG. 4 to FIG. 6 show the potentials of each terminal obtained by simulation with reference to the circuit diagram of FIG. 1. The voltages shown in FIG. 4 to FIG. 6 are based on GND. FIG. 4 shows the potentials of the terminal INP and the terminal INN. FIG. 5 shows the potentials of the node ND1, the node ND2, the source of the transistor 7, and the source of the transistor 8. FIG. 6 shows the potentials of the terminal OUT1 and the source of the transistor 1. In the simulation, the transistors 1 to 4 each has a channel length of 0.5 μm and a channel width of 2.61 μm. The transistor 5 has a channel length of 0.5 μm and a channel width of 0.87 μm. The transistors 7 and 8 each have a channel length of 0.5 μm and a channel width of 60.9 μm. The capacitors 62 and 65 each have a capacitance of 50 fF. The capacitors 63 and 64 each have a capacitance of 500 fF. For the simulation, SmartSpice MultiCore Version. 4.18.16.R developed by Silvaco Inc. was used. Level was 54, and Vth0 was 0.531 V.

According to FIG. 4 to FIG. 6, the expected operation of the comparator which is one embodiment of the present invention can be demonstrated.

Embodiment 2

In this embodiment, an example of a semiconductor device 300 including a semiconductor element to which a negative potential is applied is described.

<Example of Semiconductor Device>

The semiconductor device 300 preferably includes a comparator which compares the negative potential applied to the semiconductor element with a first reference potential. The comparators in the above embodiments can be used. In addition, the semiconductor device 300 includes a voltage holding portion, a voltage generation portion, a control portion, and the like, and thus can hold the negative potential applied to the semiconductor element.

A transistor is described as an example of the semiconductor element to which a negative potential is applied.

The threshold value of the transistor can be controlled by application of a potential to its back gate. For example, when a negative potential is applied to a back gate of an n-channel transistor, the threshold value can shift in the positive direction. In the case where an OS-FET is used for the transistor, the positive shift of the threshold value leads to extremely low cut-off current. The cut-off current means current flowing when the gate-source voltage is 0 V.

The use of the transistor with low cut-off current can improve the charge retention capability and reduce the refresh frequency of a circuit included in the semiconductor device. Thus, the semiconductor device with extremely low power consumption can be provided.

Figure 10A:
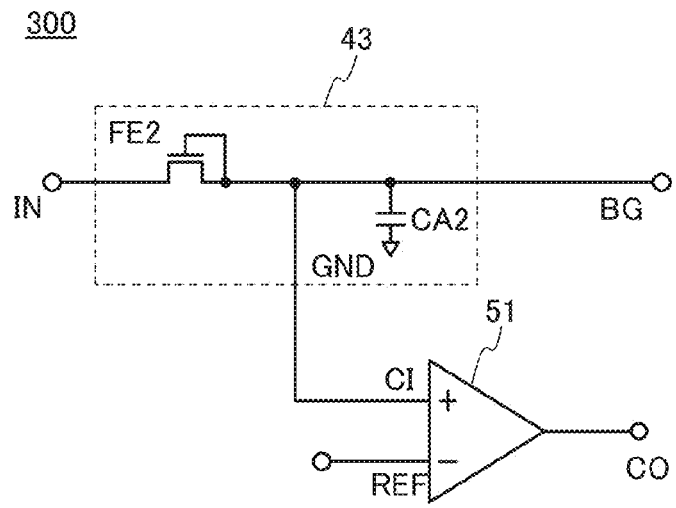
FIGS. 10A and 10B are circuit diagrams each showing an example of a semiconductor device.

The semiconductor device 300 shown in FIG. 10A as an example includes a comparator 51. The comparator 51 includes a terminal CI serving as an input terminal, a terminal REF, and a terminal CO serving as an output terminal. The comparator shown in Embodiment 1 is preferably used as the comparator 51. The terminals INP, INN, and OUT1 shown in Embodiment 1 can be used as the terminals CI, REF, and CO.

The semiconductor device 300 preferably includes a voltage holding portion 43 in order to hold negative potentials applied to the semiconductor element. For example, the voltage holding portion 43 includes a capacitor CA2, a transistor FE2, a terminal IN serving as an input terminal, and a terminal BG serving as an output terminal. One of a source and a drain of the transistor FE2 is electrically connected to the terminal IN, and the other is electrically connected to one electrode of the capacitor CA2, the terminal CI of the comparator 51, and the terminal BG. For example, GND is applied to the other electrode of the capacitor CA2. A gate of the transistor FE2 is electrically connected to the terminal BG.

An OS-FET is used for the transistor FE2 to increase the charge retention capability of the capacitor CA2. In addition, it is preferable that the transistor FE2 have low cut-off current without application of a negative potential to the back gate. Thus, the threshold value of the transistor FE2 is preferably higher than or equal to 0.5 V and lower than or equal to 6 V or higher than or equal to 1 V and lower than or equal to 4 V, and higher than the threshold value of the transistor MW.

A transistor 200 described later is preferably used as the transistor FE2. A transistor 100 described later is preferably used as the transistor MW. The transistor 100 or the transistor 200 described later can be used as the transistors 7 and 8.

For example, a negative potential (hereinafter referred to as Vbg) is outputted from the terminal BG.

Figure 10B:
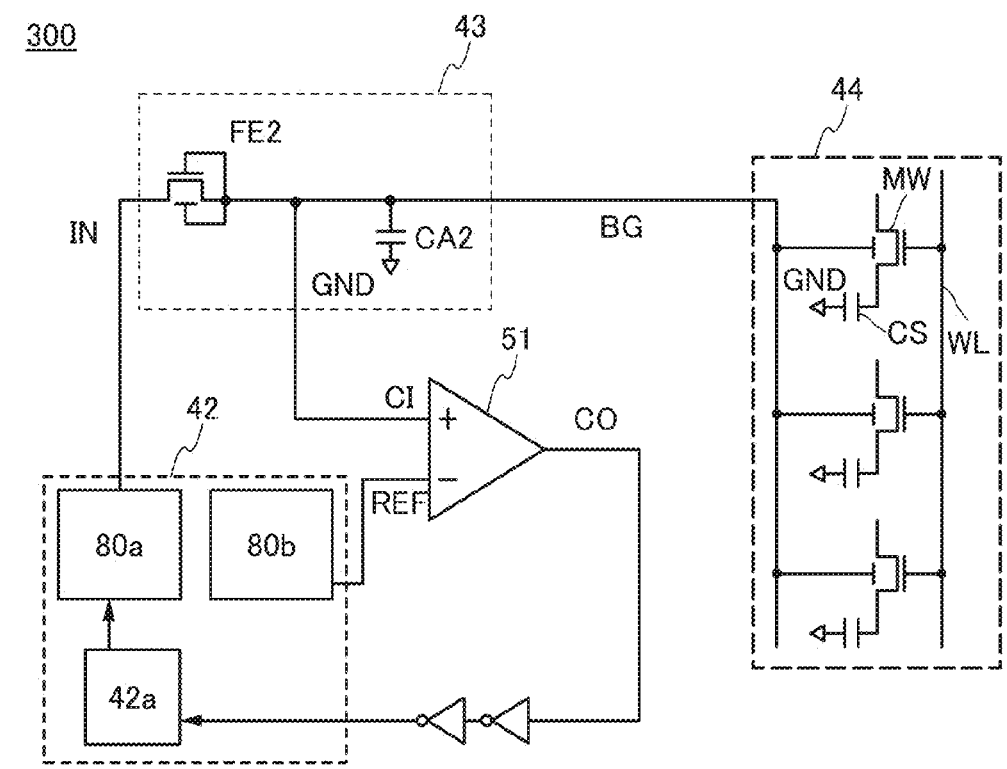

FIG. 10B shows a cell array 44 as an example of a circuit including a semiconductor element to which Vbg is applied. The cell array 44 includes a plurality of transistors MW. Each of the transistors MW includes a front gate and a back gate. Each front gate of the plurality of transistors MW is electrically connected to a wiring WL. Each back gate of the plurality of transistors MW receives Vnb from the voltage holding portion 43. One of a source and a drain of each of the transistors MW is electrically connected to one electrode of a capacitor CS. The other electrode of the capacitor CS receives GND.

The semiconductor device 300 in FIG. 10B includes a voltage generation portion 42. The voltage generation portion 42 includes charge pumps 80a and 80b and a control circuit 42a. Potentials are applied from the charge pumps 80a and 80b to the terminal IN and the terminal REF, respectively. A signal outputted from the terminal CO of the comparator 51 is buffer-amplified and inputted to the control circuit 42a. The control circuit 42a controls the charge pump 80a in accordance with the signal outputted from the terminal CO.

The transistor FE2 may have a back gate as shown in FIG. 10B. The back gate of the transistor FE2 is electrically connected to its top gate in FIG. 10B.

The voltage generation portion 42 can include a charge pump circuit or the like. The configuration example of the voltage generation portion 42 will be described below.

Figure 11A:
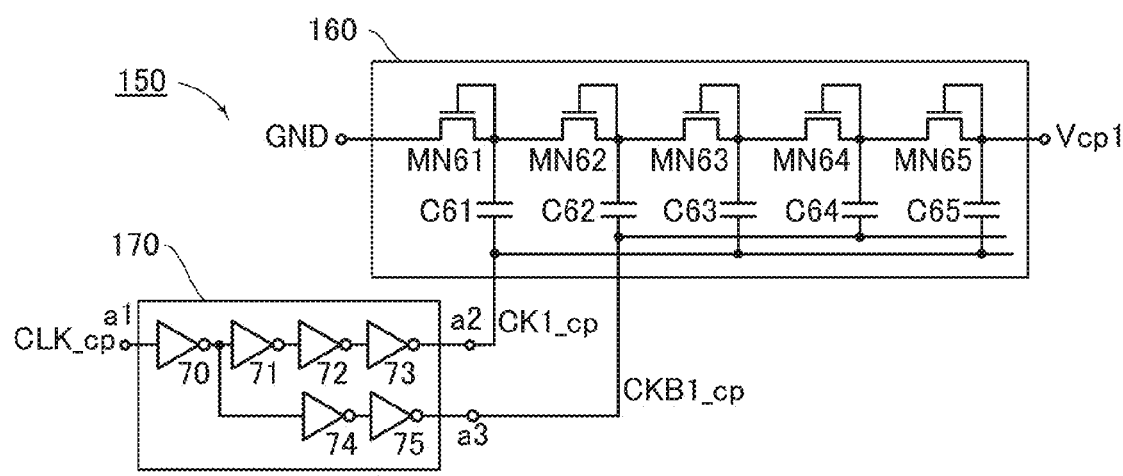
FIGS. 11A and 11B are circuit diagrams each illustrating a configuration example of a voltage generation circuit.

A negative potential generation circuit 150 illustrated in FIG. 11A includes a charge pump 160 and a clock buffer circuit 170. The negative potential generation circuit 150 and the charge pump 160 can be used as the voltage generation portion 42 and the charge pump 80a, respectively.

(Clock Buffer Circuit)

The clock buffer circuit 170 includes inverters 70 to 75 and terminals a1 to a3. The clock buffer circuit 170 has a function of generating signals CK1_cp and CKB1_cp from a signal CLK_cp. The terminal a1 is an input terminal for the signal CLK_cp, and the terminals a2 and a3 are output terminals for the signals CK1_cp and CKB1_cp, respectively. The signal CLK_cp is a clock signal outputted from the control portion 105. For example, the control portion divides a reference clock signal and generates the signal CLK_cp. The signals CK1_cp and CKB1_cp are complementary clock signals.

Figure 11B:
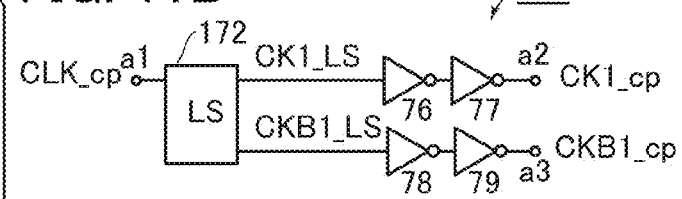

The clock buffer circuit may include a level shifter (LS). FIG. 11B illustrates a configuration example of such a case. A clock buffer circuit 171 illustrated in FIG. 11B includes an LS 172 and inverters 76 to 79. The LS 172 level-shifts the signal CLK_cp to generate signals CK1_LS and CKB1_LS. The signals CK1_cp and CKB1_cp are outputted from the inverters 77 and 79, respectively.

Although the clock buffer circuit 170 includes six inverters, the number of inverters is not limited to six. The clock buffer circuit 170 includes at least the inverters 70 and 71. The clock buffer circuit 170 can serve as a delay circuit for the signal CLK_cp. The number of inverters can be determined depending on the delay time. For example, the same applies to the clock buffer circuit 171.

(Charge Pump)

The charge pump 160 is a step-down charge pump which lowers the pressure of the potential GND to generate a potential Vcp1. Note that the input potential is not limited to the potential GND. The charge pump 160 includes transistors MN61 to MN65 and capacitors C61 to C65. The number of stages of the charge pump 160 is five but is not limited thereto.

The transistors MN61 to MN65 are diode-connected n-channel Si transistors. Instead of the transistors MN61 to MN65, diode-connected p-channel Si transistors or diode-connected OS transistors may be provided. In the case of using OS transistors, the OS transistors may have back gates.

Embodiment 3

In this embodiment, a more specific example of using the semiconductor device 300 shown in Embodiment 2 is described.

<Memory Device 1>

In the example described below, a cell array 203 included in a memory device 210 shown in FIG. 12A is the cell array 44 included in the semiconductor device 300.

The memory device 210 illustrated in FIG. 12A includes the cell array 203. The cell array 203 includes a memory cell 209. The cell array 44 included in the semiconductor device 300 can be used as the cell array 203 shown in FIG. 12A.

The cell array 203 includes a plurality of memory cells 209. FIG. 12B is a circuit diagram illustrating an example of the memory cell 209.

The memory device 210 illustrated in FIG. 12A includes a potential generation portion 201, a control portion 202, the cell array 203, and a periphery circuit 208. The periphery circuit 208 includes a sense amplifier circuit 204, a driver 205, a main amplifier 206, and an input/output circuit 207.

The cell array 203 includes a plurality of memory cells 209. The memory cells 209 are electrically connected to wirings WL, LBL (or LBLB), and BGL. The wiring WL is a word line. The wirings LBL and LBLB are local bit lines.

FIG. 12B illustrates a configuration example of the memory cell 209. The memory cell 209 includes a transistor MW1 and a capacitor CS1. The memory cell 209 has a circuit configuration similar to that of a memory cell for a DRAM. Here, the transistor MW1 is an OS transistor having a back gate. The back gate of the transistor MW1 is electrically connected to the wiring BGL. Since the transistor MW1 is an OS transistor, the memory cell 209 does not consume power while data is retained. In other words, the memory cell 209 is a low-power-consuming memory cell that can retain data for a long time. The transistor 100 or the transistor 200 described later can be used as the transistor MW1. It is particularly preferable to use the transistor 100. The same applies to transistors MW2, MW3, MW5, and MW6 and the like described later.

The driver 205 is electrically connected to a plurality of wirings WL and CSEL. The driver 205 generates signals outputted to the plurality of wirings WL and CSEL.

The cell array 203 is stacked over the sense amplifier circuit 204. The sense amplifier circuit 204 includes a plurality of sense amplifiers SA. The sense amplifiers SA are electrically connected to adjacent wirings LBL and LBLB (a pair of local bit lines), wirings GBL and GBLB (a pair of global bit lines), and the plurality of wirings CSEL. The sense amplifiers SA have a function of amplifying the potential difference between the wirings LBL and LBLB.

In the sense amplifier circuit 204, one wiring GBL is provided for four wirings LBL, and one wiring GBLB is provided for four wirings LBLB. However, the configuration of the sense amplifier circuit 204 is not limited to the configuration example of FIG. 12A.

The main amplifier 206 is connected to the sense amplifier circuit 204 and the input/output circuit 207. The main amplifier 206 has a function of amplifying the voltage of the wiring GBL. The main amplifier 206 is not necessarily provided.

The input/output circuit 207 has a function of inputting a potential corresponding to a write data to the wiring GBL and a function of outputting the potential of the wiring GBL or an output potential of the main amplifier 206 to the outside as a read data.

The sense amplifier SA from which data is read and the sense amplifier SA to which data is written can be selected using the signal of the wiring CSEL. Therefore, there is no need to provide a selection circuit such as a multiplexer in the input/output circuit 207. Thus, the input/output circuit 207 can have a simple circuit configuration and a small occupied area.

The control portion 202 has a function of controlling the memory device 210. For example, the control portion 202 controls the driver 205, the main amplifier 206, and the input/output circuit 207.

Potentials Vdd and GND are input as power supply potentials to the memory device 210. Potentials other than the potentials Vdd and GND are generated in the potential generation portion 201. The potentials generated in the potential generation portion 201 is inputted to the circuits in the memory device 210. The potential Vdd is used as a drive potential for the OS transistor (the transistor MW1). The drive potential for the OS transistor may be generated in the potential generation portion 201.

The potential generation portion 201 has a function of generating the potential Vbg_w1. The potential Vbg_w1 is inputted to the wiring BGL. For example, the potential Vbg_w1 is set to a negative potential, and the Vt of the transistor MW1 is shifted in the positive potential side. As a result, the retention time of the memory cell 209 can be increased.

The voltage holding portion 43 included in the semiconductor device 300 can be used for the potential generation portion 201. The voltage holding portion 43 can apply a negative potential and/or a positive potential. For example, the potential Vbg_w2 is applied from the voltage holding portion 43 to the back gates of the transistors MW2 included in the cell array 223. The voltage generation portion 42 included in the semiconductor device 300 may be included in the potential generation portion 201, or in another circuit region such as the control portion 202.

The memory device 210 can be driven with a single power source owing to the potential generation portion 201. In addition, the circuits included in the memory device 210 can be integrated into one IC chip.

<Memory Device 2>

In an example described below, a cell array 223 included in a memory device 220 illustrated in FIG. 13A corresponds to the cell array 44 included in the semiconductor device 300.

Figure 13A:
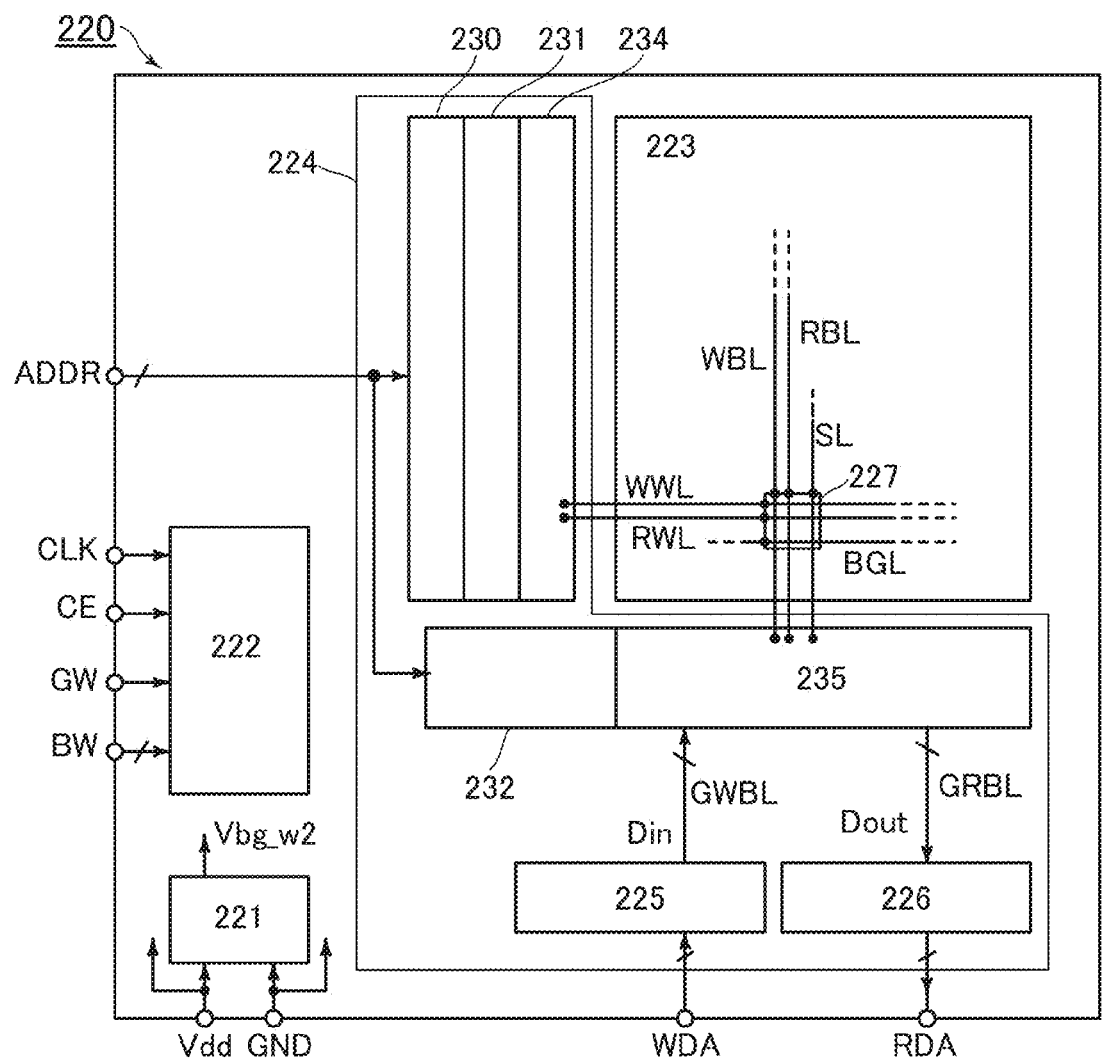
FIG. 13A is a block diagram illustrating a configuration example of a memory device and FIG. 13B is a circuit diagram illustrating a configuration example of a memory cell.

The memory device 220 illustrated in FIG. 13A includes the cell array 223. The cell array 223 includes a memory cell 227.

Figure 13B:
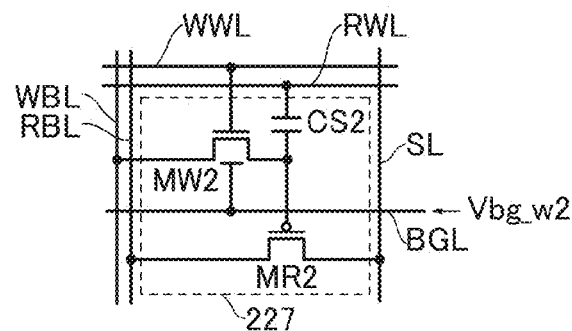

The cell array 223 includes a plurality of memory cells 227. FIG. 13B is a circuit diagram illustrating an example of the memory cell 227.

The memory device 220 illustrated in FIG. 13A includes a potential generation portion 221, a control portion 222, the cell array 223, and a peripheral circuit 224. The peripheral circuit 224 includes an input circuit 225, an output circuit 226, a predecoder 230, a row decoder 231, a column decoder 232, a row driver 234, and a column driver 235.

In the memory device 220, the circuits, signals, and voltages are selected and used as appropriate. Another circuit or another signal may further be incorporated. Structures (e.g., bit lengths) of an input signal and an output signal of the memory device 220 are determined by the architecture of a host device connected to the memory device 220, the operation mode of the memory device 220, the configuration of the cell array 223, and the like.

Signals CLK, CE, GW, BW, ADDR, and WDA are signals inputted from the outside. A signal RDA is a signal outputted to the outside. The signal CLK is a clock signal. The signals CE, GW, and BW are control signals. The signal CE is a chip enable signal. The signal GW is a global write enable signal. The signal BW is a byte write enable signal. The signal ADDR is an address signal. The signal WDA is a write data signal. The signal RDA is a read data signal.

The control portion 222 is a logic circuit having a function of controlling the entire operation of the memory device 220. For example, the control portion 222 performs a logical operation on the signals CE, GW, and BW to determine the operation mode. The control portion 222 generates a control signal for the peripheral circuit 224 so that the operation mode can be performed. The control portion 222 may have a function of generating an internal clock signal from the signal CLK.

The cell array 223 includes a plurality of memory cells 227, a plurality of wirings WWL, a plurality of wirings RWL, a plurality of wirings WBL, a plurality of wirings RBL, a plurality of wirings SL, and a plurality of wirings BGL. The plurality of memory cells 227 are arranged in a matrix. In each row, the memory cells 227 are electrically connected to the wirings WWL, RWL, and BGL. In each column, the memory cells 227 are electrically connected to the wirings WBL, RBL, and SL. The wiring WWL is a write word line. The wiring RWL is a read word line. The wiring WBL is a write bit line. The wiring RBL is a read bit line. The wiring SL is a source line.

FIG. 13B illustrates a configuration example of the cell array 223. The memory cell 227 in this example is a 2-transistor gain cell. The memory cell 227 includes a transistor MW2, a transistor MR2, and a capacitor CS2. The transistor MW2 is an OS transistor having a back gate, which is electrically connected to the wiring BGL. A potential Vbg_w2 is inputted to the wiring BGL. The potential Vbg_w2 is a potential generated in the potential generation portion 221.

The voltage holding portion 43 included in the semiconductor device 300 can be used for the potential generation portion 221. The voltage holding portion 43 can apply a negative potential and/or a positive potential. For example, the potential Vbg_w2 is applied from the voltage holding portion 43 to the back gates of the transistors MW2 included in the cell array 223. The voltage generation portion 42 included in the semiconductor device 300 may be included in the potential generation portion 221, or in another circuit region such as the control portion 222.

Since the transistor MW2 is an OS transistor, the memory cell 227 is a low-power-consuming memory cell in which power is not consumed for data retention and data can be retained for a long time. Thus, the memory device 220 can be used as a non-volatile memory device. Since the transistor MW2 and the capacitor CS2 can be stacked over the transistor MR2, the integration degree of the cell array 223 can be increased.

The peripheral circuit 224 is a circuit for writing and reading data to/from the cell array 223. The peripheral circuit 224 has a function of driving the wirings WWL, RWL, WBL, RBL, and SL, for example.

The predecoder 230, the row decoder 231, and the column decoder 232 are configured to decode the signal ADDR. The predecoder 230 is provided in the case where the cell array 223 is divided into a plurality of blocks, for example. In that case, the predecoder 230 has a function of specifying a block to be accessed. The row decoder 231 has a function of specifying a row to be accessed. The column decoder 232 has a function of specifying a column to be accessed.

The column driver 235 has a function of writing data to the cell array 223, a function of reading the data from the cell array 223, a function of amplifying the read data, and a function of retaining the read data, for example. More specifically, the column driver 235 has a function of controlling voltages of the wirings WBL, RBL, and SL, for example.

The row driver 234 has a function of activating the wirings WWL and RWL in a row specified by the row decoder 231. By activating the wiring WWL, the memory cell 227 in the specified row is selected and data is written to the selected memory cell 227 by the column driver 235. By activating the wiring RWL, the memory cell 227 in the specified row is selected. Data is written to the selected memory cell 227 by the column driver 235.

The input circuit 225 has a function of holding the WDA. The data held in the input circuit 225 is outputted to the column driver 235 through a wiring GWBL (global write bit line). Note that Din is data that is outputted from the input circuit 225 and written to the cell array 223.

A data signal Dout that is read from the memory cell by the column driver 235 is outputted to the output circuit 226 through a wiring GRBL (global read bit line). The output circuit 226 has a function of holding the data signal Dout. The output circuit 226 outputs the held data to the outside of the memory device 220. The data signal outputted from the output circuit 226 is the signal RDA.

The potentials Vdd and GND are inputted as power supply potentials to the memory device 220. Potentials other than the potentials Vdd and GND are generated in the potential generation portion 221 and inputted to the circuits in the memory device 220. The potential Vdd is used as a drive potential for the OS transistor (the transistor MW2). Needless to say, the drive potential for the OS transistor may be generated in the potential generation portion 221.

For example, the potential generation portion 221 has a function of generating the potential Vbg_w2. For example, the potential Vbg_w2 is set to a negative potential, and the Vt of the transistor MW2 is shifted in the positive potential side. As a result, the charge retention time of the memory cell 227 can be increased.

The memory device 220 can be driven when the potential generation portion 221 is used for a power-supply circuit. The circuits included in the memory device 220 can be integrated into one IC chip.

Figure 14A:
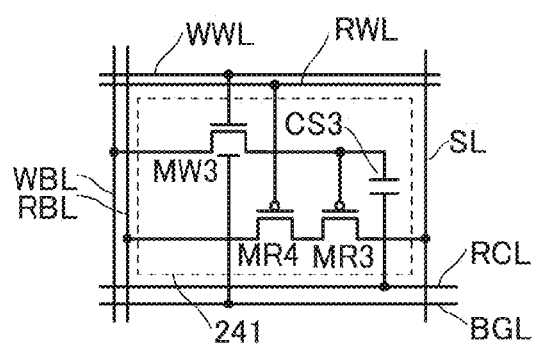
FIGS. 14A to 14E are block diagrams each illustrating a configuration example of a memory cell.
Figure 14B:
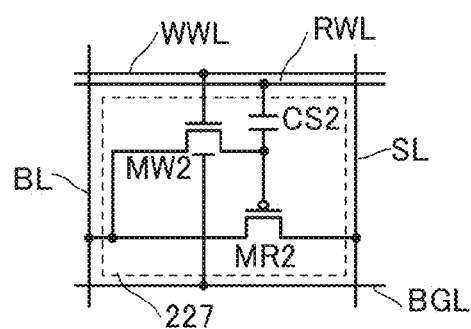
Figure 14C:
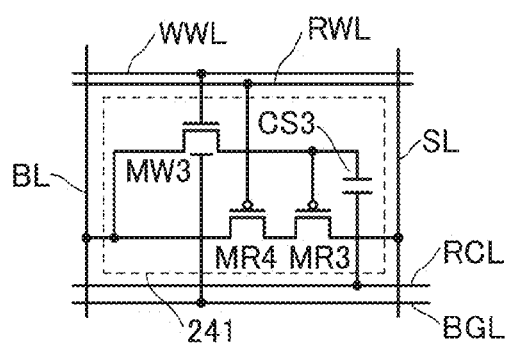
Figure 14D:
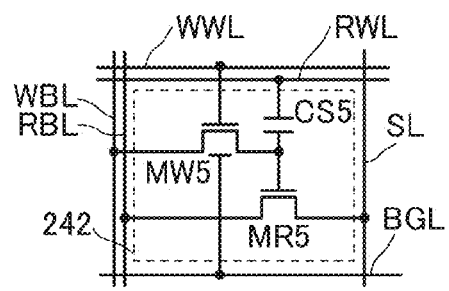
Figure 14E:
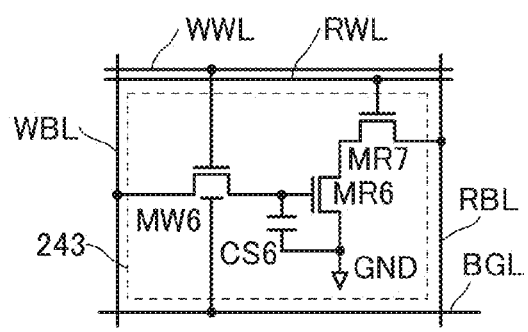

The cell array 223 may include, instead of the memory cell 227 illustrated in FIG. 13B, a memory cell 241 illustrated in FIG. 14A, the memory cell 227 illustrated in FIG. 14B, the memory cell 241 illustrated in FIG. 14C, a memory cell 242 illustrated in FIG. 14D, or a memory cell 243 illustrated in FIG. 14E.

FIGS. 14A to 14E each illustrate a configuration example of the cell array (one row and one column).

FIG. 14A illustrates a configuration example of a cell array with a 3-transistor gain cell. A wiring RCL is provided for each row of the cell array in FIG. 14A. A memory cell 241 is electrically connected to the wirings WWL, RWL, WBL, RBL, SL, RCL, and BGL. The memory cell 241 includes transistors MW3, MR3, and MR4, and a capacitor CS3. The transistor MW3 is an OS transistor with a back gate. The back gate is electrically connected to the wiring BGL. The transistors MR4 and MR3 are p-channel Si transistors.

A cell array illustrated in FIG. 14B is a modification example of FIG. 13B, and a cell array illustrated in FIG. 14C is a modification example of FIG. 14A. In these cell arrays, a bit line for writing and reading (wiring BL) is provided instead of the wirings WBL and RBL.

A cell array illustrated in FIG. 14D is a modification example of FIG. 13B. In FIG. 14D, in which an n-channel Si transistor is used instead of the transistor MR2. A memory cell 242 illustrated in FIG. 14D is electrically connected to the wirings WWL, RWL, WBL, RBL, SL, and BGL. The memory cell 242 includes transistors MW5 and MR5, and a capacitor CS5. The transistor MW5 is an OS transistor with a back gate. The transistor MR5 is an n-channel Si transistor. Also in the cell array in FIG. 14D, the wiring BL may be provided instead of the wirings WBL and RBL in a manner similar to that of FIG. 14B.

Note that when the cell array illustrated in FIG. 14D is employed for the memory device 220, a negative potential and a positive potential are preferably inputted to the wiring RWL in a non-selected row and the wiring RWL in a selected row, respectively. The negative potential inputted to the wiring RWL can be generated in the potential generation portion 221.

A cell array illustrated in FIG. 14E is a modification example of FIG. 14A, in which n-channel Si transistors are used instead of the transistors MR3 and MR4. A memory cell 243 illustrated in FIG. 14E is electrically connected to the wirings WWL, RWL, WBL, RBL, and BGL and a wiring to which a potential GND is input. The memory cell 243 includes transistors MW6, MR6, and MR7, and a capacitor CS6. The transistor MW6 is an OS transistor with a back gate. The transistors MR6 and MR7 are n-channel Si transistors. Also in the cell array in FIG. 14E, the wiring BL may be provided instead of the wirings WBL and RBL in a manner similar to that of FIG. 14C.

Note that the memory cell 209 included in the cell array 203 and any of the memory cells 227, 241, 242, and 243 included in the cell array 223 each include one transistor having a back gate (the transistor MW2, MW3, MW5, or MW6).

<<MCU 250>>

Figure 15:
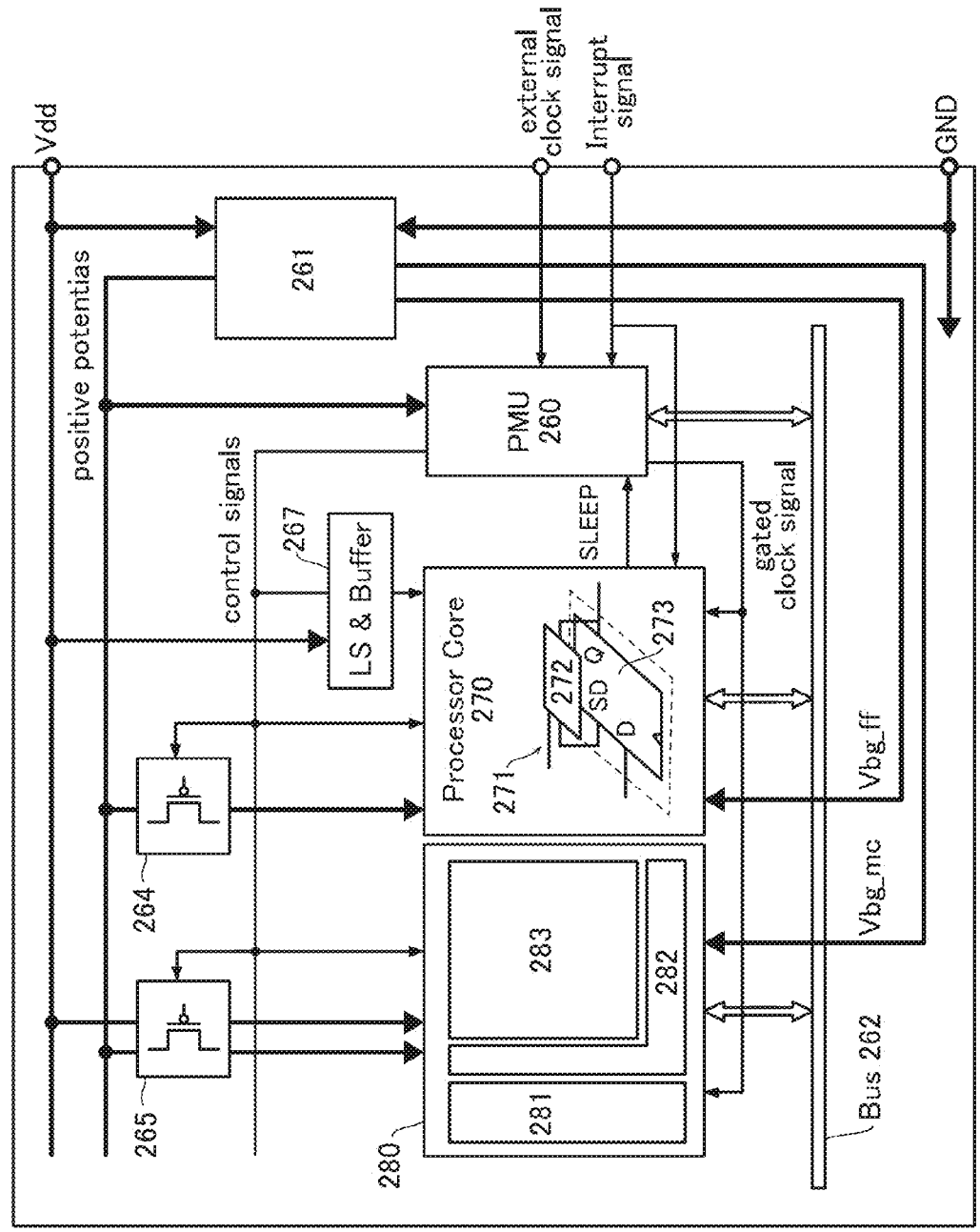
FIG. 15 is a block diagram illustrating a configuration example of a microcontroller unit.

FIG. 15 illustrates a configuration example of a microcontroller unit (MCU). An MCU 250 in FIG. 15 is a semiconductor device that is capable of clock gating and power gating.

The MCU 250 includes a power management unit (PMU) 260, a potential generation unit 261, a bus 262, power switches 264 and 265, a level shifter (LS) and buffer circuit 267, a core (or a processor core) 270, and a memory 280. The exchange of data and the like between the PMU 260, the core 270, and the memory 280 is performed through the bus 262.

In order to reduce the power consumption of a semiconductor device, circuits that do not need to be operated are stopped by power gating or clock gating. A flip-flop is a kind of sequential circuit (storage circuit that holds its state) included in a semiconductor device in many cases. Thus, a reduction in power consumption of the flip-flop is effective in reducing the power consumption of a semiconductor device including the flip-flop. In general, the state of the flip-flop is erased (data held therein is lost) when power supply is stopped. It is thus necessary to make backup of the state of the flip-flop so that the semiconductor device is power gated.

The core 270 includes a plurality of flip-flops 271. The flip-flop 271 is provided for a variety of registers in the core 270. The flip-flop 271 includes a backup circuit 272 and a scan flip-flop 273. In other words, the flip-flop 271 is a scan flip-flop including a backup circuit.

The backup circuit 272 is provided for the flip-flop 271 to store data of the flip-flop 271 in clock gating and power gating. The backup circuit 272 includes a plurality of OS transistors having back gates. The backup circuit 272 can be stacked over a logic cell composed of a Si transistor because no Si transistor is included in the backup circuit 272.

The memory 280 includes a control portion 281, a periphery circuit 282, and a cell array 283. The cell array 283 includes a plurality of memory cells including OS transistors. The above-described memory device can be employed for the memory 280.

Power-supply potentials such as the potentials Vdd and GND are inputted to the MCU 250. Positive potentials and negative potentials other than the potentials Vdd and GND are generated in the potential generation unit 261. For example, the potential generation unit 261 generates negative potentials such as potentials Vbg_ff and Vbg_mc. The potential Vbg_ff is inputted to the back gates of the OS transistors of the backup circuit 272. The potential Vbg_mc is inputted to the back gates of the OS transistors of the cell array 283. The potential Vdd here is a drive potential for OS transistors. The potential Vdd is supplied to the LS and buffer circuit 267 and the cell array 283. The potential generation unit 261 generates positive potentials such as a reference potential, a high-power-supply potential for driving a Si transistor, and the like. Needless to say, the potential generation unit 261 may generate the drive potential for the OS transistors.

The voltage holding portion 43 and the voltage generation portion 42 included in the semiconductor device 300 can be used in the MCU 250.

The potential generation unit 261 preferably includes the voltage holding portion 43 included in the semiconductor device 300. The voltage holding portion 43 can apply a negative potential and/or a positive potential. For example, the potential Vbg_ff is applied from the voltage holding portion 43 to the back gates of the OS transistors included in the cell array 283. The voltage generation portion 42 included in the semiconductor device 300 may be included in the potential generation unit 261, or in another circuit region.

A clock signal, an interrupt request signal, and the like are inputted to the MCU 250 from the outside. The external clock signal is inputted to the PMU 260. The interrupt request signal is inputted to the PMU 260 and the core 270.

The PMU 260 has a function of controlling clock gating and power gating. The PMU 260 generates a gated clock signal (hereinafter referred to as GCLK) from an external clock signal. The signal GCLK is inputted to the core 270 and the memory 280. The PMU 260 generates a variety of control signals. The control signals include control signals for the power switches 264 and 265, a control signal for the backup circuit 272, and a control signal for the scan flip-flop 273 (e.g., a reset signal).

The control signal for the backup circuit 272 is inputted to the LS and buffer circuit 267. The LS and buffer circuit 267 has a function of level-shift the control signal and of holding the level-shifted control signal. The control signal held by the LS and buffer circuit 267 is inputted to the backup circuit 272.

The power switch 264 controls supply of a positive potential to the core 270. The power switch 265 controls supply of a positive potential to the memory 280. When the core 270 includes a plurality of power supply domains, power switches corresponding to the power supply domains are provided as the power switch 264. The same applies to the power switch 265. Other than the potential Vdd, a plurality of positive potentials corresponding to the circuit configuration is inputted to the memory 280 through the power switch 265. The positive potentials inputted to the memory 280 include a power-supply potential for the control portion 281, a power-supply potential for the periphery circuit 282, a precharge potential for the bit line, a reference potential for reading data, and the like.

A signal SLEEP is outputted from the core 270 to the PMU 260. The signal SLEEP is a trigger signal for transferring the core 270 to the sleep mode (standby mode). When the signal SLEEP is inputted to the PMU 260, the PMU 260 outputs a control signal for transition from the active mode to the sleep mode to a functional circuit to be controlled. The core 270 can be transferred from the active mode to the sleep mode in response to an interrupt request signal.

First, the PMU 260 stops supplying the clock signal to the core 270 to transfer it from the active mode to the sleep mode. Then, data in the scan flip-flop 273 is written to the backup circuit 272. The PMU 260 controls the power switch 264 and stops the supply of a positive potential to the core 270 as necessary.

Processing for returning the core 270 from the sleep mode to the active mode is executed by input of an interrupt request signal, for example. In response to the interrupt request signal, the PMU 260 outputs a control signal for transition from the sleep mode to the active mode to a functional circuit which is to be controlled. The PMU 260 controls the power switches 264 and 265 to restart the potential supply to the core 270 and the memory 280. Then, data held in the backup circuit 272 is recovered to the scan flip-flop 273. Finally, the supply of clock signals to the core 270 and the memory 280 is restarted.

The PMU 260 performs clock gating and power gating of the memory 280 like the core 270.

A timer circuit for counting time may be provided in the PMU 260 for power gating of the core 270 and the memory 280 on the basis of the counted time.

<Flip-flop 271>

Figure 16:
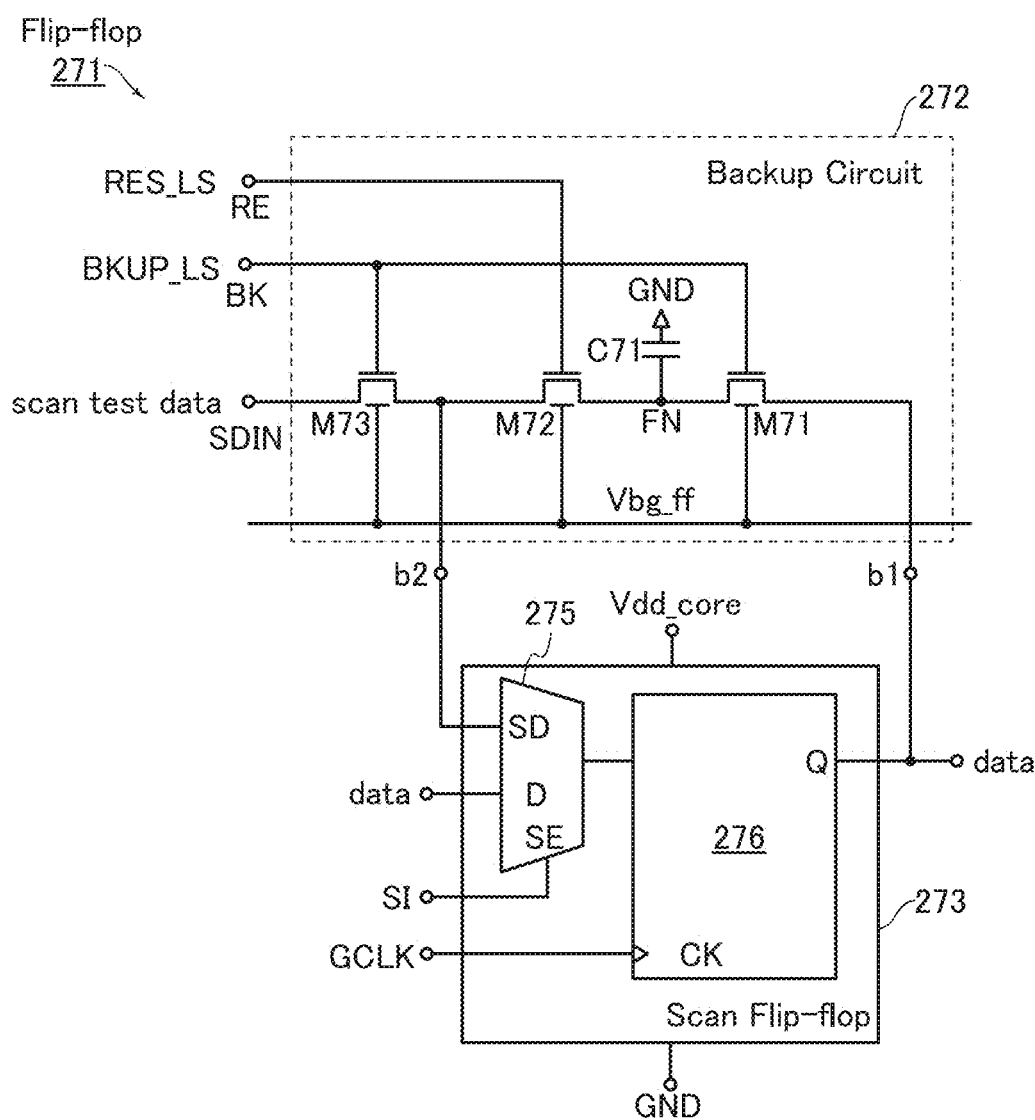
FIG. 16 is a block diagram illustrating a configuration example of a flip-flop.

FIG. 16 illustrates a configuration example of the flip-flop 271 (the backup circuit 272 and the scan flip-flop 273).

There is no particular limitation on the circuit structure of the scan flip-flop 273. A scan flip-flop that is prepared in a circuit library can be used. The scan flip-flop 273 includes nodes D, Q, CK, SD, and SE, a selector 275, and a flip-flop 276. A signal SI is inputted to the node SE. The selector 275 selects either the node D or the node SD depending on the logic of the signal SI and outputs data to be inputted to the selected node to the flip-flop 276. The signal SI is outputted from the PMU 260.

A potential Vdd_core and GND are inputted to the scan flip-flop 273 as power supply potentials. The potential Vdd_core is a positive potential generated in the potential generation unit 261. The potential Vdd_core is supplied to the core 270 through the power switch 264.

The backup circuit 272 includes nodes RE, BK, SDIN, FN, b1, and b2, transistors M71 to M73, and a capacitor C71. The node FN is a data retention node. The capacitor C71 is electrically connected to the node FN. The node b1 is electrically connected to the node Q. The node b2 is electrically connected to the node SD. A backup signal (BKUP_LS) is inputted to the node BK, and a restore signal (RES_LS) is inputted to the node RE. The signals BKUP_LS and RES_LS are outputted from the LS and buffer circuit 267. The node SDIN is an input node of a scan test data.

The transistors M71 to M73 are OS transistors each including a back gate. A potential Vbg_ff is inputted to these back gates. Gates of the transistors M71 and M73 are electrically connected to the node BK. A gate of the transistor M72 is electrically connected to the node RE.

Note that the voltage holding portion 43 and the voltage generation portion 42 included in the semiconductor device 300 can be used for generating the potential Vbg_ff.

Figure 17A:
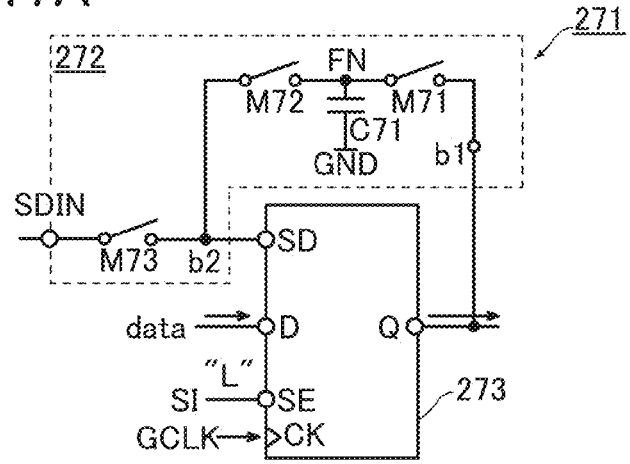
FIGS. 17A to 17C are circuit diagrams illustrating operation examples of a flip-flop.
Figure 17B:
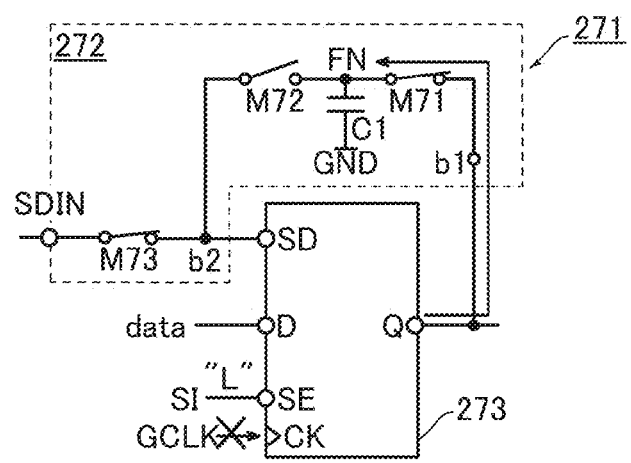
Figure 17C:
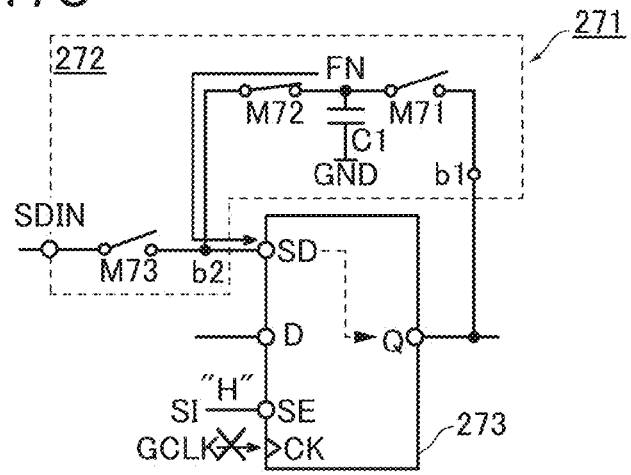

An operation example of the flip-flop 271 is described with reference to circuit diagrams in FIGS. 17A to 17C. In FIGS. 17A to 17C, the transistors M71 to M73 are denoted by switches.

(Normal Operation)

FIG. 17A illustrates an operation example of the flip-flop 271 in an active mode, where the flip-flop 271 performs normal operation. The flip-flop 271 takes data inputted from the node D and outputs retained data from the node Q in synchronization with the rise (or fall) of the signal GCLK. Since the flip-flop 271 takes data from the node D, the signal SI at "L" (low level) is inputted to the node SE. Since the signals BKUP_LS and RES_LS are at "L," the transistors M71 to M73 are off.

(Backup Operation)

First, the input of the signal GCLK is stopped in order to backup data of the scan flip-flop 273. The logic of the node Q is determined by this clock gating. Next, the signal BKUP_LS at "H" (high level) is inputted to the node BK to turn on the transistors M71 and M73 (FIG. 17B). Since the node FN is electrically connected to the node Q, the logic of the node FN is the same as that of the node Q. When the logic of the node Q is "1," the logic of the node FN is also "1." When the logic of the node Q is "0," the logic of the node FN is also "0."

Next, the signal BKUP_LS at "L" is inputted to the node BK to turn off the transistor M71. Thus, the node FN is brought into an electrically floating state and the backup operation terminates. After the backup operation, supply of the potential Vdd_core to the scan flip-flop 273 is stopped as necessary. Since the transistors M71 and M72 are OS transistors that have an extremely low off-state current, the backup circuit 272 can retain data for a long time.

(Restore Operation)

To start data restore operation of the scan flip-flop 273, the supply of the potential Vdd_core to the scan flip-flop 273 is restarted. Next, the signal SI at "H" is inputted to the node SE so that data of the node SD is inputted to the scan flip-flop 273. The signal RES_LS at "H" is inputted to the node RE to turn on the transistor M72. The node FN is electrically connected to the node SD, so that data of the node FN is written to the node SD (FIG. 17C). Then, the signal GCLK for one clock cycle is inputted to write the data of the node SD to the node Q. The scan flip-flop 273 returns to the state immediately after the stop of the input of the signal GCLK. In other words, the logic of the node Q of the scan flip-flop 273 is the same as the logic of the node Q immediately after the stop of the input of the signal GCLK.

The signal RES_LS at "L" is inputted to the node RE to turn off the transistor M72; thus, the restore operation is terminated. The scan flip-flop 273 starts normal operation by restart of the input of the signal GCLK.

Since the transistors M71 and M72 are OS transistors that have an extremely low off-state current, the backup circuit 272 can retain data for a long time. Input of a negative potential to the back gates of the transistors M71 and M72 is effective in increasing data retention time because cutoff current of the transistors M71 and M72 can be reduced.

When the transistors M71 to M73 are OS transistors, the transistors M71 to M73 can be stacked over the scan flip-flop 273. Thus, the backup circuit 272 can be provided without any change in design and layout of the scan flip-flop 273. Consequently, the area overhead due to the backup circuit 272 can be substantially zero.

The flip-flop 271 can backup and restore data at high speed. For example, the flip-flop 271 can complete backup operation and restore operation within several clock cycles. The backup operation and the restore operation correspond to charging and discharging of the node FN by switching operation of the transistors M71 and M72; thus, energy required for these operations is low as in the case of a DRAM cell. In addition, since the backup circuit 272 does not consume power for data retention, the standby power of the flip-flop 271 can be reduced. Supply of power to the backup circuit 272 is not needed in normal operation; thus, even when the backup circuit 272 is provided, the dynamic power of the flip-flop 271 is not increased substantially.

Note that when the backup circuit 272 is provided, parasitic capacitance of the transistor M71 is added to the node Q. However, the parasitic capacitance of the transistor M71 is lower than parasitic capacitance due to a logic circuit connected to the node Q; thus, the influence of the parasitic capacitance of the transistor M71 on the normal operation of the flip-flop 271 is negligible. In other words, even when the backup circuit 272 is provided, there is no substantial decrease in the performance of the flip-flop 271 in the active mode.

The semiconductor device of this embodiment includes a circuit block that operates using a negative potential. Owing to the potential generation system in Embodiment 2, a negative potential generated with high accuracy can be inputted to the circuit block, so that the semiconductor device can be operated stably. In addition, owing to the potential generation system, a semiconductor device that requires a negative potential can operate with a single power source.

<<Imaging Device>>

Figure 18A:
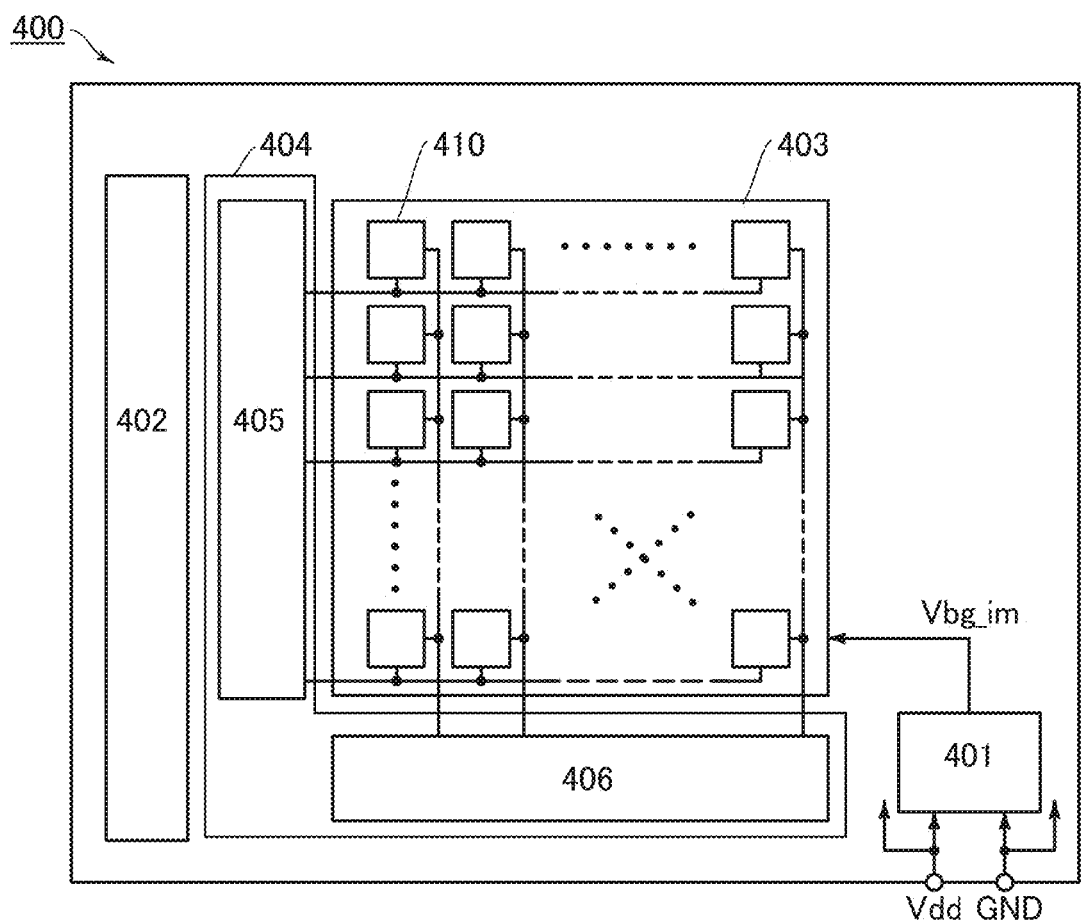
FIG. 18A is a block diagram illustrating a configuration example of an imaging device and FIG. 18B is a circuit diagram illustrating a configuration example of a pixel.
Figure 18B:
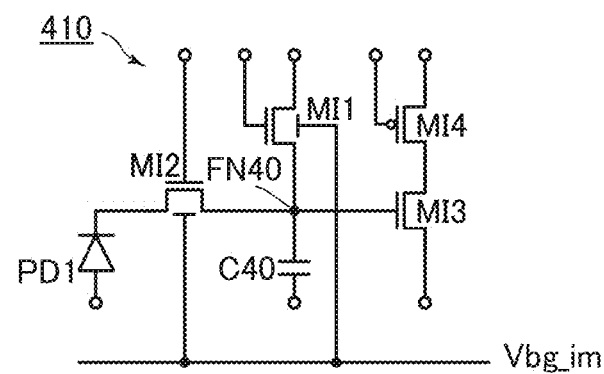

An imaging device 400 illustrated in FIG. 18A includes a potential generation unit 401, a control portion 402, a pixel array 403, and a peripheral circuit 404. The peripheral circuit 404 includes a row driver 405 and a column driver 406. The pixel array 403 includes a plurality of pixels 410 arranged in a matrix of rows and columns. The pixel 410 is an image sensor, and has a function of converting light into electric charge, a function of accumulating electric charge, and the like. FIG. 18B illustrates an example of the pixel 410.

The pixel 410 in FIG. 18B includes a photodiode PD1, transistors MI1 to MI4, a capacitor C40, and a node FN40. The node FN40 serves as a data-holding node. The capacitor C40 is a storage capacitor for holding the voltage of the node FN40. The transistor MI1 is referred to as a reset transistor. The transistor MI1 has a function of resetting the voltage of the node FN40. The transistor MI2 is referred to as an exposure transistor that controls an exposure operation. The transistor MI2 is a pass transistor that controls a conduction state between the node FN40 and the photodiode PD1. With the transistor MI2, the exposure operation timing can be controlled; thus, an image can be taken by a global shutter method. The transistor MI3 is referred to as an amplifier transistor. The transistor MI3 has a function of generating on-state current corresponding to the voltage of the node FN40. The transistor MI4 is referred to as a selection transistor. The transistor MI4 is a pass transistor that controls a conduction state between the transistor MI3 and an output terminal of the pixel 410.

Here, the transistors MI1 and MI2 are OS transistors having back gates, the transistor MI3 is an n-channel Si transistor, the transistor MI4 is a p-channel Si transistor. A potential Vbg_im is inputted to the back gates of the transistors MI1 and MI2.

A p-n junction or p-i junction diode element in a silicon substrate, a p-i-n diode element using an amorphous silicon film (amorphous silicon film or a microcrystalline silicon film), or the like can be used as the photodiode PD1. Note that another photoelectric conversion element may be used instead of the photodiode in the pixel 410. For example, a diode-connected transistor may be used. A variable resistor or the like utilizing a photoelectric effect may be formed using silicon, germanium, selenium, or the like. A photoelectric conversion element that includes selenium utilizing a phenomenon called avalanche multiplication may be used. In the photoelectric conversion element, a highly sensitive sensor in which the amount of amplification of electrons with respect to the amount of incident light is large can be obtained. Amorphous selenium or crystalline selenium can be used as a selenium-based material. Crystalline selenium may be obtained by, for example, depositing amorphous selenium and then performing heat treatment. When the crystal grain size of crystalline selenium is smaller than a pixel pitch, variation in characteristics between pixels can be reduced.

The potentials Vdd and GND are inputted as power supply potentials to the imaging device 400. The potential Vdd is used as a drive potential for the OS transistors (the transistors MI1 and MI2). The drive potential for the OS transistors may be generated in the potential generation unit 401.

Potentials other than the potentials Vdd and GND are generated in the potential generation unit 401 and inputted to the circuits in the imaging device 400. The potential generation unit 401 has a function of generating the potential Vbg_im. Since the potential Vbg_im is set to a negative potential, cut-off current of the transistors MI1 and MI2 can be reduced. Thus, variation in potential of the node FN40 can be suppressed, and the imaging device 400 can perform high-accuracy imaging.

The potential generation unit 401 preferably includes the voltage holding portion 43 included in the semiconductor device 300. The voltage holding portion 43 can apply a negative potential and/or a positive potential. For example, the potential Vbg_im is generated by the voltage holding portion 43 and supplied to the back gates of the transistors MI1 and MI2.

The voltage generation portion 42 and the like included in the semiconductor device 300 may be included in the potential generation unit 401, or in another circuit region such as the control portion 402.

<Programmable Circuit>

A programmable circuit will be described below as an example of the semiconductor device of one embodiment of the present invention. A programmable circuit 700 includes a plurality of PLEs 701 arranged in an array. Here, the expression "arranged in an array" means that the PLEs are arranged in a matrix at regular intervals, and the arrangement is not limited to that illustrated in FIG. 19.

Figure 19:
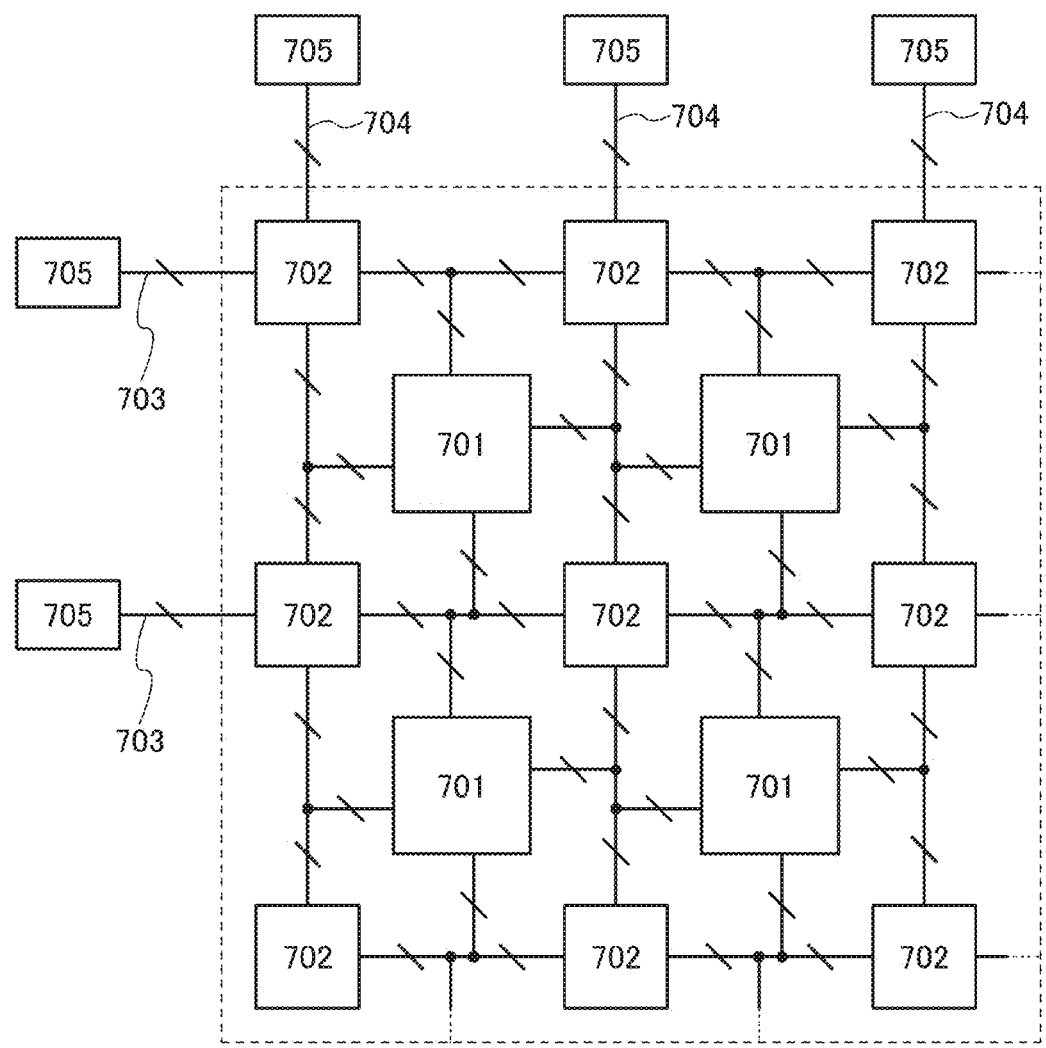
FIG. 19 illustrates a configuration example of a programmable circuit.

A plurality of wirings are formed to surround the PLEs 701. In FIG. 19, these wirings consist of a plurality of horizontal wiring groups 703 and a plurality of vertical wiring groups 704. A wiring group is a bundle of wirings. A PSE 702 is provided at an intersection of the horizontal wiring group 703 and the vertical wiring group 704. The horizontal wiring groups 703 and the vertical wiring groups 704 are connected to input/output terminals 705 to transmit and receive signals to and from a circuit provided outside the programmable circuit 700.

The input/output terminals 705 are connected to the horizontal wiring groups 703 and the vertical wiring groups 704 provided around the PLEs 701. For example, in FIG. 19, the input/output terminals 705 are connected to the horizontal wiring groups 703 and the vertical wiring groups 704 on the left, right, top, and bottom sides. With the use of the horizontal wiring groups 703 and the vertical wiring groups 704, each of the PLEs 701 can be connected to other PLEs 701. A connection path between one PLE 701 and another PLE 701 is determined by a switch included in the PSE 702.

The on/off state of the switch in the PSE 702 for switching connection between wirings is determined by a configuration memory that retains configuration data. The configuration memory with a rewritable structure, which is provided in the PSE 702, preferably includes a nonvolatile memory element to prevent stored configuration data from being lost by stop of supply of power supply voltage.

The PLE 701 includes, for example, a look-up table (LUT), a flip-flop, and a configuration memory.

The LUT can be used to change a logic function to be determined, depending on the content of configuration data stored in the configuration memory.

The flip-flop holds a signal output from the LUT and outputs an output signal corresponding to the signal in synchronization with the clock signal CLK.

Any of the above-described memory devices can be used for the configuration memories included in the PLE 701 and the PSE 702, for example. Voltage is preferably supplied to the memory device from the voltage holding portion described in either of the above embodiments.

Embodiment 4

In this embodiment, an IC chip, an electronic component, electronic devices, and the like are described as examples of a semiconductor device.

<Example of Manufacturing Method of Electronic Component>

Figure 20A:
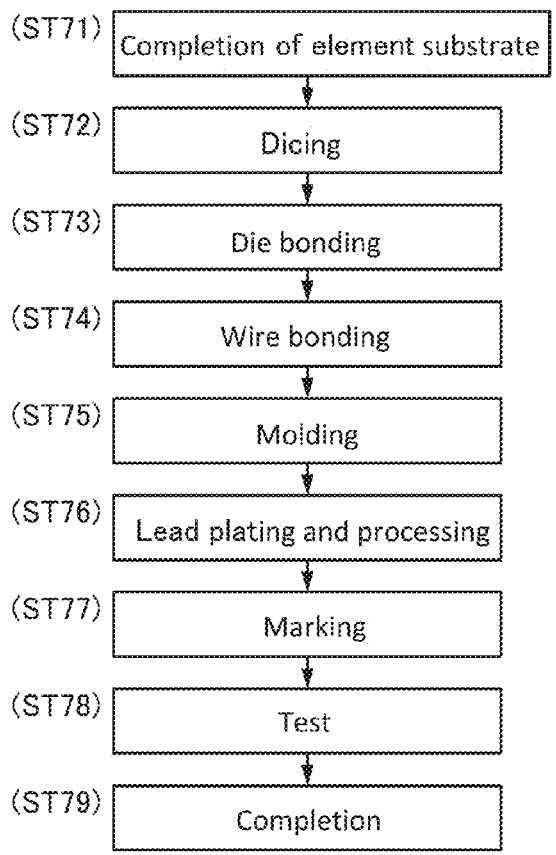
FIG. 20A is a flow chart showing an example of a method for manufacturing an electronic component.

FIG. 20A is a flow chart showing an example of a method for manufacturing an electronic component. The electronic component is also referred to as a semiconductor package or an IC package. The electronic component has a plurality of standards and names depending on a terminal extraction direction and a terminal shape. Thus, examples of the electronic component are described in this embodiment.

A semiconductor device including a transistor is completed by integrating detachable components on a printed board through the assembly process (post-process). The post-process can be completed through steps shown in FIG. 20A. Specifically, after an element substrate obtained in the pre-process is completed (Step ST71), a back surface of the substrate is ground. The substrate is thinned in this step to reduce warpage or the like of the substrate in the pre-process and to reduce the size of the component. Then, a dicing step of dividing the substrate into a plurality of chips is performed (Step ST72).

Figure 20B:
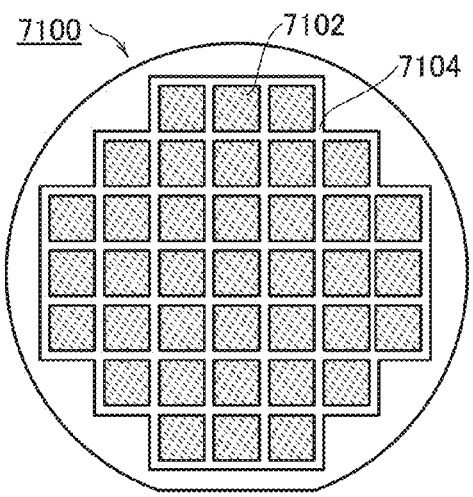
FIG. 20B is a top view of a semiconductor wafer.
Figure 20C:
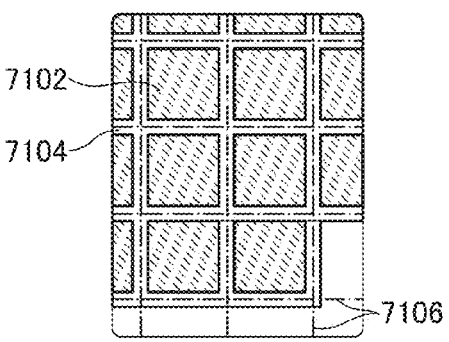
FIG. 20C is an enlarged view of the top view.

FIG. 20B is a top view of a semiconductor wafer 7100 on which a dicing process is not yet performed. FIG. 20C is a partially enlarged view of FIG. 20B. A plurality of circuit regions 7102 is provided on the semiconductor wafer 7100. A semiconductor device of one embodiment of the present invention (e.g., the holding circuit, the memory device, the imaging device, or the MCU) is provided in each circuit region 7102.

Figure 20D:
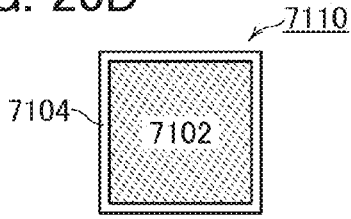
FIG. 20D is a schematic diagram illustrating a structure example of a chip.

The circuit regions 7102 are each surrounded by a separation region 7104. Separation lines (also referred to as "dicing lines") 7106 are set at a position overlapping with the separation regions 7104. In the dicing step (Step ST72), the semiconductor wafer 7100 is cut along the separation lines 7106, whereby chips 7110 including the circuit regions 7102 are cut out from the semiconductor wafer 7100. FIG. 20D is an enlarged view of the chip 7110.

A conductive layer or a semiconductor layer may be provided in the separation regions 7104. Providing a conductive layer or a semiconductor layer in the separation regions 7104 relieves ESD that might be caused in the dicing step, preventing a decrease in the yield due to the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation regions 7104 allows a reduction in the usage of the pure water. Therefore, the cost of manufacturing semiconductor devices can be reduced. Thus, semiconductor devices can be manufactured with improved productivity.

After Step ST72, the divided chips are separately picked up, placed on a lead frame, and bonded thereto in a die bonding step (Step ST73). In the die bonding step, the chip may be bonded to the lead frame by an appropriate method depending on the product, for example, with a resin or a tape. As the bonding method, a suitable method for the product may be selected; for example, the chips and the lead frame may be bonded with a resin or tape. In the die bonding step, the chip may be mounted on an interposer and bonded thereto. In a wire bonding step, a lead of the lead frame and an electrode on the chip are electrically connected to each other with a metal wire (Step ST74). A silver line or a gold line can be used as the metal wire. The wire bonding may be either ball bonding or wedge bonding.

A wire-bonded chip is subjected to a molding step of sealing the chip with an epoxy resin or the like (Step ST75). By the molding step, the inside of the electronic component is filled with a resin, thereby reducing damage to the circuit portion and the wire embedded in the component caused by external mechanical force as well as reducing deterioration of characteristics due to moisture or dust. The lead of the lead frame is plated. After that, the lead is cut and processed (Step ST76). The plating process prevents rust of the lead and facilitates soldering at the time of mounting the chip on a printed board in a later step. Next, printing process (marking) is performed on a surface of the package (Step ST77). After a testing step (Step ST78), the electronic component is completed (Step ST79). An electronic component including the semiconductor device described in the above embodiment can achieve low power consumption and a small size.

Figure 20E:
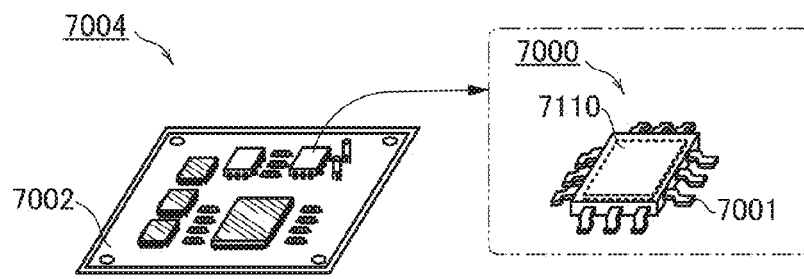
FIG. 20E is a schematic perspective view illustrating a structure example of an electronic component.

FIG. 20E illustrates a schematic perspective view of the completed electronic component. FIG. 20E illustrates a schematic perspective view of a quad flat package (QFP) as an example of the electronic component. As illustrated in FIG. 20E, an electronic component 7000 includes a lead 7001 and a chip 7110.

The electronic component 7000 is mounted on a printed board 7002, for example. A plurality of electronic components 7000 which are combined and electrically connected to each other over the printed board 7002 can be mounted on an electronic device. A completed circuit board 7004 is provided in an electronic device or the like. When an electronic device includes the electronic component 7000, the power consumption of the electronic device can be reduced. Alternatively, the electronic device can easily have a smaller size.

The electronic component 7000 can be used as an electronic component (IC chip) of electronic devices in a wide range of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), cellular phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATM), vending machines, and consumer electronics.

Structure examples of electronic devices are described with reference to FIGS. 21A to 21C and FIGS. 22A to 22E. A touch panel device including a touch sensor is preferably used in display portions of the electronic devices illustrated in FIG. 21A and the like. With the touch panel device, the display portion can also function as an input portion of the electronic device.

Figure 21A:
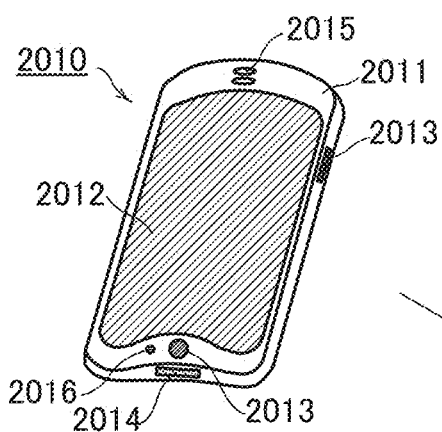
FIGS. 21A to 21C illustrate structure examples of electronic devices.

An information terminal 2010 illustrated in FIG. 21A includes a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be inputted by touching the display portion 2012 with a finger or the like. Various kinds of operation such as making a call, inputting letters, and switching screen images on the display portion 2012 can be performed by touching the display portion 2012 with a finger or the like. The information terminal 2010 can be operated by inputting sound from the microphone 2016. Moreover, a variety of operations such as power on/off operation and screen switching of the display portion 2012 can be performed by pressing the operation button 2013.

Figure 21B:
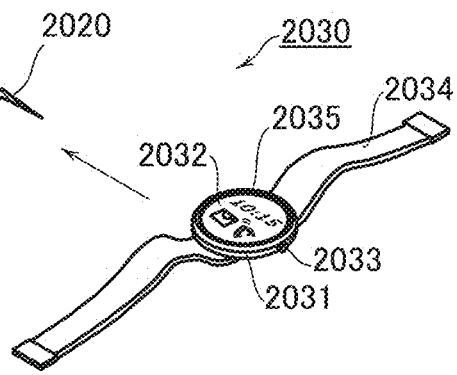

FIG. 21B illustrates an example of a watch-type information terminal. An information terminal 2030 includes a housing 2031, a display portion 2032, a winding crown 2033, a belt 2034, and a sensing unit 2035. The information terminal 2030 can be operated by rotating the winding crown 2033. The information terminal 2030 can be operated by touching the display portion 2032 with a finger.

The sensing unit 2035 has a function of obtaining information on usage environment and biological information. The sensing unit 2035 may be provided with a microphone, an imaging element, an acceleration sensor, a direction sensor, a pressure sensor, a temperature sensor, a humidity sensor, an illumination sensor, a positioning sensor (e.g., a global positioning system (GPS)), or the like.

Wireless communication devices with the same standard may be incorporated into the information terminal 2010 and the information terminal 2030 so that interactive communication is possible through a wireless signal 2020. When the information terminal 2010 receives an incoming e-mail or call, for example, information notifying the incoming e-mail or call can be displayed on the display portion 2032 of the information terminal 2030.

Figure 21C:
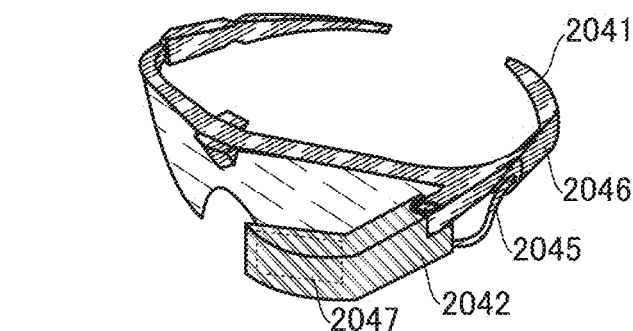

FIG. 21C illustrates an example of a glasses-type information terminal. An information terminal 2040 includes a mounting portion 2041, a housing 2042, a cable 2045, a battery 2046, and a display portion 2047. The battery 2046 is stored in the mounting portion 2041. The display portion 2047 is provided in the housing 2042. The housing 2042 includes a processor, a wireless communication device, a storage device, and a variety of electronic components. Power is supplied from the battery 2046 to the display portion 2047 and the electronic components in the housing 2042 through the cable 2045. A variety of information such as an image or the like transmitted wirelessly is displayed on the display portion 2047.

The housing 2042 may be provided with a camera. The information terminal 2040 can be operated by sensing movement of a user's eyeball or eyelid with the camera.

The mounting portion 2041 may be provided with a variety of sensors such as a temperature sensor, a pressure sensor, an acceleration sensor, and a biological sensor. For example, the biological sensor obtains biological information about the user and then stores the biological information in the storage device of the housing 2042. Interactive communication between the information terminal 2010 and the information terminal 2040 is possible through a wireless signal 2021, for example. The information terminal 2040 transmits the stored biological information to the information terminal 2010. The information terminal 2010 calculates the degree of fatigue, the amount of activity, and the like of the user from the received biological information.

Figure 22A:
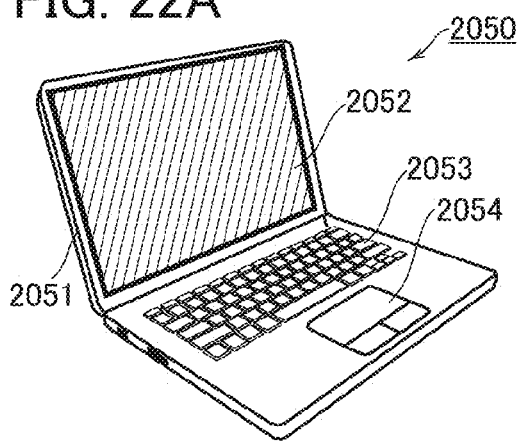
FIGS. 22A to 22E illustrate structure examples of electronic devices.

A notebook personal computer (PC) 2050 in FIG. 22A includes a housing 2051, a display portion 2052, a keyboard 2053, and a pointing device 2054. The notebook PC 2050 can be operated by touch operation on the display portion 2052.

Figure 22B:
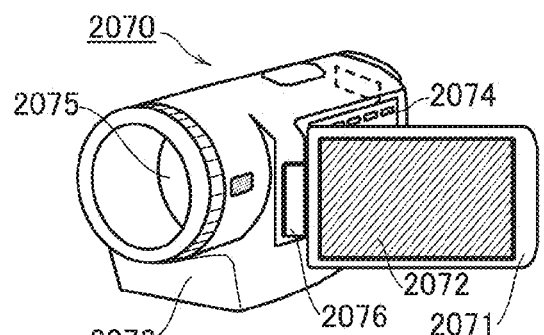

A video camera 2070 in FIG. 22B includes a housing 2071, a display portion 2072, a housing 2073, an operation key 2074, a lens 2075, and a joint 2076. The display portion 2072 is provided in the housing 2071. The operation key 2074 and the lens 2075 are provided in the housing 2073. The housing 2071 and the housing 2073 are connected to each other with the joint 2076, and the angle between the housing 2071 and the housing 2073 can be changed with the joint 2076. Images on the display portion 2072 may be switched depending on the angle between the housing 2071 and the housing 2073 at the joint 2076. A variety of operations such as start and stop of recording, zoom adjustment, and change of shooting range can be executed by touch operation on the display portion 2072.

Figure 22C:
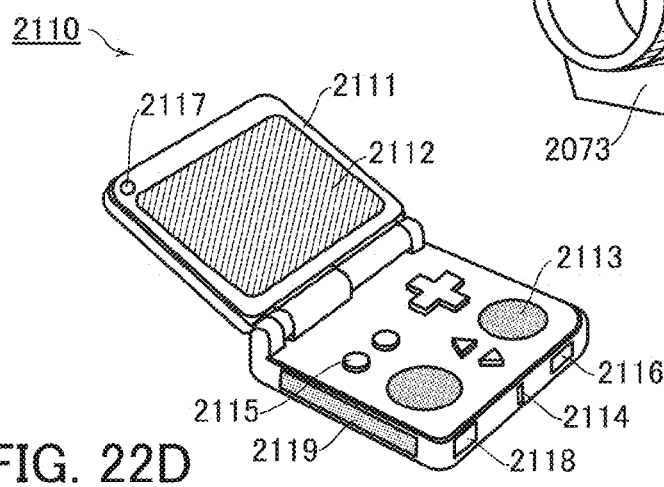

A portable game console 2110 in FIG. 22C includes a housing 2111, a display portion 2112, speakers 2113, an LED lamp 2114, operation key buttons 2115, a connection terminal 2116, a camera 2117, a microphone 2118, and a recording medium read portion 2119.

Figure 22D:
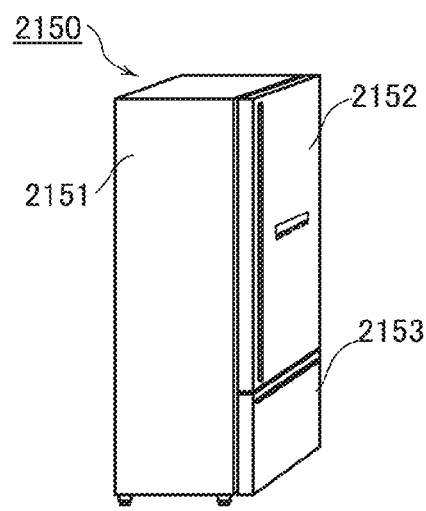

An electric refrigerator-freezer 2150 in FIG. 22D includes a housing 2151, a refrigerator door 2152, a freezer door 2153, and the like.

Figure 22E:
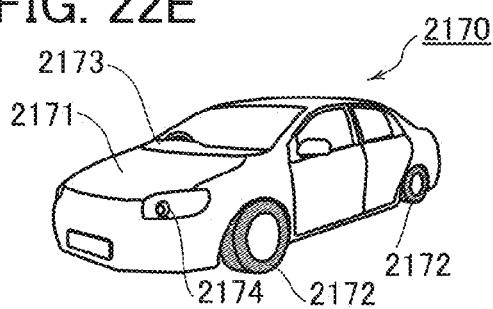

A motor vehicle 2170 in FIG. 22E includes a car body 2171, wheels 2172, a dashboard 2173, lights 2174, and the like. The processor described in Embodiment 2 is used as each of processors in the motor vehicle 2170.

Embodiment 5

In this embodiment, the semiconductor device of one embodiment of the present invention and a transistor included in the semiconductor device will be described.
<Transistor 100>

Figure 23A:
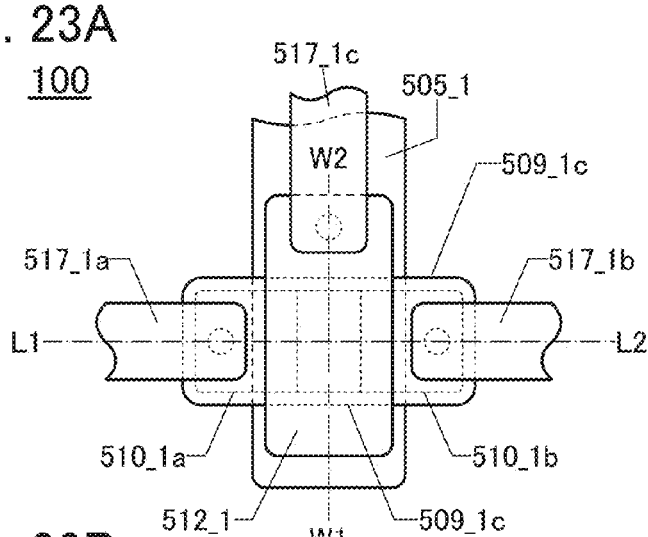
FIGS. 23A to 23D are a top view and cross-sectional views of a transistor.
Figure 23B:
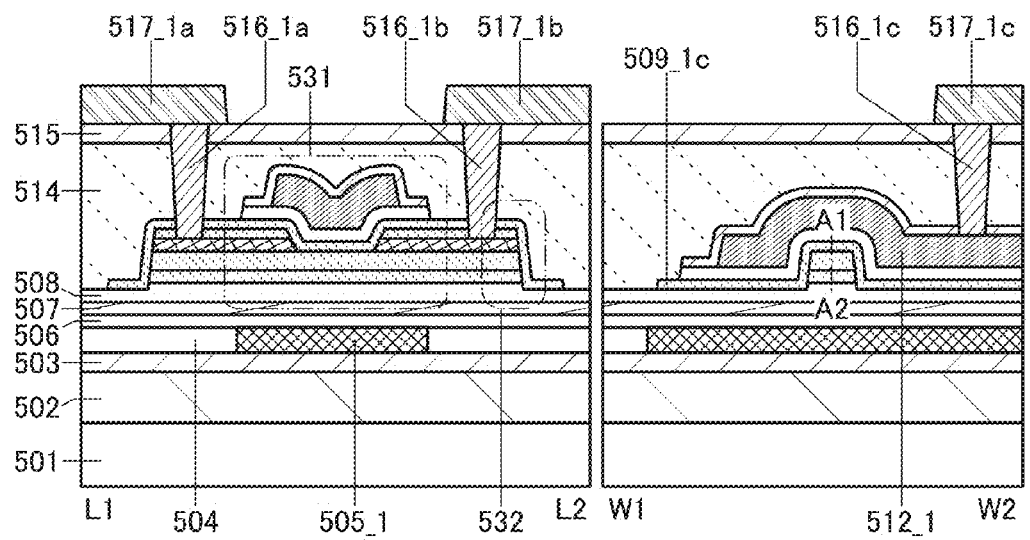
Figure 23C:
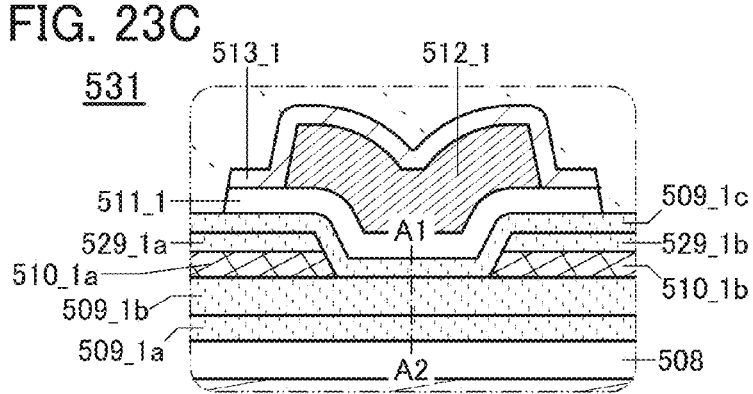

The transistor 100 includes an electrode 505_1, an insulating layer 506, an insulating layer 507, an insulating layer 508, a semiconductor layer 509_1a, a semiconductor layer 509_1b, a semiconductor layer 509_1c, an electrode 510_1a, an electrode 510_1b, a layer 529_1a, a layer 529_1b, an insulating layer 511_1, an electrode 512_1, and an insulating layer 513_1 (see FIGS. 23A to 23C).

The transistor 100 illustrated in FIGS. 23A to 23C is provided over a substrate 501 with an insulating layer 502 and an insulating layer 503 located therebetween. Specifically, an insulating layer 504 is provided over the insulating layer 503, and a portion of the insulating layer 504 is removed and the electrode 505_1 is embedded. The insulating layer 506 is provided over the electrode 505_1 and the insulating layer 504, the insulating layer 507 is provided over the insulating layer 506, and the insulating layer 508 is provided over the insulating layer 507. The insulating layer 508 has a projection, the semiconductor layer 509_1a is provided over the projection, and the semiconductor layer 509_1b is provided over the semiconductor layer 509_1a.

The semiconductor layer 509_1b includes a first region, a second region, and a third region. In the plan view, the third region is located between the first region and the second region.

The transistor 100 includes the electrode 510_1a over the first region of the semiconductor layer 509_1b and the electrode 510_1b over the second region of the semiconductor layer 509_1b. One of the electrode 510_1a and the electrode 510_1b can function as one of a source electrode and a drain electrode, and the other can function as the other of the source electrode and the drain electrode. Thus, one of the first region and the second region of the semiconductor layer 509_1b can function as the source region and the other can function as the drain region. Furthermore, the third region of the semiconductor layer 509_1b can function as a channel formation region.

The transistor 100 further includes the layer 529_1a over the electrode 510_1a and the layer 529_1b over the electrode 510_1b. The semiconductor layer 509_1c covering the layer 529_1a, the layer 529_1b, the electrode 510_1a, the electrode 510_1b, the semiconductor layer 509_1b, and the semiconductor layer 509_1a is provided. The semiconductor layer 509_1c includes a region in contact with a side surface of the electrode 510_1a, a region in contact with a side surface of the electrode 510_1b, a region in contact with the third region of the semiconductor layer 509_1b, a region in contact with a side surface of the semiconductor layer 509_1b, and a region in contact with a side surface of the semiconductor layer 509_1a.

The insulating layer 511_1 is provided over the semiconductor layer 509_1c, and the electrode 512_1 is provided over the insulating layer 511_1. The insulating layer 511_1 and the electrode 512_1 include a region overlapping with the third region.

The transistor 100 further includes the insulating layer 513_1 over the electrode 512_1. The insulating layers 511_1 and 513_1 extend beyond an end portion of the electrode 512_1 and have a region where the insulating layers 511_1 and 513_1 are in contact with each other in the extended portion.

In this embodiment, an insulating layer 514 is provided over the semiconductor layer 509_1c and the insulating layer 513_1, and an insulating layer 515 is provided over the insulating layer 514.

An electrode 516_1a is provided in an opening which overlaps with the electrode 510_1a and which is provided in the insulating layer 515, the insulating layer 514, the semiconductor layer 509_1c, and the layer 529_1a. An electrode 516_1b is provided in an opening which overlaps with the electrode 510_1*b* and which is provided in the insulating layer 515, the insulating layer 514, and the insulating layer 513_1.

In this embodiment, an electrode 517_1*a*, an electrode 517_1*b*, and an electrode 517_1*c* are provided over the insulating layer 515. The electrode 517_1*a* is electrically connected to the electrode 510_1*a* through the electrode 516_1*a*. The electrode 517_1*b* is electrically connected to the electrode 510_1*b* through the electrode 516_1*b*. The electrode 517_1*c* is electrically connected to the electrode 512_1 through the electrode 516_1*c*.

As illustrated in FIG. 23B, in the transistor 100, the semiconductor layer 509_1*b* is located between the electrode 505_1 and the electrode 512_1 in the channel width direction. As described above, the insulating layer 508 has the projection. The semiconductor layer 509_1*a* and the semiconductor layer 509_1*b* are provided over the projection. By providing the projection, a bottom surface of the electrode 512_1 in a region not overlapping with the projection (a region not overlapping with the semiconductor layer 509_1*b*) can be closer to the substrate than a bottom surface of the semiconductor layer 509_1*b* is. The height of the projection is preferably larger than or equal to the thickness of the insulating layer 511_1. Alternatively, the height of the projection is preferably greater than or equal to the sum of the thickness of the insulating layer 511_1 and the thickness of the semiconductor layer 509_1*c*. Thus, the side surface of the semiconductor layer 509_1*b* can be covered with the electrode 512_1.

In other words, the transistor 100 can have a structure in which the semiconductor layer 509_1*b* can be electrically surrounded by an electric field between the electrode 505_1 and the electrode 512_1. Such a structure of a transistor in which a semiconductor layer where a channel is formed is electrically surrounded by an electric field between conductive layers (the electrodes 505_1 and 512_1 in the transistor 100) is called a surrounded channel (s-ch) structure. In the transistor 100 having an s-ch structure, a channel can be formed in the whole (bulk) of the semiconductor layer 509_1*b*. In the s-ch structure, the drain current of the transistor can be increased, so that a larger amount of on-state current (current which flows between the source and the drain when the transistor is on) can be obtained. Furthermore, the entire channel formation region of the semiconductor layer 509_1*b* can be depleted by the electric field between the electrode 505_1 and the electrode 512_1. Accordingly, the off-state current of the s-ch transistor can be further reduced. When the channel width is shortened, the effects of the s-ch structure, such as an increase in on-state current and a reduction in off-state current, can be enhanced.

One of the electrodes 505_1 and 512_1 can function as a gate electrode and the other can function as a back gate electrode. In general, a gate electrode and a back gate electrode are formed using a conductive layer and positioned so that the channel formation region of the semiconductor layer is located between the gate electrode and the back gate electrode. Thus, the back gate electrode can function in a manner similar to that of the gate electrode. The potential of the back gate electrode may be the same as that of the gate electrode or may be a ground potential or a predetermined potential. By changing the potential of the back gate electrode independently of the potential of the gate electrode, the threshold voltage of the transistor can be changed.

The electrode 505_1 and the electrode 512_1 can each function as a gate electrode. Thus, the insulating layers 506, 507, 508, and 511_1 can each function as a gate insulating layer.

In the case where one of the electrode 505_1 and the electrode 512_1 is referred to as a "gate electrode" or a "gate," the other can be referred to as a "back gate electrode" or a "back gate." For example, in the transistor 100, in the case where the electrode 505_1 is referred to as a "gate electrode," the electrode 512_1 is referred to as a "back gate electrode." In the case where the electrode 512_1 is used as a "gate electrode," the transistor 100 can be regarded as a kind of top-gate transistor.

The transistor including the back gate electrode has a smaller change in threshold voltage by a positive GBT stress test in which positive charges are applied to a gate than a transistor including no back gate electrode.

<Transistor 200>

The transistor 100 and the transistor 200 are preferably n-channel transistors. The threshold value of the transistor 200 is preferably larger than that of the transistor 100.

The transistor 200 is a kind of top-gate transistor. The transistor 200 includes an electrode 505_2, the insulating layer 506, the insulating layer 507, the insulating layer 508, a semiconductor layer 509_2*a*1, a semiconductor layer 509_2*a*2, a semiconductor layer 509_2*b*1, a semiconductor layer 509_2*b*2, a semiconductor layer 509_2*c*, an electrode 510_2*a*, an electrode 510_2*b*, a layer 529_2*a*, a layer 529_2*b*, an insulating layer 511_2, an electrode 512_2, and an insulating layer 513_2 (see FIGS. 24A to 24C).

Figure 24A:
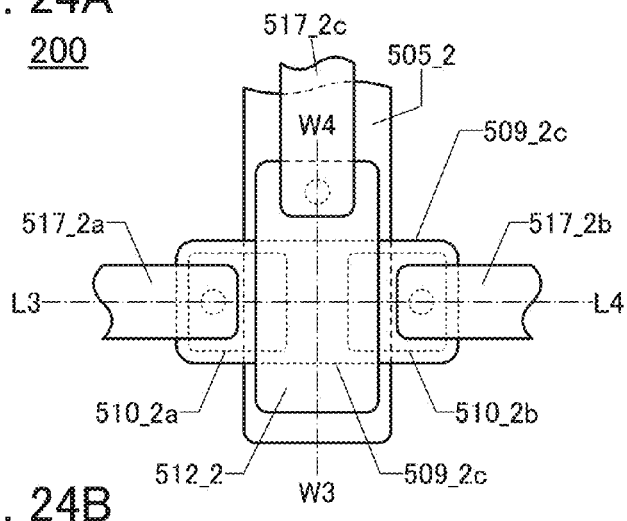
FIGS. 24A to 24C are a top view and cross-sectional views of a transistor.
Figure 24B:
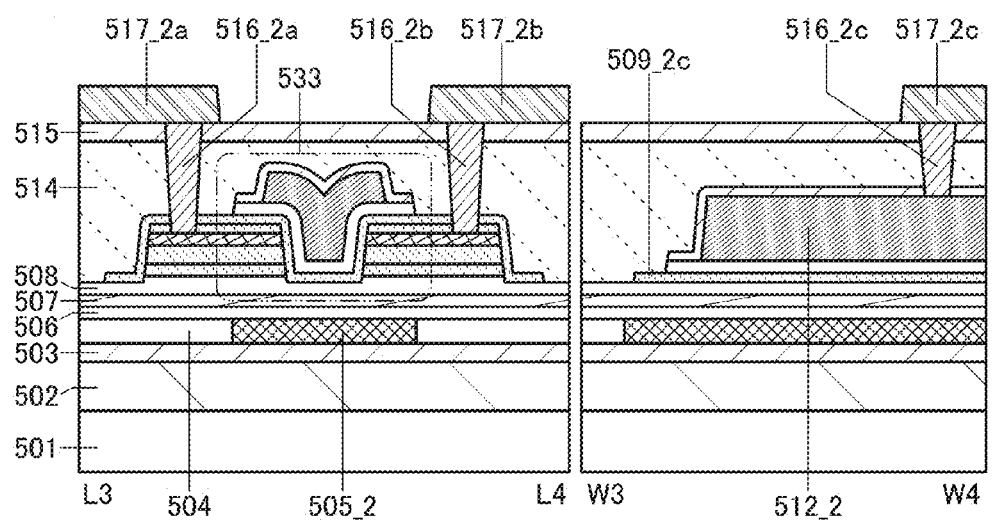
Figure 24C:
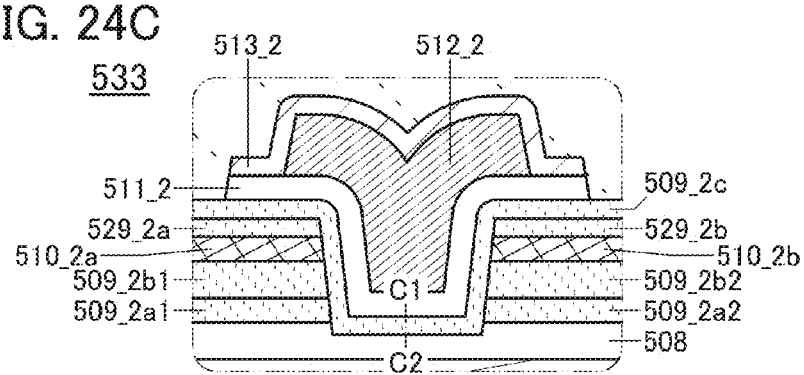

The transistor 200 illustrated in FIGS. 24A to 24C is provided over the substrate 501 with the insulating layer 502 and the insulating layer 503 located therebetween. Specifically, the insulating layer 504 is provided over the insulating layer 503, and a portion of the insulating layer 504 is removed and the electrode 505_2 is embedded. The insulating layer 506 is provided over the electrode 505_2 and the insulating layer 504, the insulating layer 507 is provided over the insulating layer 506, and the insulating layer 508 is provided over the insulating layer 507.

The insulating layer 508 includes a first projection and a second projection. The transistor 200 includes the semiconductor layer 509_2*a*1 over the first projection and the semiconductor layer 509_2*b*1 over the semiconductor layer 509_2*a*1. The transistor 200 includes the electrode 510_2*a* over the semiconductor layer 509_2*b*1 and the layer 529_2*a* over the electrode 510_2*a*. The transistor 200 includes the semiconductor layer 509_2*a*2 over the second projection and the semiconductor layer 509_2*b*2 over the semiconductor layer 509_2*a*2. The transistor 200 includes the electrode 510_2*b* over the semiconductor layer 509_2*b*2 and the layer 529_2*b* over the electrode 510_2*b*. One of the electrode 510_2*a* and the electrode 510_2*b* can function as one of a source electrode and a drain electrode, and the other can function as the other of the source electrode and the drain electrode.

The semiconductor layer 509_2*c* covers the layer 529_2*a*, the layer 529_2*b*, the electrode 510_2*a*, the electrode 510_2*b*, the semiconductor layer 509_2*b*1, the semiconductor layer 509_2*b*2, the semiconductor layer 509_2*a*1, and the semiconductor layer 509_2*a*2. The semiconductor layer 509_2*c* includes a region in contact with a side surface of the electrode 510_2*a*, a region in contact with a side surface of the semiconductor layer 509_2*b*1, and a region in contact with a side surface of the semiconductor layer 509_2*a*1. The semiconductor layer 509_2*c* also includes a region in contact with a side surface of the electrode 510_2*b*, a region in contact with a side surface of the semiconductor layer 509_2*b*2, and a region in contact with a side surface of the semiconductor layer 509_2*a*2.

The semiconductor layer 509_2c includes a first region, a second region, and a third region. In the plan view, the third region is located between the first region and the second region.

The first region of the semiconductor layer 509_2c overlaps with the layer 529_2a, the electrode 510_2a, the semiconductor layer 509_2b1, and the semiconductor layer 509_2a1. The second region of the semiconductor layer 509_2c overlaps with the layer 529_2b, the electrode 510_2b, the semiconductor layer 509_2b2, and the semiconductor layer 509_2a2. Furthermore, the third region of the semiconductor layer 509_2c can function as a channel formation region.

The transistor 200 includes the insulating layer 511_2 over the semiconductor layer 509_2c and the electrode 512_2 over the insulating layer 511_2. The insulating layer 511_2 and the electrode 512_2 include a region overlapping with the third region of the semiconductor layer 509_2c.

The transistor 200 further includes the insulating layer 513_2 over the electrode 512_2. The insulating layers 511_2 and 513_2 extend beyond an end portion of the electrode 512_2 and have a region where the insulating layers 511_2 and 513_2 are in contact with each other in the extended portion.

In this embodiment, the insulating layer 514 is provided over the semiconductor layer 509_2c and the insulating layer 513_2, and the insulating layer 515 is provided over the insulating layer 514.

An electrode 516_2a is provided in an opening which overlaps with the electrode 510_2a and which is provided in the insulating layer 515, the insulating layer 514, the semiconductor layer 509_2c, and the layer 529_2a. An electrode 516_2b is provided in an opening which overlaps with the electrode 510_2b and which is provided in the insulating layer 515, the insulating layer 514, the semiconductor layer 509_2c, and the layer 529_2b. An electrode 516_2c is provided in an opening which overlaps with the electrode 512_2 and which is provided in the insulating layer 515, the insulating layer 514, and the insulating layer 513_2.

In this embodiment, an electrode 517_2a, an electrode 517_2b, and an electrode 517_2c are provided over the insulating layer 515. The electrode 517_2a4 is electrically connected to the electrode 510_2a through the electrode 516_2a. The electrode 517_2b is electrically connected to the electrode 510_2b through the electrode 516_2b. The electrode 517_2c is electrically connected to the electrode 512_2 through the electrode 516_2c.

As in the transistor 100, one of the electrode 505_2 and the electrode 512_2 in the transistor 200 can function as a gate electrode, and the other can function as a back gate electrode. Thus, the insulating layers 506, 507, 508, and 511_2 can each function as a gate insulating layer.

In the case where one of the electrode 505_2 and the electrode 512_2 is simply referred to as a "gate electrode" or a "gate," the other can be referred to as a "back gate electrode" or a "back gate." For example, in the transistor 200, in the case where the electrode 505_2 is referred to as a "gate electrode," the electrode 512_2 is referred to as a "back gate electrode." In the case where the electrode 512_2 is used as a "gate electrode," the transistor 200 can be regarded as a kind of top-gate transistor.

In the transistor 100, a channel is formed in the semiconductor layer 509b. In the transistor 200, a channel is formed in a semiconductor layer 509c. The semiconductor layer 509b and the semiconductor layer 509c are preferably formed using semiconductor materials having different physical properties. When the semiconductor layer 509b and the semiconductor layer 509c are formed using semiconductor materials having different physical properties, the transistor 100 and the transistor 200 can have different electrical characteristics. When semiconductors having different energy band gaps are used for the semiconductor layers 509b and 509c, for example, the transistors 100 and 200 can have different field-effect mobilities.

When a semiconductor having lower electron affinity than that of the semiconductor layer 509b is used for the semiconductor layer 509c, for example, the transistor 200 can have higher $V_{th}$ than the transistor 100. Specifically, when the semiconductor layer 509b is an In—M—Zn oxide (an oxide containing In, an element M, and Zn) at an atomic ratio of $X_2:Y_2:Z_2$ and the semiconductor layer 509c is an In—M—Zn oxide at an atomic ratio of $X_1:Y_1:Z_1$, $Y_1/X_1$ needs to be larger than $Y_2/X_2$. With such In—M—Zn oxides, the transistor 200 can have larger $V_{th}$ than the transistor 100.

Although the transistor 200 in FIGS. 24A to 24C includes the electrode 512_2 functioning as a first gate and the electrode 505_2 functioning as a second gate, the transistor 200 may include only the electrode 512_2 or the electrode 505_2 (e.g., the electrode 505_2). In the case where a gate insulating film on the second gate side is thicker than an insulating film on the first gate side, the withstand voltage of the insulating film on the second gate side is higher in some cases. When the transistors FE1 and FE2 included in the voltage holding portion 43 described in Embodiment 2 and the like need to withstand a high gate voltage, a high voltage is applied only to the electrode 505_2, or only the electrode 505_2 is provided without providing the electrode 512_2, whereby the reliability of the transistors can be increased.

<Structure Example of Semiconductor Device>

Next, a structure example of the semiconductor device of one embodiment of the present invention is described below. FIG. 25 is a cross-sectional view illustrating part of the cross-sectional structure of the semiconductor device 300 in which the memory cell 209 is included in the cell array 44, the transistor 100 is used as the transistor MW1 included in the memory cell 209, and the transistor 200 is used as each of the transistors FE1 and FE2 in the voltage holding portion 43. The transistor FE1, the transistor FE2, and the transistor MW1 are preferably n-channel OS transistors. The threshold value of the transistor FE2 and that of the transistor FE1 are preferably larger than the threshold value of the transistor MW1. When the transistor FE1 and the transistor FE2 have large threshold values, cutoff currents can be extremely low, which leads to improved (favorable) holding characteristics of the voltage holding portion 43. The transistor MW1 can have an extremely low cutoff current when a negative potential is supplied to its back gate from the voltage holding portion 43.

In FIG. 25, the semiconductor device 300 includes the transistor FE1, the transistor FE2, and the transistor MW1 over the substrate 501 with the insulating layers 502 and 503 provided therebetween. The insulating layer 515 and an insulating layer 439 are provided over the transistor FE1, the transistor FE2, and the transistor MW1. In addition, electrodes such as an electrode 441 and an electrode 427 are provided over the insulating layer 439. Furthermore, an insulating layer 442 that covers the electrodes such as the electrode 441 and the electrode 427 is provided, and electrodes such as an electrode 443 that covers the electrode 441 are provided over the insulating layer 442.

A region where the electrode 441, the insulating layer 442, and the electrode 443 overlap with each other functions as the capacitor CA1. Since the electrode 443 covers the electrode 441, not only the top surface but also side surfaces of the electrode 441 can function as the capacitor. Similarly, since the insulating layer 442 is provided between electrodes, the capacitor CA2 and the capacitor CS1 are formed.

An insulating layer 437 is provided over the electrode 443 and the insulating layer 442, an electrode 429 is provided over the insulating layer 437, and an insulating layer 438 is provided over the electrode 429. The electrode 429 is electrically connected to the electrode 427 through an electrode 428 provided in a portion of the insulating layer 437.

The transistor 100 and the transistor 200 included in the semiconductor device 300 described in this embodiment can be used as the transistors described in the above embodiments.

For example, the structures of the transistor MW1 and the capacitor CS1 illustrated in FIG. 25 can be applied to the transistor MW2 and the capacitor CS2 included in the memory cell 227, the transistor MW3 and the capacitor CS3 included in the memory cell 241, the transistor MW5 and the capacitor CS5 included in the memory cell 242, or the transistor MW6 and the capacitor CS6 included in the memory cell 243.

In FIG. 25, the electrode 441 included in the capacitor CA1 is connected to one of the source and the drain of the transistor FE1 and the gate of the transistor FE1 through other electrodes. Furthermore, one electrode of the capacitor CA2 is connected to one of the source and the drain of the transistor FE2, the gate of the transistor FE2, and the back gate of the transistor MW1 through other electrodes.

Figure 26:
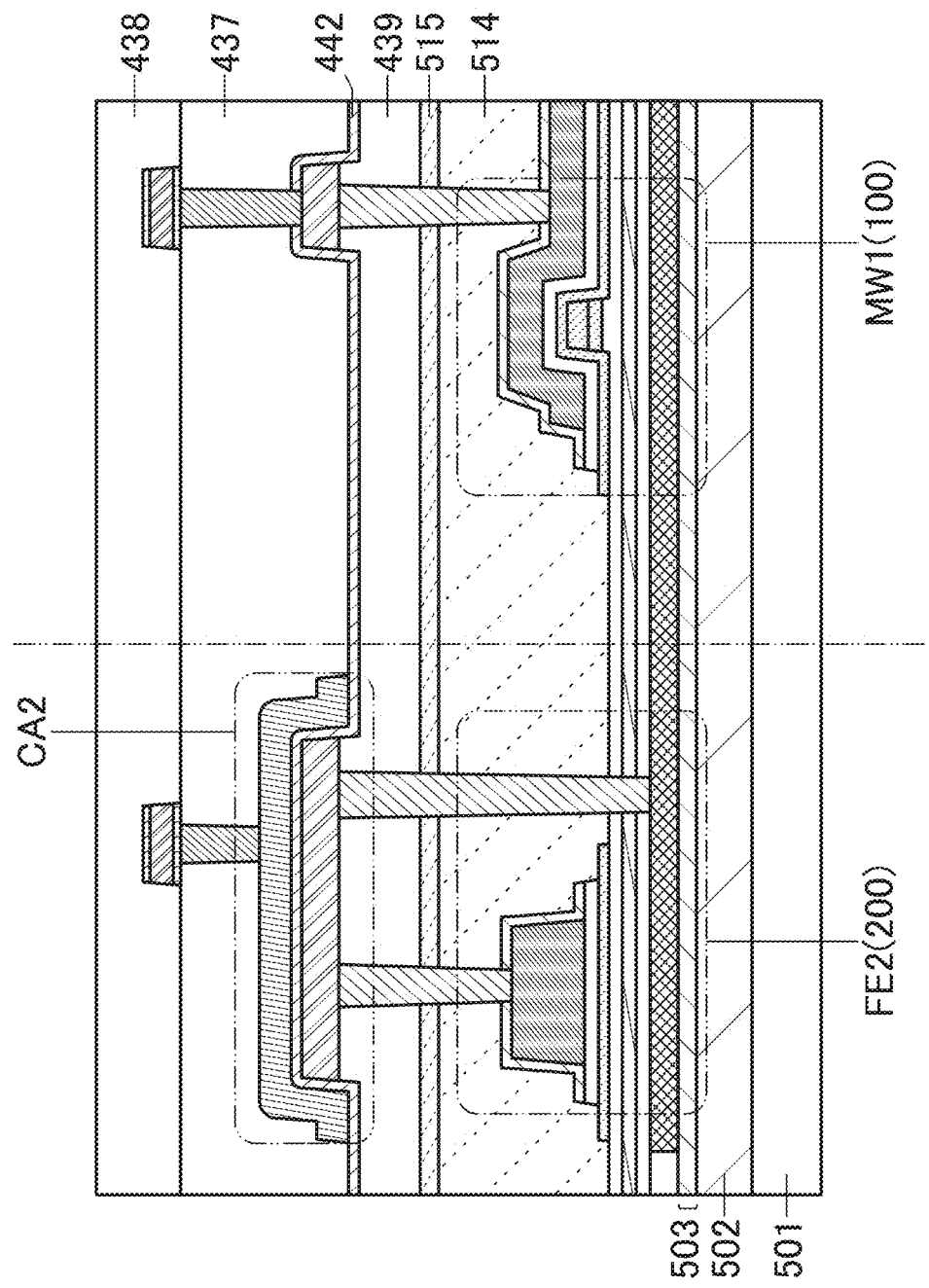
FIG. 26 is a cross-sectional view of a semiconductor device.

The back gate of the transistor FE2 may be extended in the channel width direction and electrically connected to the front gate of the transistor FE2, as illustrated in FIG. 26. FIG. 26 illustrates a cross section of the transistor FE2 in the semiconductor device 300 in a direction corresponding to the direction W3-W4 in FIGS. 24A to 24C.

Figure 27:
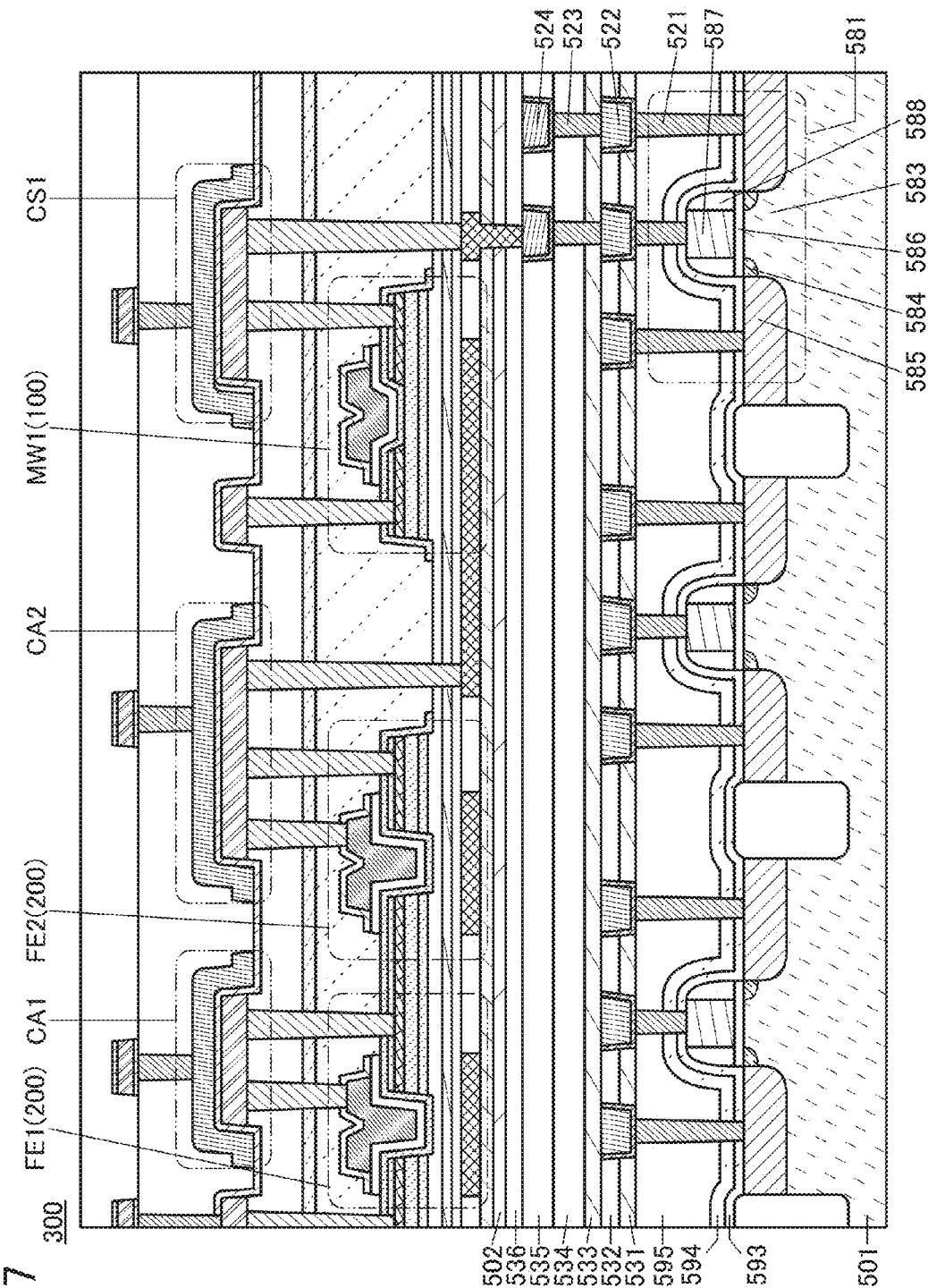
FIG. 27 is a cross-sectional view of a semiconductor device.

FIG. 27 illustrates an example of the cross-sectional structure of the semiconductor device 300. In FIG. 27, an insulating layer is provided over Si transistors such as a transistor 581, and OS transistors such as the transistor FE1, the transistor FE2, and the transistor MW1 are provided over the insulating layer.

The transistor 581 can be used as, for example, a transistor included in the cell array 223 (e.g., the transistor MR2), and a Si transistor in a circuit included in the semiconductor device 300.

The transistor 100 can be used as an OS transistor included in the comparator described in Embodiment 1.

In the semiconductor device 300, an n-type semiconductor is used for a substrate 501. The transistor 581 includes a channel formation region 583, high-concentration p-type impurity regions 585, an insulating layer 586, an electrode 587, and a sidewall 588. In regions overlapping with the sidewall 588 with the insulating layer 586 located therebetween, low-concentration p-type impurity regions 584 are provided. The insulating layer 586 can function as a gate insulating layer. The electrode 587 can function as a gate electrode. The channel formation region 583 of the transistor 581 is formed in part of the substrate 501.

The low-concentration p-type impurity regions 584 can be formed in such a manner that an impurity element is added with the use of the electrode 587 as a mask after the formation of the electrode 587 and before the formation of the sidewall 588. The low-concentration p-type impurity regions 584 are not necessarily provided depending on circumstances.

The transistor 581 is electrically isolated from other transistors by an element isolation layer. The element isolation layer can be formed by a local oxidation of silicon (LOCOS) method, a shallow trench isolation (STI) method, or the like.

The transistor 581 can function as a p-channel transistor. An insulating layer 593 is formed over the transistor 581, and an insulating layer 594 is formed over the insulating layer 593. Note that the insulating layer 593 and the insulating layer 594 are preferably formed using an insulating material that has a function of preventing diffusion of impurities such as oxygen, hydrogen, water, alkali metal, and alkaline earth metal. Note that one of the insulating layers 593 and 594 may be omitted or another insulating layer may be stacked thereover.

Although an example of using a p-channel transistor is described here, an n-channel transistor can also be provided on the substrate 501.

The semiconductor device 300 includes an insulating layer 595 having a flat surface over the insulating layer 594.

An electrode 522 or the like is formed over the insulating layer 595. The electrode 522 or the like is electrically connected to one of the high-concentration p-type impurity regions 585 through a contact plug 521 or the like. An insulating layer 531, an insulating layer 532, an insulating layer 533, an insulating layer 534, an insulating layer 535, and an insulating layer 536 are provided over the insulating layer 595. Furthermore, in the semiconductor device 300, the electrode 522 and an electrode 524 are provided over the insulating layer 595. The electrode 522 is provided to be embedded in the insulating layers 531 and 532 and is electrically connected to the transistor 581 through the contact plug 521 provided in the insulating layer 593, the insulating layer 594, and the insulating layer 595. The electrode 524 is provided to be embedded in the insulating layer 535. The electrode 524 is electrically connected to the electrode 522 through an electrode 523 provided in the insulating layers 533 and 534.

In the example illustrated in FIG. 27, the electrode 587 functioning as the gate electrode of the transistor 581 is connected to one electrode of the capacitor CS1 through plugs and electrodes.

<Modification Example>

Figure 28:
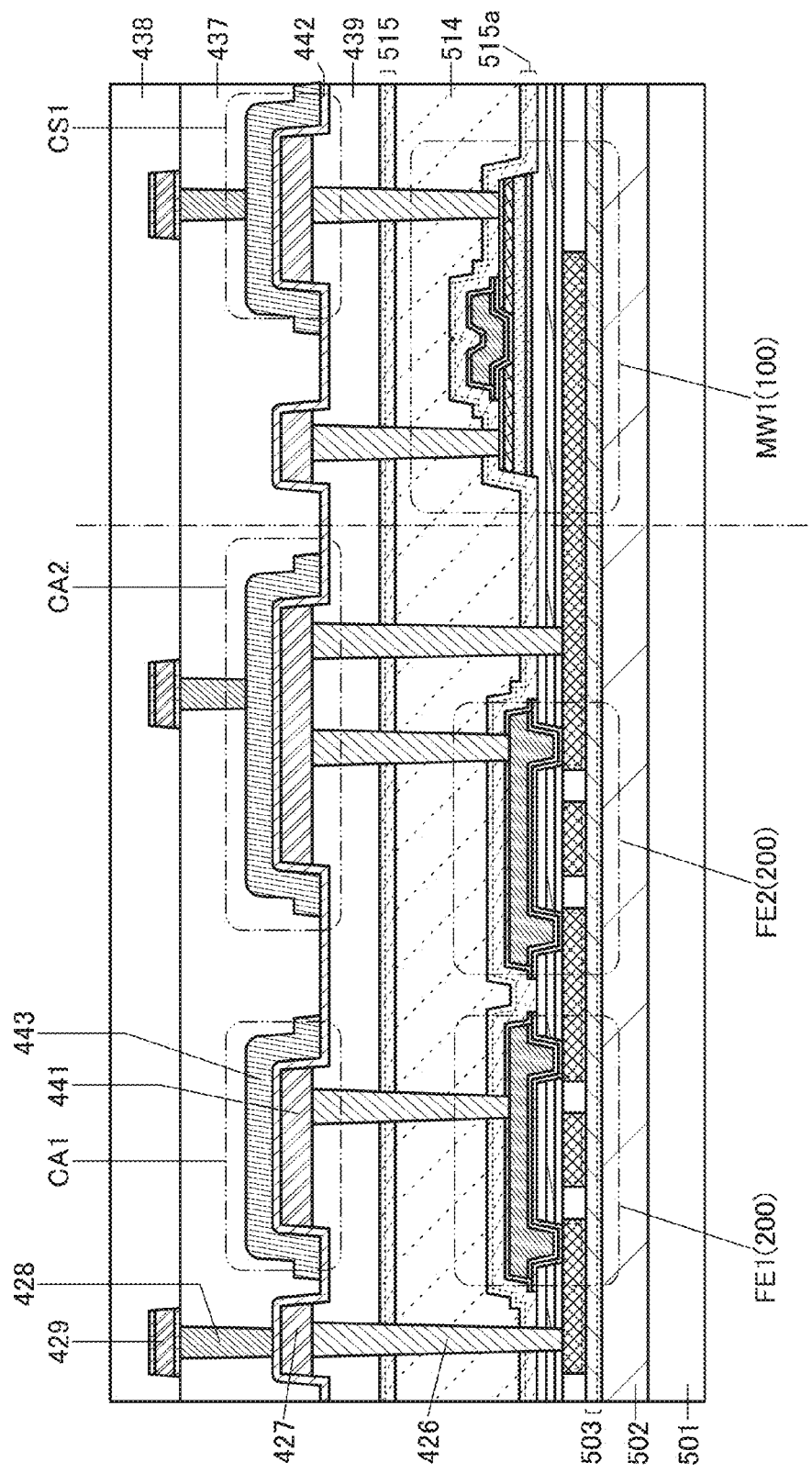
FIG. 28 is a cross-sectional view of a semiconductor device.
Figure 29C:
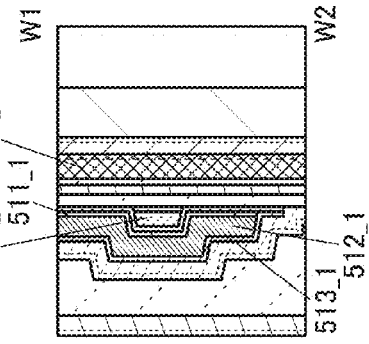
FIGS. 29A to 29D are a top view and cross-sectional views of transistors.
Figure 29D:
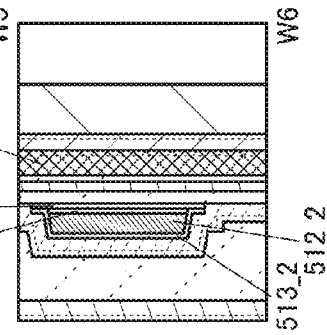
Figure 29A:
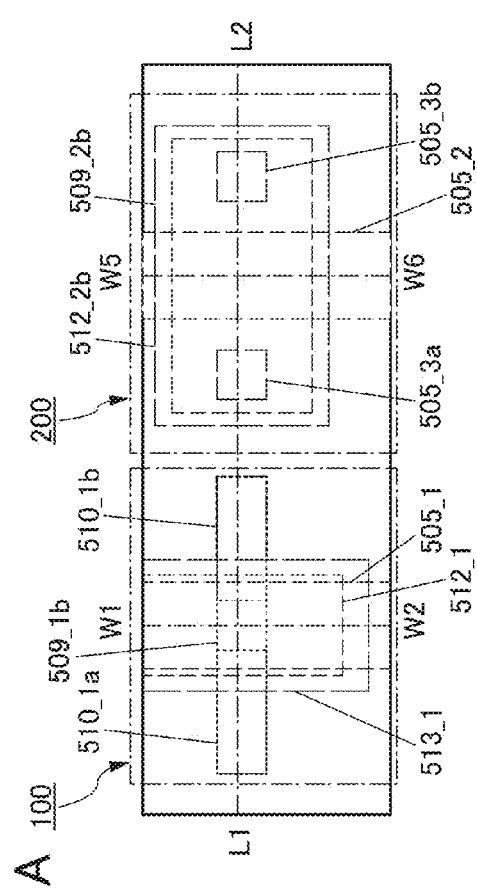
Figure 29B:
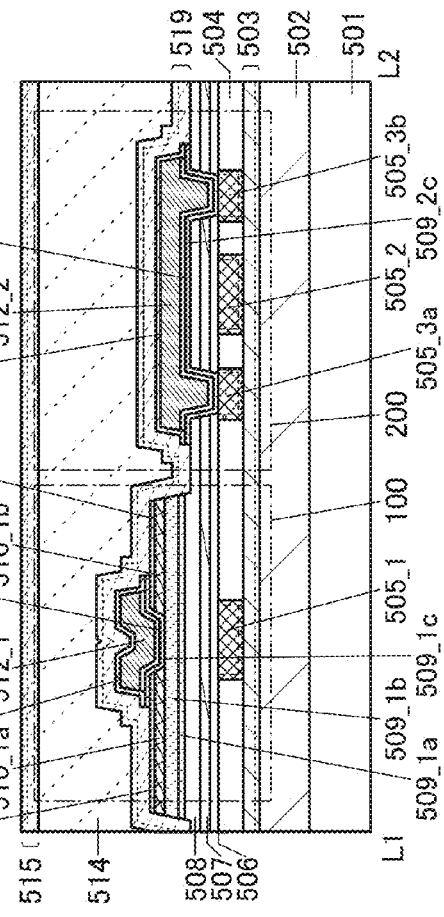

FIG. 28 illustrates an example of the cross-sectional structure of the semiconductor device 300 including the transistor 100 and the transistor 200 having structures different from those in FIG. 25. FIGS. 29A to 29D illustrate the details of the transistor 100 and the transistor 200 illustrated in FIG. 28.

The transistor 200 illustrated in FIGS. 29A to 29D includes the electrode 512_2 functioning as the first gate and the electrode 505_2 functioning as the second gate. An electrode 505_3a and an electrode 505_3b formed in the same layer as the electrode 505_2 function as the source and the drain of the transistor 200. The bottom surface of the semiconductor layer 509_2c is in contact with the electrode 505_3a and the electrode 505_3b.

The electrode 512_1 and the electrode 512_2 are covered with the insulating layer 513_1 and the insulating layer 513_2, respectively, and the insulating layer 513_1, the insulating layer 513_2, the layer 529_1a, and the layer 529_1b are covered with an insulating layer 519. For the insulating layer 519, the description of the insulating layer 515 can be referred to, for example.

Note that each of the insulating layers 503, 519, and 515 can be a stacked film of two or more different materials. Alternatively, each of the insulating layers 503, 519, and 515 may be formed using different deposition methods. For example, aluminum oxide formed by a sputtering method and aluminum oxide formed by an ALD method may be stacked.

In FIG. 28, an electrode functioning as one of the source and the drain of the transistor FE2 is connected to the gate of the transistor FE2 and one electrode of the capacitor CA2 through contact plugs. The electrode functioning as one of the source and the drain of the transistor FE2 also functions as the second gate of the transistor MW1.

<Materials>

Hereinafter, materials for the semiconductor device of one embodiment of the present invention will be described.

(Semiconductor Layer)

For the semiconductor layer 509, a single-crystal semiconductor, a polycrystalline semiconductor, a microcrystalline semiconductor, an amorphous semiconductor, or the like can be used alone or in combination. As a semiconductor material, silicon, germanium, or the like can be used. Alternatively, a compound semiconductor such as silicon germanium, silicon carbide, gallium arsenide, an oxide semiconductor, or a nitride semiconductor, an organic semiconductor, or the like may be used.

A semiconductor layer 509a, the semiconductor layer 509b, and the semiconductor layer 509c may be formed using semiconductors having different crystal states or different semiconductor materials. Hereinafter, the description of the semiconductor layer 509a can also be used for the semiconductor layers 509_1a, 509_2a1, and 509_2a2, the description of the semiconductor layer 509b can also be used for the semiconductor layers 509_1b, 509_2b1, and 509_2b2, and the description of the semiconductor layer 509c can also be used for the semiconductor layers 509_1c and 509_2c.

The energy band gap of an oxide semiconductor is greater than or equal to 2 eV; thus, when the oxide semiconductor is used for the semiconductor layer 509, a transistor with an extremely low off-state current can be provided. Specifically, the off-state current per micrometer in channel width at room temperature (typically 25° C.) and at a source-drain voltage of 3.5 V can be lower than $1 \times 10^{-20}$ A, lower than $1 \times 10^{-22}$ A, or lower than $1 \times 10^{-24}$ A. That is, the on/off ratio of the transistor can be greater than or equal to 20 digits and less than or equal to 150 digits. A transistor using an oxide semiconductor in the semiconductor layer 509 has high withstand voltage between its source and drain. Thus, a transistor with high reliability can be provided. Furthermore, a transistor with high output voltage and high withstand voltage can be provided. Furthermore, a semiconductor device or the like with high reliability can be provided. Furthermore, a semiconductor device with high output voltage and high withstand voltage can be provided.

In this embodiment, the case where an oxide semiconductor is used for the semiconductor layer 509 will be described.

(Oxide Semiconductor)

An oxide semiconductor according to the present invention will be described below. An oxide semiconductor preferably contains at least indium or zinc. In particular, indium and zinc are preferably contained. In addition to these, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

<Structure>

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in many cases. A pentagonal lattice arrangement, a heptagonal lattice arrangement, or the like is included in the distortion in some cases. Note that a clear crystal grain boundary cannot be observed even in the vicinity of distortion in the CAAC-OS. That is, a lattice arrangement is distorted so that formation of a crystal grain boundary is inhibited. This is probably because the CAAC-OS can tolerate distortion owing to a low density of arrangement of oxygen atoms in an a-b plane direction, a change in interatomic bond distance by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention. Furthermore, a CAC-OS may be included.

<Atomic Ratio>

First, preferred ranges of the atomic ratio of indium, the element M, and zinc contained in an oxide semiconductor according to the present invention are described with reference to FIGS. 30A to 30C. Note that the proportion of oxygen atoms is not shown in FIGS. 30A to 30C. The terms of the atomic ratio of indium, the element M, and zinc contained in the oxide semiconductor are denoted by [In], [M], and [Zn], respectively.

Figure 30A:
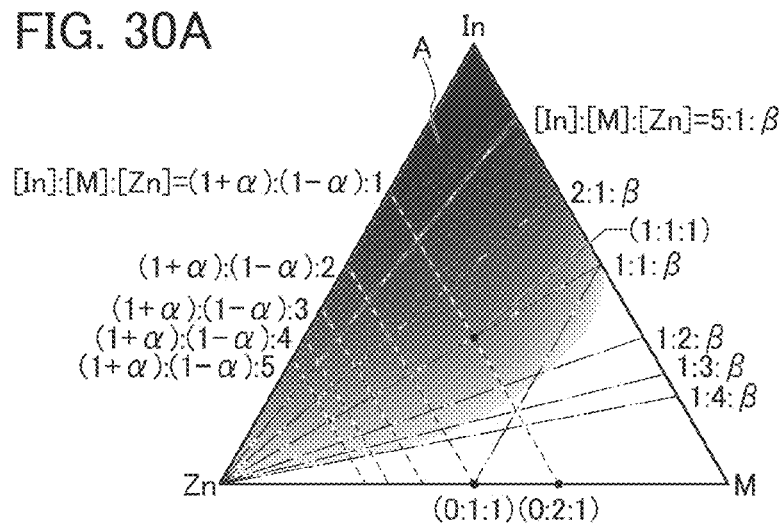
FIGS. 30A to 30C each illustrate an atomic ratio of an oxide of one embodiment of the present invention.
Figure 30B:
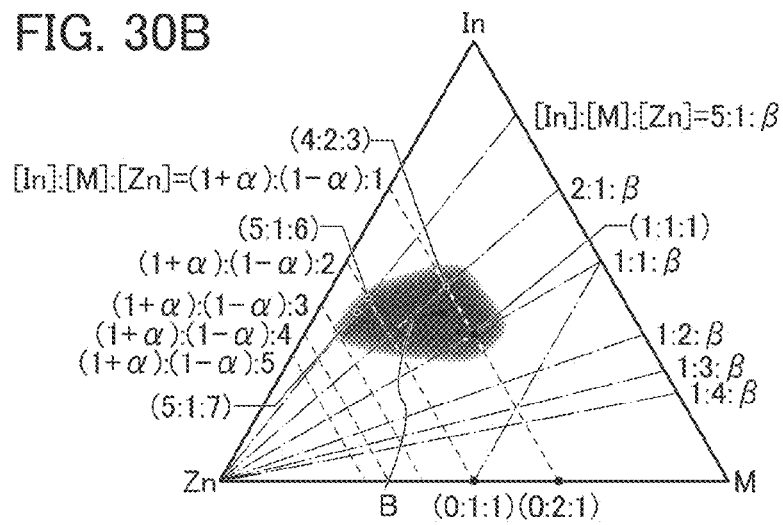
Figure 30C:
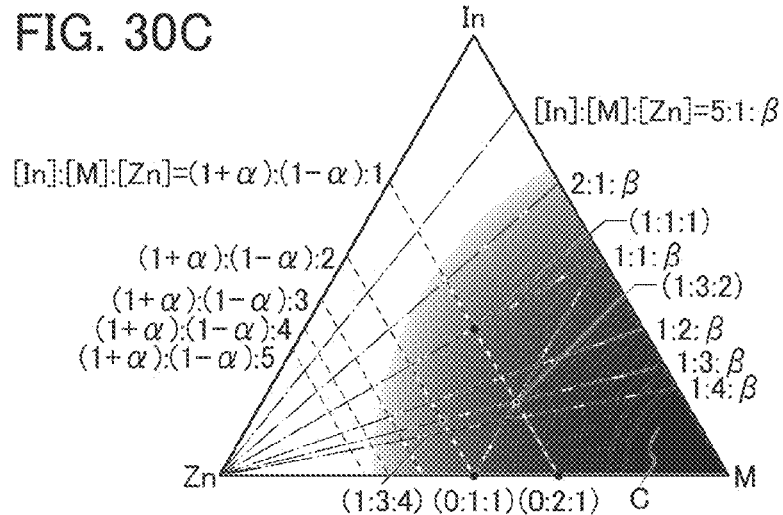

In FIGS. 30A to 30C, broken lines indicate a line where the atomic ratio [In]:[M]:[Zn] is $(1+\alpha):(1-\alpha):1$ (where $-1 \leq \alpha \leq 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$ (where $\beta \geq 0$), a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

Furthermore, an oxide semiconductor with the atomic ratio of [In]:[M]:[Zn]=0:2:1 or a neighborhood thereof in FIGS. 30A to 30C tends to have a spinel crystal structure.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

A region A in FIG. 30A represents examples of the preferred ranges of the atomic ratio of indium, the element M, and zinc contained in an oxide semiconductor.

In addition, the oxide semiconductor containing indium in a higher proportion can have high carrier mobility (electron mobility). Therefore, an oxide semiconductor having a high content of indium has higher carrier mobility than that of an oxide semiconductor having a low content of indium.

In contrast, when the indium content and the zinc content in an oxide semiconductor become lower, carrier mobility becomes lower. Thus, with an atomic ratio [In]:[M]:[Zn] of 0:1:0 and the vicinity thereof (e.g., a region C in FIG. 30C), insulation performance becomes better.

Accordingly, an oxide semiconductor of one embodiment of the present invention preferably has an atomic ratio represented by the region A in FIG. 30A. With the atomic ratio, a layered structure with high carrier mobility and a few grain boundaries is easily obtained.

An oxide semiconductor with an atomic ratio in the region A, particularly in a region B in FIG. 30B, is excellent because the oxide semiconductor easily becomes a CAAC-OS and has high carrier mobility.

The CAAC-OS is an oxide semiconductor with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

Note that the region B includes an atomic ratio [In]:[M]:[Zn] of 4:2:3 to 4:2:4.1 and the vicinity thereof. The vicinity includes an atomic ratio [In]:[M]:[Zn] of 5:3:4. Note that the region B includes an atomic ratio [In]:[M]:[Zn] of 5:1:6 and the vicinity thereof and an atomic ratio [In]:[M]:[Zn] of 5:1:7 and the vicinity thereof.

Note that the property of an oxide semiconductor is not uniquely determined by an atomic ratio. Even with the same atomic ratio, the property of an oxide semiconductor might be different depending on a formation condition. For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which an oxide semiconductor tends to have specific characteristics, and boundaries of the regions A to C are not clear.

[Transistor Including Oxide Semiconductor]

Next, the case where the oxide semiconductor is used for a transistor will be described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$ is used.

A highly purified intrinsic or substantially highly purified intrinsic oxide semiconductor has a low density of defect states and accordingly has a low density of trap states in some cases.

Charges trapped by the trap states in the oxide semiconductor take a long time to be released and may behave like fixed charges. Thus, a transistor whose channel region is formed in an oxide semiconductor having a high density of trap states has unstable electrical characteristics in some cases.

To obtain stable electrical characteristics of the transistor, it is effective to reduce the concentration of impurities in the oxide semiconductor. In addition, to reduce the concentration of impurities in the oxide semiconductor, the concentration of impurities in a film that is adjacent to the oxide semiconductor is preferably reduced. Examples of impurities include hydrogen, nitrogen, an alkali metal, an alkaline earth metal, iron, nickel, and silicon.

<Impurities>

Here, the influence of impurities in the oxide semiconductor will be described.

When silicon or carbon, which is one of Group 14 elements, is contained in the oxide semiconductor, defect states are formed. Thus, the concentration of silicon or carbon in the oxide semiconductor and around an interface with the oxide semiconductor (measured by secondary ion mass spectrometry, SIMS) is set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated, in some cases. Thus, a transistor including an oxide semiconductor that contains an alkali metal or an alkaline earth metal is likely to be normally-on. Therefore, it is preferable to reduce the concentration of an alkali metal or an alkaline earth metal in the oxide semiconductor. Specifically, the concentration of an alkali metal or an alkaline earth metal in the oxide semiconductor measured by SIMS is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurity concentration is used for a channel region in a transistor, the transistor can have stable electrical characteristics.

Next, the case where the oxide semiconductor is used for a transistor will be described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8\times10^{11}$/cm$^3$, preferably lower than $1\times10^{11}$/cm$^3$, further preferably lower than $1\times10^{10}$/cm$^3$, and higher than or equal to $1\times10^{-9}$/cm$^3$ is used.

The carrier density of the oxide semiconductor is preferably reduced in order to inhibit the negative shift of the threshold voltage of the OS transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8\times10^{15}$ cm$^{-3}$, preferably lower than $1\times10^{11}$ cm$^{-3}$, and further preferably lower than $1\times10^{10}$ cm$^{-3}$ and is higher than or equal to $1\times10^{-9}$ cm$^{-3}$.

A highly purified intrinsic or substantially highly purified intrinsic oxide semiconductor has few carrier generation sources and thus can have a low carrier density. The highly purified intrinsic or substantially highly purified intrinsic oxide semiconductor has a low density of defect states and accordingly has a low density of trap states in some cases.

To obtain stable electrical characteristics of the transistor, it is effective to reduce the concentration of impurities in the oxide semiconductor.

The concentration of silicon or carbon in the oxide semiconductor and around an interface with the oxide semiconductor (measured by SIMS) is set lower than or equal to $2\times10^{18}$ atoms/cm$^3$, preferably lower than or equal to $2\times10^{17}$ atoms/cm$^3$.

The concentration of an alkali metal or an alkaline earth metal in the oxide semiconductor measured by SIMS is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

For the semiconductor layer 509b, an oxide semiconductor with a wide energy band gap is used, for example. The energy band gap of the semiconductor layer 509b is, for example, greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

In the case where the semiconductor layer 509 is formed by a sputtering method, the atomic ratio of In to M and Zn contained in the target may be 3:1:1, 3:1:2, 3:1:4, 1:1:0.5, 1:1:1, 1:1:2, 1:4:4, 4:2:4.1, 1:3:2, or 1:3:4, for example.

In the cases where the semiconductor layer 509 is formed by a sputtering method, a film having an atomic ratio different from the atomic ratio of the target may be formed. Especially for zinc, the atomic ratio of zinc in a deposited film is smaller than the atomic ratio of the target in some cases. Specifically, the film has an atomic ratio of zinc of 40 atomic % to 90 atomic % of the atomic ratio of zinc in the target in some cases.

The semiconductor layer 509a and the semiconductor layer 509c are preferably formed using a material including one or more kinds of metal elements, other than oxygen, included in the semiconductor layer 509b. With the use of such a material, interface states at interfaces between the semiconductor layer 509a and the semiconductor layer 509b and between the semiconductor layer 509c and the semiconductor layer 509b are less likely to be generated. Accordingly, carriers are not likely to be scattered or captured at the interfaces, which results in an improvement in field-effect mobility of the transistor. Further, variation in threshold voltage (hereinafter also referred to as "$V_{th}$") of the transistor can be reduced. Thus, a semiconductor device having favorable electrical characteristics can be obtained.

When the semiconductor layer 509b is an In—M—Zn oxide (an oxide containing In, the element M, and Zn) at an atomic ratio of $X_2:Y_2:Z_2$ and each of the semiconductor layer 509a and the semiconductor layer 509c is an In—M—Zn oxide at an atomic ratio of $X_1:Y_1:Z_1$, $Y_1/X_1$ is preferably larger than $Y_2/X_2$. Further preferably, the semiconductor layer 509a, the semiconductor layer 509c, and the semiconductor layer 509b are selected so that $Y_1/X_1$ is 1.5 or more times as large as $Y_2/X_2$. Still further preferably, the semiconductor layer 509a, the semiconductor layer 509c, and the semiconductor layer 509b are selected so that $Y_1/X_1$ is 2 or more times as large as $Y_2/X_2$. Still further preferably, the semiconductor layer 509a, the semiconductor layer 509c, and the semiconductor layer 509b are selected so that $Y_1/X_1$ is 3 or more times as large as $Y_2/X_2$. In the semiconductor layer 509b at this time, $Y_2$ is preferably larger than or equal to $X_2$ because the transistor can have stable electrical characteristics. However, when $Y_2$ is five or more times as large as $X_2$, the field-effect mobility of the transistor is reduced; accordingly, $Y_2$ is preferably smaller than five times $X_2$. When the semiconductor layers 509a and 509c each have the above structure, each of the semiconductor layers 509a and 509c can be a layer in which oxygen vacancy is less likely to occur than in the semiconductor layer 509b.

In the case of using an In—M—Zn oxide as the semiconductor layer 509a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In—M—Zn oxide as the semiconductor layer 509b, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In—M—Zn oxide as the semiconductor layer 509c, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the semiconductor layer 509c and the semiconductor layer 509a may be formed using the same type of oxide.

For example, an In—Ga—Zn oxide which is formed using a target containing In, Ga, and Zn at an atomic ratio of 1:3:2, 1:3:4, 1:3:6, 1:4:5, 1:6:4, or 1:9:6 or an In—Ga oxide which is formed using a target containing In and Ga at an atomic ratio of 1:9 or 7:93 can be used for each of the semiconductor layers 509a and 509c containing In or Ga.

For the semiconductor layer 509b, an In—Ga—Zn oxide formed using a target containing In, Ga, and Zn at an atomic ratio of 1:1:1, 3:1:2, or the like can be used, for example. Note that the atomic ratio of each of the semiconductor layers 509a, 509b, and 509c may vary within a margin of ±20% of the corresponding atomic ratio.

For the semiconductor layer 509b, an oxide having an electron affinity higher than that of each of the semiconductor layers 509a and 509c is used. For example, for the semiconductor layer 509b, an oxide having an electron affinity higher than that of each of the semiconductor layers 509a and 509c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the conduction band minimum.

An indium gallium oxide has a low electron affinity and a high oxygen-blocking property. Therefore, the semiconductor layer 509c preferably includes an indium gallium oxide. The gallium atomic ratio [Ga/(In+Ga)] is, for example, higher than or equal to 70%, preferably higher than or equal to 80%, further preferably higher than or equal to 90%.

The semiconductor layer 509a and/or the semiconductor layer 509c may be formed using gallium oxide. The use of gallium oxide can reduce the off-state current of a transistor, in some cases.

At this time, when a gate voltage is applied, in the transistor 100, a channel is formed in the semiconductor layer 509b having the highest electron affinity among the semiconductor layers 509a to 509c.

The layer 529 (the layers 529_1a, 529_1b, 529_2a, and 529_2b) may be formed using a material and a method which are similar to those of the semiconductor layer 509. In the case where the layer 529 is formed using an oxide semiconductor layer, an oxide semiconductor layer which is less likely to release oxygen and/or which is less likely to absorb oxygen is preferably used.

Figure 31A:
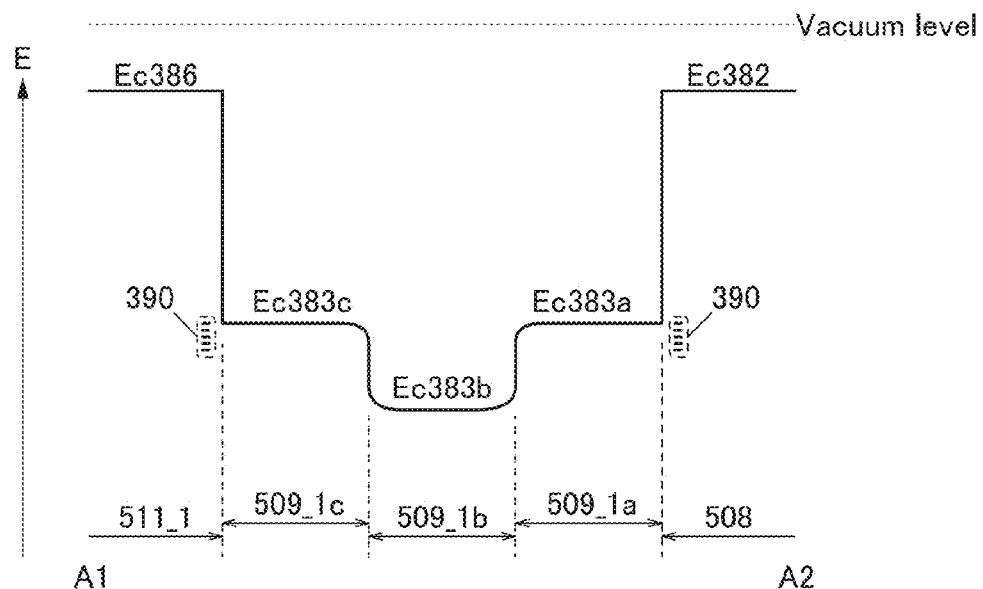
FIGS. 31A and 31B show energy band diagrams.
Figure 31B:
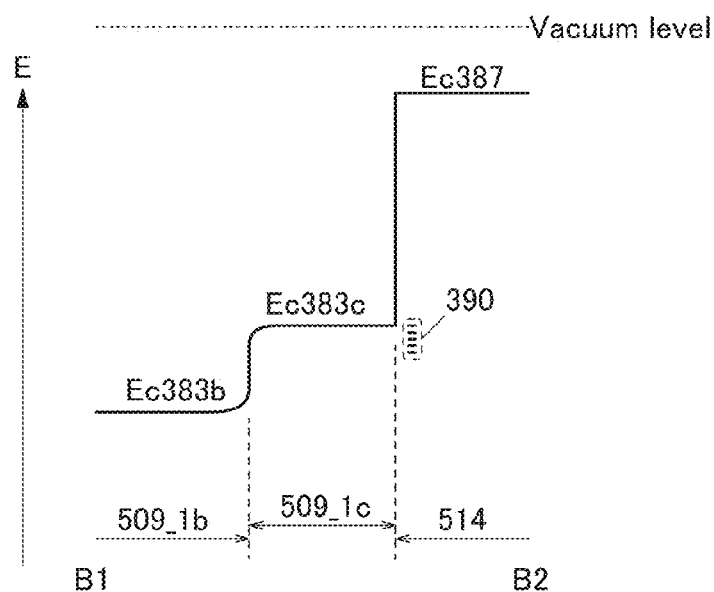

A function and an effect of the semiconductor layer 509 consisting of the semiconductor layers 509_1a, 509_1b, and 509_1c are described using an energy band diagram in FIGS. 31A and 31B. FIG. 31A illustrates the energy band structure of a portion along dashed dotted line A1-A2 in FIGS. 23B and 23C. In other words, FIG. 31A illustrates the energy band structure of a channel formation region of the transistor 100.

In FIG. 31A, Ec382, Ec383a, Ec383b, Ec383c, and Ec386 indicate the energy of the conduction band minimum of the insulating layer 508, the semiconductor layer 509_1a, the semiconductor layer 509_1b, the semiconductor layer 509_1c, and the insulating layer 511_1, respectively.

Since the insulating layer 508 and the insulating layer 511_1 are insulators, Ec382 and Ec386 are closer to the vacuum level (have a lower electron affinity) than Ec383a, Ec383b, and Ec383c.

Ec383a is closer to the vacuum level than Ec383b. Specifically, Ec383a is preferably located closer to the vacuum level than Ec383b by greater than or equal to 0.07 eV and less than or equal to 1.3 eV, further preferably greater than or equal to 0.1 eV and less than or equal to 0.7 eV, still further preferably greater than or equal to 0.15 eV and less than or equal to 0.4 eV.

Ec383c is closer to the vacuum level than Ec383b. Specifically, Ec383c is preferably located closer to the vacuum level than Ec383b by greater than or equal to 0.07 eV and less than or equal to 1.3 eV, further preferably greater than or equal to 0.1 eV and less than or equal to 0.7 eV, still further preferably greater than or equal to 0.15 eV and less than or equal to 0.4 eV.

In the case where the transistor 100 has an s-channel structure, a channel is formed in the whole of the semiconductor layer 509_1b. Therefore, as the semiconductor layer 509_1b has a larger thickness, a channel formation region becomes larger. In other words, the thicker the semiconductor layer 509_1b is, the larger the on-state current of the transistor 100 is. The thickness of the semiconductor layer 509_1b is 5 nm or larger, preferably 10 nm or larger, further preferably 20 nm or larger, still further preferably 50 nm or larger.

Moreover, the thickness of the semiconductor layer 509_1c is preferably as small as possible to increase the on-state current of the transistor 100. The thickness of the semiconductor layer 509_1c is less than 20 nm, preferably less than or equal to 10 nm, further preferably less than or equal to 5 nm. Meanwhile, the semiconductor layer 509_1c has a function of blocking entry of elements other than oxygen (such as hydrogen and silicon) included in the adjacent insulator into the semiconductor layer 509_1b where a channel is formed. For this reason, it is preferable that the semiconductor layer 509_1c have a certain thickness. The semiconductor layer 509_1c may have a thickness greater than or equal to 0.3 nm, preferably greater than or equal to 1 nm, further preferably greater than or equal to 2 nm.

To improve reliability, preferably, the thickness of the semiconductor layer 509_1a is large. The semiconductor layer 509_1a may have a thickness greater than or equal to 10 nm, preferably greater than or equal to 20 nm, further preferably greater than or equal to 40 nm, still further preferably greater than or equal to 60 nm. When the thickness of the semiconductor layer 509_1a is made large, the distance from an interface between the adjacent insulator (the insulating layer 508) and the semiconductor layer 509_1a to the semiconductor layer 509_1b in which a channel is formed can be large. However, to prevent the productivity of the transistor 100 or the semiconductor device including the transistor 100 from being decreased, the semiconductor layer 509_1a has, for example, a thickness less than or equal to 50 nm, preferably less than or equal to 20 nm, further preferably less than or equal to 10 nm.

Figure 23D:
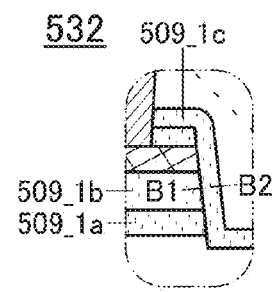

FIG. 31B illustrates the energy band structure of a portion along dashed dotted line B1-B2 in FIG. 23D. In other words, FIG. 31B illustrates the energy band structure of a side surface of the semiconductor layer 509_1b.

In FIG. 31B, Ec387, Ec383c, and Ec383b indicate the energy of the conduction band minimum of the insulating layer 514, that of the semiconductor layer 509_1c, and that of the semiconductor layer 509_1b, respectively. Although the trap states 390 due to impurities or defects might be formed in the vicinity of the interface between the side surface of the semiconductor layer 509_1b and the insulating layer 514, the side surface of the semiconductor layer 509_1b can be apart from the trap states owing to the existence of the semiconductor layer 509_1c.

Figure 32:
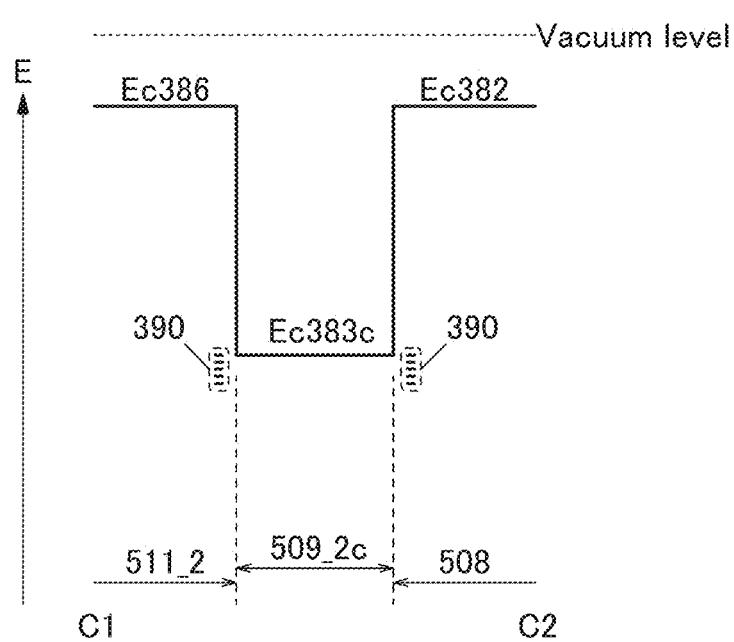
FIG. 32 shows an energy band diagram.

FIG. 32 illustrates the energy band structure of a portion along a dashed dotted line C1-C2 in FIG. 24C. In other words, FIG. 32 illustrates the energy band structure of a channel formation region of the transistor 200.

In FIG. 32, Ec382, Ec383c, and Ec386 indicate the energy of the conduction band minimum of the insulating layer 508, that of the semiconductor layer 509_2c, and that of the insulating layer 511_2, respectively. Since a region of the semiconductor layer 509_2c where a channel is formed is in direct contact with the insulating layer 508 and the insulating layer 511_2 in the transistor 200, the transistor 200 is likely to be affected by interface scattering and the trap states 390. Thus, the transistor 200 has lower on-state current and field-effect mobility than the transistor 100. Furthermore, the transistor 200 has higher $V_{th}$ than the transistor 100.

Although the semiconductor layer of the transistor 100 has the above three-layer structure in this embodiment, one embodiment of the present invention is not limited thereto. For example, the semiconductor layer may have a two-layer structure without one of the semiconductor layer 509_1a and the semiconductor layer 509_1c. Alternatively, a single layer structure using any one of the semiconductor layer 509_1a, the semiconductor layer 509_1b, and the semiconductor layer 509_1c may be employed. Alternatively, a four-layer structure in which any one of the above-described semiconductor layers is provided under or over the semiconductor layer 509_1a or under or over the semiconductor layer 509_1c may be employed. Further alternatively, it is possible to employ an n-layer structure (n is an integer of 5 or more) in which any one of the semiconductor layers described as examples of the semiconductor layer 509a, the semiconductor layer 509b, and the semiconductor layer 509c is provided at two of the following positions: under the semiconductor layer 509a; over the semiconductor layer 509a; under the semiconductor layer 509c; and over the semiconductor layer 509c.

(Substrate)

There is no particular limitation on a material used for the substrate 501 as long as the material has heat resistance high enough to withstand at least heat treatment performed later. For example, a single crystal semiconductor substrate or a polycrystalline semiconductor substrate made of silicon, silicon carbide, or the like or a compound semiconductor substrate made of silicon germanium or the like can be used as the substrate 501. Alternatively, an SOI substrate, a semiconductor substrate on which a semiconductor element such as a strained transistor or a FIN-type transistor is provided, or the like can also be used. Alternatively, gallium arsenide, aluminum gallium arsenide, indium gallium arsenide, gallium nitride, indium phosphide, silicon germanium, or the like that can be used for a high-electron-mobility transistor (HEMT) may be used. The substrate 501 is not limited to a simple supporting substrate, and may be a substrate where a device such as a transistor is formed. In this case, at least one of the gate, the source, and the drain of the transistor 100 and/or the transistor 200 may be electrically connected to the device.

Further alternatively, as the substrate 501, a glass substrate of barium borosilicate glass, aluminoborosilicate glass, or the like, a ceramic substrate, a quartz substrate, or a sapphire substrate can be used. Note that a flexible substrate may be used as the substrate 501. In the case where a flexible substrate is used, the transistor, a capacitor, or the like may be directly formed over the flexible substrate; or the transistor, the capacitor, or the like may be formed over a manufacturing substrate and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

For the flexible substrate, for example, metal, an alloy, resin, glass, or fiber thereof can be used. The flexible substrate used as the substrate 501 preferably has a lower coefficient of linear expansion because deformation due to an environment is suppressed. The flexible substrate used as the substrate 501 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

(Insulating Layer)

The insulating layers 502 to 504 and 506 to 508, the insulating layers 511_1 and 511_2 (hereinafter, also referred to as the insulating layer 511), and the insulating layers 513_1, 513_2, 514, and 515 can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

It is particularly preferable that the insulating layer 515 and the insulating layer 502 and/or the insulating layer 503 be formed using an insulating material that is relatively impermeable to impurities. For example, a single-layer structure or a stacked-layer structure including an insulating material containing boron, carbon, nitrogen, oxygen, fluorine, magnesium, aluminum, silicon, phosphorus, argon, gallium, germanium, yttrium, zirconium, lanthanum, neodymium, hafnium, or tantalum may be used. Examples of such an insulating material include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

When the insulating material that is relatively impermeable to impurities is used for the insulating layer 502 and/or the insulating layer 503, impurity diffusion from the substrate 501 side can be suppressed, and the reliability of the transistor can be improved. When the insulating material that is relatively impermeable to impurities is used for the insulating layer 515, impurity diffusion from layers above the insulating layer 515 can be suppressed, and the reliability of the transistor can be improved.

Note that a stack of a plurality of insulating layers formed with these materials may be used as the insulating layer 515 and the insulating layer 502 and/or the insulating layer 503. One of the insulating layer 502 and the insulating layer 503 may be omitted.

When an oxide semiconductor is used for the semiconductor layer 509, the hydrogen concentrations in the insulating layers is preferably lowered in order to prevent an increase in the hydrogen concentration in the semiconductor layer 509. Specifically, the hydrogen concentration in the insulating layer that is measured by SIMS is set lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is particularly preferable to lower the hydrogen concentrations of the insulating layers 504, 506 to 508, 511, and 514. It is preferable to lower at least the hydrogen concentrations of the insulating layers 508, 511, and 514 in contact with the semiconductor layer 509.

Furthermore, the nitrogen concentrations in the insulating layers are preferably low in order to prevent an increase in the nitrogen concentration in the semiconductor layer 509. Specifically, the nitrogen concentration in the insulating layer, which is measured by SIMS, is set lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

At least one of the insulating layers 508, 511, and 514 is preferably formed using an insulating layer from which oxygen is released by heating. Specifically, it is preferable to use an insulating layer of which the amount of released oxygen converted into oxygen atoms is $1.0\times10^{18}$ atoms/cm$^3$ or more, preferably $3.0\times10^{20}$ atoms/cm$^3$ or more, in TDS analysis, preferably higher than or equal to 100° C. and lower than or equal to 500° C. Note that oxygen released by heating is also referred to as excess oxygen.

A heat-resistant organic material such as a polyimide, an acrylic resin, a benzocyclobutene-based resin, a polyamide, or an epoxy-based resin may be used to form the insulating layer 514. Other than the above organic materials, a low-dielectric constant material (low-k material), a siloxane-based resin, phosphosilicate glass (PSG), borophosphosilicate glass (BPSG), or the like can be used. Note that the insulating layer 514 may be formed by stacking a plurality of insulating layers formed using any of these materials.

Any of the above insulating layers may be used as the layer 529. In the case where the layer 529 is an insulating layer, an insulating layer which is less likely to release oxygen and/or which is less likely to absorb oxygen is preferably used.

(Electrode)

As a conductive material for forming the electrodes 505_1, 505_2, 510_1a, 510_1b, 510_2a, 510_2b, 512_1, 512_2, 516_1a, 516_1b, 516_1c, 516_2a, 516_2b, 516_2c, 517_1a, 517_1b, 517_1c, 517_2a, 517_2b, and 517_2c, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. Alternatively, a semiconductor having a high electric conductivity typified by polycrystalline silicon including an impurity element such as phosphorus, or a silicide such as nickel silicide may be used.

A conductive material containing the above metal element and oxygen may be used. A conductive material containing the above metal element and nitrogen may be used. For example, a conductive material containing nitrogen such as titanium nitride or tantalum nitride may be used. Indium tin oxide (ITO), indium oxide containing tungsten oxide, indium zinc oxide containing tungsten oxide, indium oxide containing titanium oxide, indium tin oxide containing titanium oxide, indium zinc oxide, indium tin oxide to which silicon is added, or indium gallium zinc oxide containing nitrogen may be used.

A stack of a plurality of conductive layers formed with the above materials may be used.

The electrode 516 may be formed using, for example, a conductive material with high embeddability, such as tungsten or polysilicon. A conductive material with high embeddability and a barrier layer (a diffusion prevention layer) such as a titanium layer, a titanium nitride layer, or a tantalum nitride layer may be used in combination. Note that each of the electrodes 516_1a, 516_1b, 516_1c, 516_2a, 516_2b, and 516_2c may be referred to as a contact plug.

Any of the above conductive materials may be used for the layer 529. In the case where the layer 529 is formed using a conductive material, a conductive material which is less likely to release oxygen and/or which is less likely to absorb oxygen is preferably used.

<Deposition Method>

An insulating material for forming the insulating layers, a conductive material for forming the electrodes, or a semiconductor material for forming the semiconductor layers can be formed by a sputtering method, a spin coating method, a chemical vapor deposition (CVD) method (including a thermal CVD method, a metal organic chemical vapor deposition (MOCVD) method, a plasma enhanced CVD (PECVD) method, a high density plasma CVD method, a low pressure CVD (LPCVD) method, an atmospheric pressure CVD (APCVD) method, and the like), an atomic layer deposition (ALD) method, a molecular beam epitaxy (MBE) method, or a pulsed laser deposition (PLD) method.

By using a plasma CVD method, a high-quality film can be formed at a relatively low temperature. By using a deposition method that does not use plasma for deposition, such as an MOCVD method, an ALD method, or a thermal CVD method, a film can be formed with few defects because damage is not easily caused on a surface on which the film is deposited.

In the case where a film is formed by an ALD method, a gas that does not contain chlorine is preferably used as a material gas.

This application is based on Japanese Patent Application serial No. 2016-130650 filed with Japan Patent Office on Jun. 30, 2016, the entire contents of which are hereby incorporated by reference.

What is claimed is:

1. A semiconductor device comprising:
   a comparator comprising a first transistor to a seventh transistor, a first capacitor to a fourth capacitor, a first input terminal, a second input terminal, and an output terminal;
   an eighth transistor and a ninth transistor each comprising a front gate and a back gate; and
   a fifth capacitor,
   wherein a gate of the first transistor is electrically connected to the first input terminal through the first capacitor,
   wherein a gate of the second transistor is electrically connected to the second input terminal through the second capacitor,
   wherein one of a source and a drain of the third transistor is electrically connected to the gate of the first transistor through the third capacitor,
   wherein one of a source and a drain of the fourth transistor is electrically connected to the gate of the second transistor through the fourth capacitor,
   wherein the other of the source and the drain of the third transistor, the other of the source and the drain of the fourth transistor, one of a source and a drain of the sixth transistor, and one of a source and a drain of the seventh transistor are electrically connected to a high potential power source,
   wherein one of a source and a drain of the first transistor and one of a source and a drain of the second transistor are electrically connected to one of a source and a drain of the fifth transistor,
   wherein the other of the source and the drain of the fifth transistor is electrically connected to a low potential power source,
   wherein the other of the source and the drain of the first transistor is electrically connected to the other of the source and the drain of the sixth transistor,
   wherein the other of the source and the drain of the second transistor and the other of the source and the drain of the seventh transistor are electrically connected to the output terminal, and
   wherein the first input terminal is electrically connected to the back gate of the eighth transistor, the front gate and the back gate of the ninth transistor, one of a source and a drain of the ninth transistor, and one electrode of the fifth capacitor.

2. The semiconductor device according to claim 1, wherein a channel formation region of each of the third transistor, the fourth transistor, the eighth transistor, and the ninth transistor comprises an oxide semiconductor.

3. The semiconductor device according to claim 1,
   wherein a channel formation region of each of the third transistor, the fourth transistor, the eighth transistor, and the ninth transistor comprises an oxide semiconductor, and
   wherein the oxide semiconductor comprises indium.

4. The semiconductor device according to claim 1,
   wherein a channel formation region of each of the eighth transistor and the ninth transistor comprises an oxide semiconductor,
   wherein the oxide semiconductor comprises indium and an element M,
   wherein the element M is one or more of gallium, aluminum, silicon, yttrium, boron, titanium, iron, nickel, germanium, zirconium, molybdenum, lanthanum, cerium, neodymium, hafnium, tantalum, tungsten, magnesium, vanadium, and beryllium,
   wherein the channel formation region of the eighth transistor has an atomic ratio of indium: the element $M=X_7:Y_7$,
   wherein the channel formation region of the ninth transistor has an atomic ratio of indium: the element $M=X_8:Y_8$, and
   wherein $X_7/Y_7$ is larger than $X_8/Y_8$.

5. The semiconductor device according to claim 1,
   wherein the comparator further comprises a tenth transistor and an eleventh transistor,
   wherein one of a source and a drain of the tenth transistor is electrically connected to the gate of the first transistor,
   wherein the other of the source and the drain of the tenth transistor is electrically connected to the one of the source and the drain of the first transistor,
   wherein one of a source and a drain of the eleventh transistor is electrically connected to the gate of the second transistor, and
   wherein the other of the source and the drain of the eleventh transistor is electrically connected to the one of the source and the drain of the second transistor.

6. The semiconductor device according to claim 1,
   wherein the comparator further comprises a tenth transistor and an eleventh transistor, wherein one of a source and a drain of the tenth transistor is electrically connected to the gate of the first transistor, wherein the other of the source and the drain of the tenth transistor is electrically connected to the other of the source and the drain of the first transistor, wherein one of a source and a drain of the eleventh transistor is electrically connected to the gate of the second transistor, and wherein the other of the source and the drain of the eleventh transistor is electrically connected to the other of the source and the drain of the second transistor.

7. The semiconductor device according to claim 1, wherein a gate of the sixth transistor is electrically connected to the other of the source and the drain of the sixth transistor and a gate of the seventh transistor.

8. The semiconductor device according to claim 1, wherein the eighth transistor is included in a memory cell array.

9. The semiconductor device according to claim 1, wherein the ninth transistor and the fifth capacitor are included in a voltage holding portion.

10. A method for operating a semiconductor device, the semiconductor device comprising a first transistor to a seventh transistor, a first capacitor to a fourth capacitor, a first input terminal, a second input terminal, and an output terminal, wherein a gate of the first transistor is electrically connected to the first input terminal through the first capacitor, wherein a gate of the second transistor is electrically connected to the second input terminal through the second capacitor, wherein one of a source and a drain of the third transistor is electrically connected to the gate of the first transistor through the third capacitor, wherein one of a source and a drain of the fourth transistor is electrically connected to the gate of the second transistor through the fourth capacitor, wherein the other of the source and the drain of the third transistor, the other of the source and the drain of the fourth transistor, one of a source and a drain of the sixth transistor, and one of a source and a drain of the seventh transistor are electrically connected to a high potential power source, wherein one of a source and a drain of the first transistor and one of a source and a drain of the second transistor are electrically connected to one of a source and a drain of the fifth transistor, wherein the other of the source and the drain of the fifth transistor is electrically connected to a low potential power source, wherein the other of the source and the drain of the first transistor is electrically connected to the other of the source and the drain of the sixth transistor, and wherein the other of the source and the drain of the second transistor and the other of the source and the drain of the seventh transistor are electrically connected to the output terminal, the method for operating the semiconductor device comprising:

applying a first potential to the gate of the first transistor;

applying a second potential to the gate of the second transistor;

applying a third potential to the first input terminal, wherein the third potential is a negative potential;

applying a fourth potential to the gate of the first transistor, wherein the fourth potential is a positive potential;

applying a fifth potential to the second input terminal, wherein the fifth potential is a negative potential;

applying a sixth potential to the gate of the second transistor, wherein the sixth potential is a positive potential; and outputting a seventh potential from the output terminal, wherein the seventh potential corresponds to a difference between the fourth potential and the sixth potential, wherein the first potential is higher than the fourth potential, and wherein the second potential is higher than the sixth potential.

11. The method for operating the semiconductor device, according to claim 10, wherein a channel formation region of each of the third transistor and the fourth transistor comprises an oxide semiconductor.

12. The method for operating the semiconductor device, according to claim 10, wherein a channel formation region of each of the third transistor and the fourth transistor comprises an oxide semiconductor, and wherein the oxide semiconductor comprises indium.

13. The method for operating the semiconductor device, according to claim 10, wherein the semiconductor device further comprises an eighth transistor and a ninth transistor, wherein one of a source and a drain of the eighth transistor is electrically connected to the gate of the first transistor, wherein the other of the source and the drain of the eighth transistor is electrically connected to the one of the source and the drain of the first transistor, wherein one of a source and a drain of the ninth transistor is electrically connected to the gate of the second transistor, and wherein the other of the source and the drain of the ninth transistor is electrically connected to the one of the source and the drain of the second transistor.

14. The method for operating the semiconductor device, according to claim 10, wherein the semiconductor device further comprises an eighth transistor and a ninth transistor, wherein one of a source and a drain of the eighth transistor is electrically connected to the gate of the first transistor, wherein the other of the source and the drain of the eighth transistor is electrically connected to the other of the source and the drain of the first transistor, wherein one of a source and a drain of the ninth transistor is electrically connected to the gate of the second transistor, and wherein the other of the source and the drain of the ninth transistor is electrically connected to the other of the source and the drain of the second transistor.

* * * * *